US012149242B1

(12) United States Patent
Gimeno-Segovia et al.

(10) Patent No.: US 12,149,242 B1
(45) Date of Patent: Nov. 19, 2024

(54) MODULAR INTERCONNECTED QUANTUM PHOTONIC SYSTEM

(71) Applicant: PsiQuantum, Corp., Palo Alto, CA (US)

(72) Inventors: Mercedes Gimeno-Segovia, San Jose, CA (US); Christopher Sparrow, Mountain View, CA (US); Ilya Vorobeichik, Los Gatos, CA (US)

(73) Assignee: PsiQuantum, Corp., Palo Alto, CA (US)

( * ) Notice: Subject to any disclaimer, the term of this patent is extended or adjusted under 35 U.S.C. 154(b) by 0 days.

(21) Appl. No.: 18/589,993

(22) Filed: Feb. 28, 2024

Related U.S. Application Data

(60) Provisional application No. 63/449,030, filed on Feb. 28, 2023.

(51) Int. Cl.
| | |
|---|---|
| *H03K 17/10* | (2006.01) |
| *G06N 10/00* | (2022.01) |
| *G06N 10/40* | (2022.01) |
| *H03K 17/92* | (2006.01) |
| *H04B 10/70* | (2013.01) |

(52) U.S. Cl.
CPC .............. *H03K 17/92* (2013.01); *G06N 10/40* (2022.01)

(58) Field of Classification Search
CPC ........ G06N 10/40; G06N 10/00; H04B 10/70; H04B 10/00; H03K 17/92; H03K 17/51; H03K 17/00
See application file for complete search history.

(56) References Cited

U.S. PATENT DOCUMENTS

| | | | | |
|---|---|---|---|---|
| 8,234,103 | B2 * | 7/2012 | Biamonte | G06N 10/00 |
| | | | | 977/933 |
| 11,126,062 | B1 * | 9/2021 | Kieling | G02F 1/365 |
| 11,308,416 | B2 * | 4/2022 | Pant | G06N 3/08 |
| 11,460,876 | B1 * | 10/2022 | Nickerson | G06N 10/00 |
| 11,475,347 | B1 * | 10/2022 | Rudolph | G06N 10/00 |
| 11,543,731 | B1 * | 1/2023 | Kieling | G02F 1/3501 |

(Continued)

FOREIGN PATENT DOCUMENTS

| | | |
|---|---|---|
| AU | 2021409125 | 6/2023 |
| WO | 2023220441 | 11/2023 |

OTHER PUBLICATIONS

"International Application Serial No. PCT US2024 017571, International Search Report mailed Jun. 21, 2024", 2 pgs.

(Continued)

*Primary Examiner* — John R Lee
(74) *Attorney, Agent, or Firm* — Schwegman Lundberg & Woessner, P.A.

(57) ABSTRACT

A modular quantum entanglement processing system can include a plurality of seed state systems, resource state systems, and fusion systems that can be ordered in different arrangements. The systems can be composed of modular assemblies or chips, such that the systems can be modularized and extended to perform entanglement based processing of tasks in a scalable manner. Some of the assemblies or chips of the different systems can be designed to operate at cryogenic temperatures, such as detector, while other assemblies or chips of the different systems can operate at room temperature, where the different chip types can be coupled to one another using fiber optic cables.

26 Claims, 38 Drawing Sheets

(56) References Cited

U.S. PATENT DOCUMENTS

| | | | | |
|---|---|---|---|---|
| 11,816,536 B2* | 11/2023 | Biamonte | | G06N 10/00 |
| 11,823,012 B2* | 11/2023 | Gimeno-Segovia | ... | G06N 10/00 |
| 11,947,242 B1* | 4/2024 | Kieling | | G02F 1/365 |
| 11,984,890 B2* | 5/2024 | Abdo | | H01P 7/082 |
| 12,019,354 B2* | 6/2024 | Thompson | | G06N 10/40 |
| 12,026,587 B2* | 7/2024 | Pant | | G06N 10/40 |
| 12,093,787 B2* | 9/2024 | Amin | | G06N 10/40 |
| 2020/0287631 A1* | 9/2020 | Gimeno-Segovia | ... | G06N 10/00 |
| 2020/0401927 A1* | 12/2020 | Nickerson | | G06F 15/16 |
| 2021/0232963 A1* | 7/2021 | Gimeno-Segovia | ... | G06N 10/40 |
| 2021/0365827 A1 | 11/2021 | Monroe et al. | | |
| 2022/0156625 A1* | 5/2022 | Pant | | G06N 10/40 |
| 2022/0224996 A1* | 7/2022 | Nickerson | | H03K 17/92 |
| 2022/0237494 A1* | 7/2022 | Pant | | G06N 3/08 |
| 2022/0383175 A1 | 12/2022 | Gimeno-segovia et al. | | |
| 2023/0042201 A1* | 2/2023 | Raussendorf | | G06N 10/00 |
| 2023/0393447 A1 | 12/2023 | Thompson et al. | | |
| 2024/0160972 A1* | 5/2024 | Gimeno-Segovia | ... | G06N 10/00 |
| 2024/0242100 A1 | 7/2024 | Nickerson et al. | | |

OTHER PUBLICATIONS

"International Application Serial No. PCT US2024 017571, Written Opinion mailed Jun. 21, 2024", 13 pgs.

Bartolucci, Sara, "Fusion-based quantum computation", Nat Commun 14, 912. https: doi.org 10.1038 s41467-023-36493-1, (Feb. 17, 2023), 27 pages.

Chen, Si, "Heralded Three-Photon Entanglement from a Single-Photon Source on a Photonic Chip", Cornell University Quantum Physics arXiv:2307.02189, (Jul. 5, 2023), 5 pgs.

* cited by examiner

FIG. 4
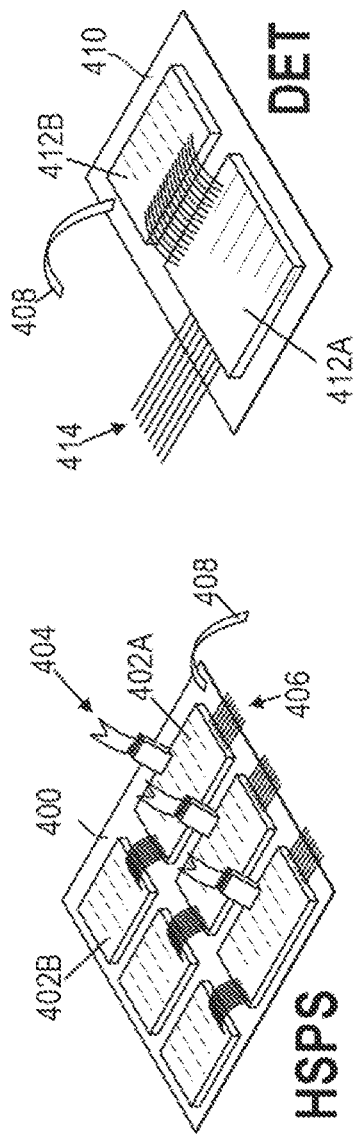
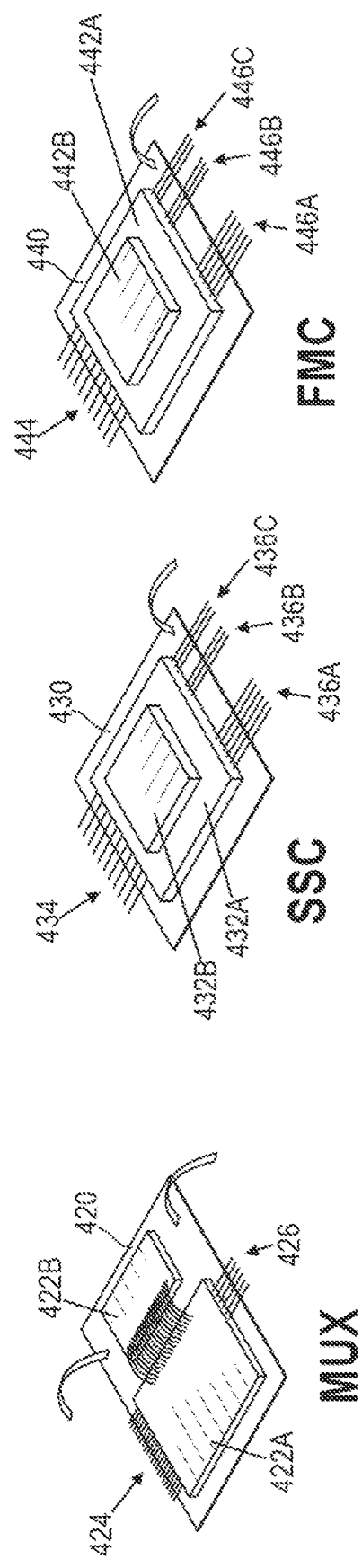

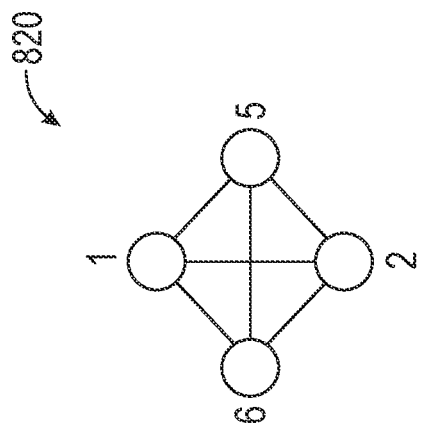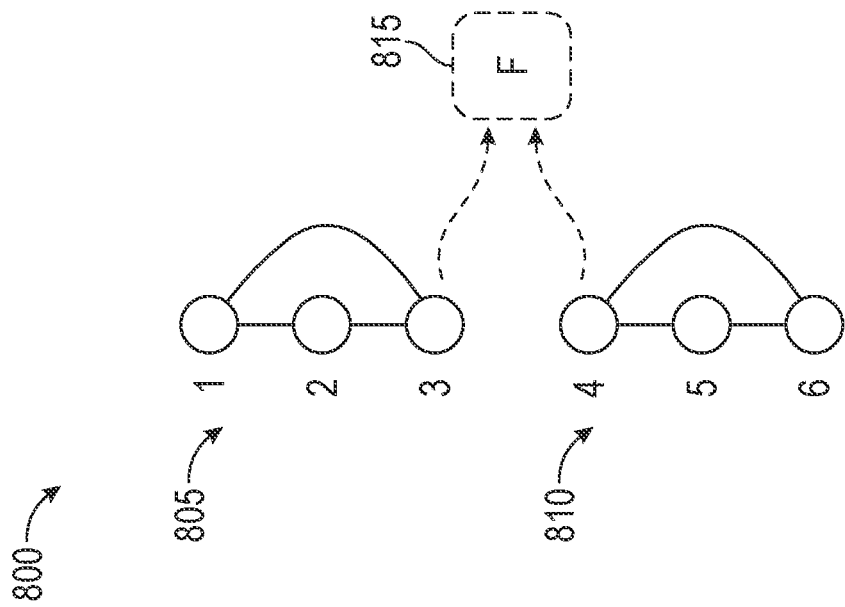
FIG. 8A

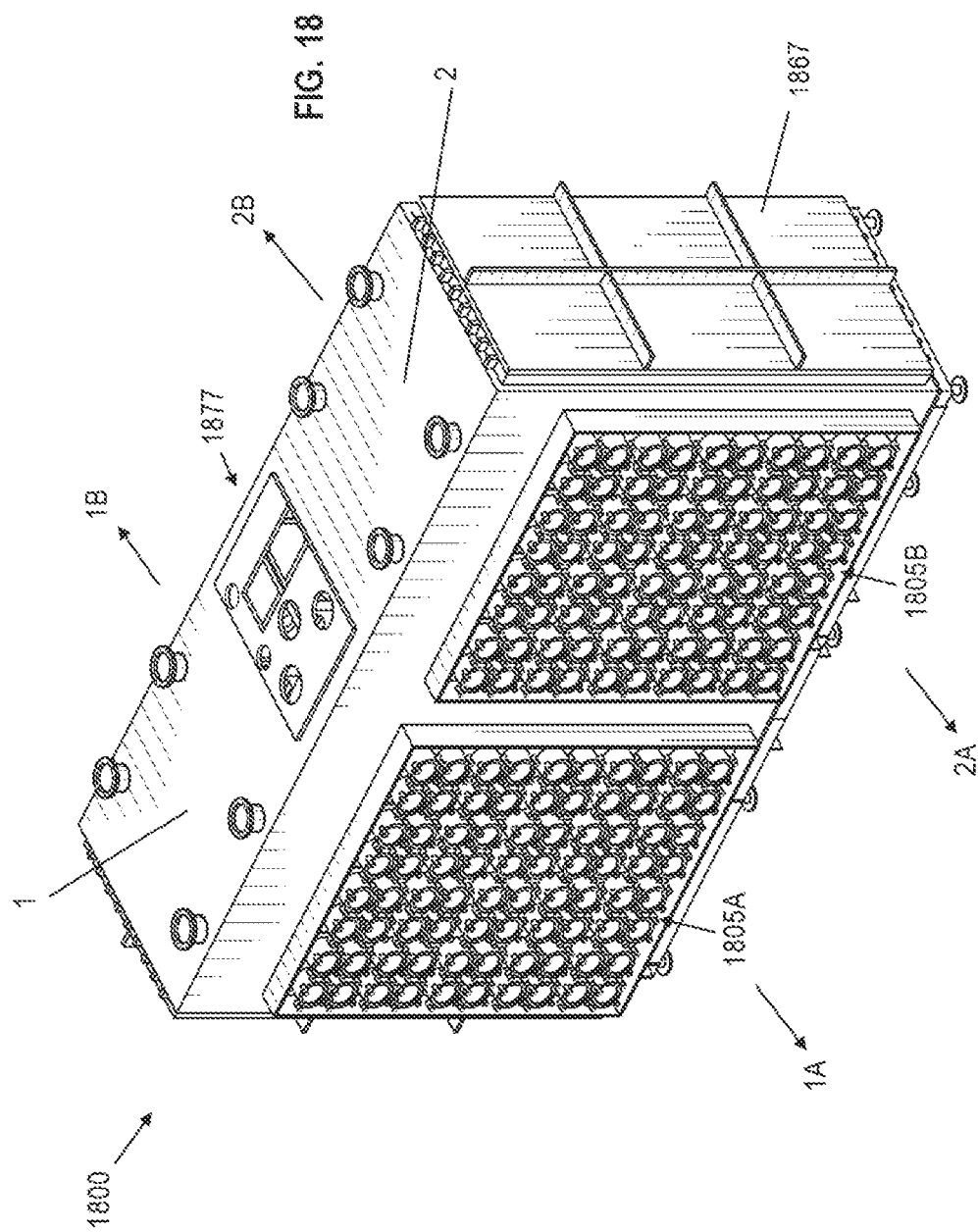

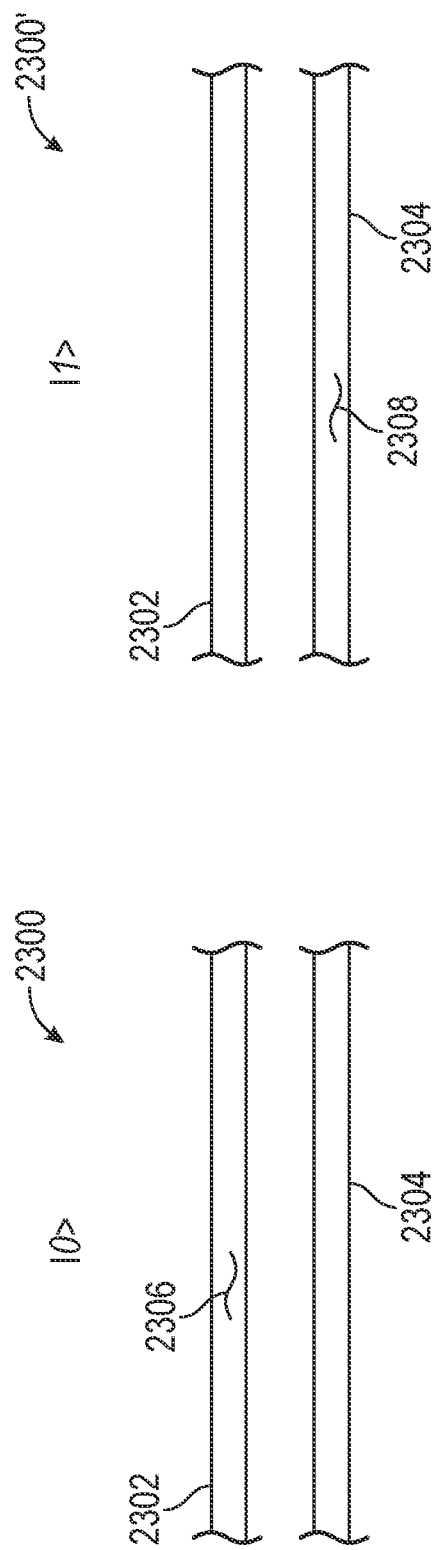
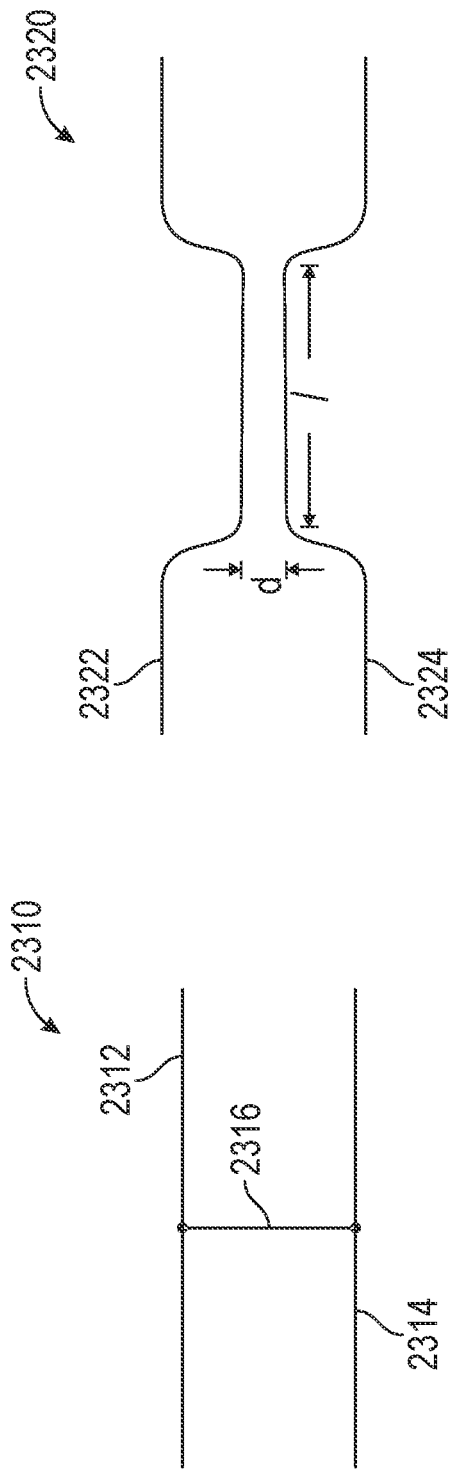
FIG. 23A
FIG. 23B
FIG. 23C

| GATE | SUCCESS | | FAILURE | |
|---|---|---|---|---|
| | Effective Projection | Outcome | Effective Projection | Outcome |
| 3○—○1  2○—○5—○7<br>4○    ○6—○8 | | | | |
| | $\frac{\|++\rangle \pm \|--\rangle}{\sqrt{2}}_{2,6}$ | $\frac{\|0++0++\rangle + \|1--1--\rangle}{\sqrt{2}}$ | $\|+-\rangle_{2,6}$ or $\|-+\rangle_{2,6}$ | $\|0++0++\rangle$ |
| | $\frac{\|00\rangle \pm \|11\rangle}{\sqrt{2}}_{2,6}$ | $\frac{\|0++0++\rangle + \|1--1--\rangle}{\sqrt{2}}$ | $\|01\rangle_{2,6}$ or $\|10\rangle_{2,6}$ | $(\|0++\rangle + \|1--\rangle) \times (\|0++\rangle + \|1--\rangle)$ |
| | $\frac{\|+0\rangle \pm \|1-\rangle}{\sqrt{2}}_{2,6}$ | $\frac{\|0++0++\rangle + \|1--1--\rangle}{2}$ $+\frac{\|0++0++\rangle - \|1--1--\rangle}{2}$ | $\|+1\rangle_{2,6}$ or $\|-0\rangle_{2,6}$ | $\|0++\rangle$ $\times (\|0++\rangle + \|1--\rangle)$ |
| | $\frac{\|0(+i)\rangle \pm \|1(-i)\rangle}{\sqrt{2}}_{2,6}$ | $\frac{\|0++0++\rangle + \|1--1--\rangle}{2}$ $+\frac{\|0++0++\rangle - \|1--1--\rangle}{2}$ | $\|0(-i)\rangle_{2,6}$ or $\|1(+i)\rangle_{2,6}$ | $(\|0++\rangle + \|1--\rangle) \times (\|0++\rangle + \|1--\rangle)$ |

FIG. 24

MODULAR INTERCONNECTED QUANTUM PHOTONIC SYSTEM

CROSS-APPLICATION REFERENCE

This application claims priority to and the benefit of U.S. Provisional Patent Application No. 63/449,030, filed on Feb. 28, 2023, the contents of which are incorporated herein by reference in its entirety.

TECHNICAL FIELD

Embodiments of the disclosure relate generally to quantum systems and, more specifically, to interconnected quantum photonic systems.

BACKGROUND

Quantum computing systems can implement (qubits as information carriers. Whereas bits in conventional non-quantum computing systems (e.g., classical computing systems) can represent a first state (e.g., binary "1", a high state) or a second state (e.g., binary "0", a low state), qubits can represent a first state and a second state, but also a superposition of the first and second state where the qubits can have complex-valued representations that can be entangled with one another in complex space (e.g., a Hilbert space). It can be difficult to implement these systems in a scalable and interconnected approach with available physical resources, such as electrical power, chip count, and cooling power, while maintaining a practical device footprint.

BRIEF DESCRIPTION OF THE DRAWINGS

The present disclosure will be understood more fully from the detailed description given below and from the accompanying drawings of various embodiments of the disclosure.

FIG. 4 shows example modular photonic circuits, in accordance with some example embodiments.

FIGS. 8A-8D show resource state networking schemes, in accordance with some example embodiments.

FIG. 18 shows a seed state cryogenic structure, in accordance with some example embodiments.

FIGS. 23A-23C show photonic qubit examples and components, in accordance with some example embodiments.

FIG. 24 shows example fusion gates and projections, in accordance with some example embodiments.

Figure 1A:
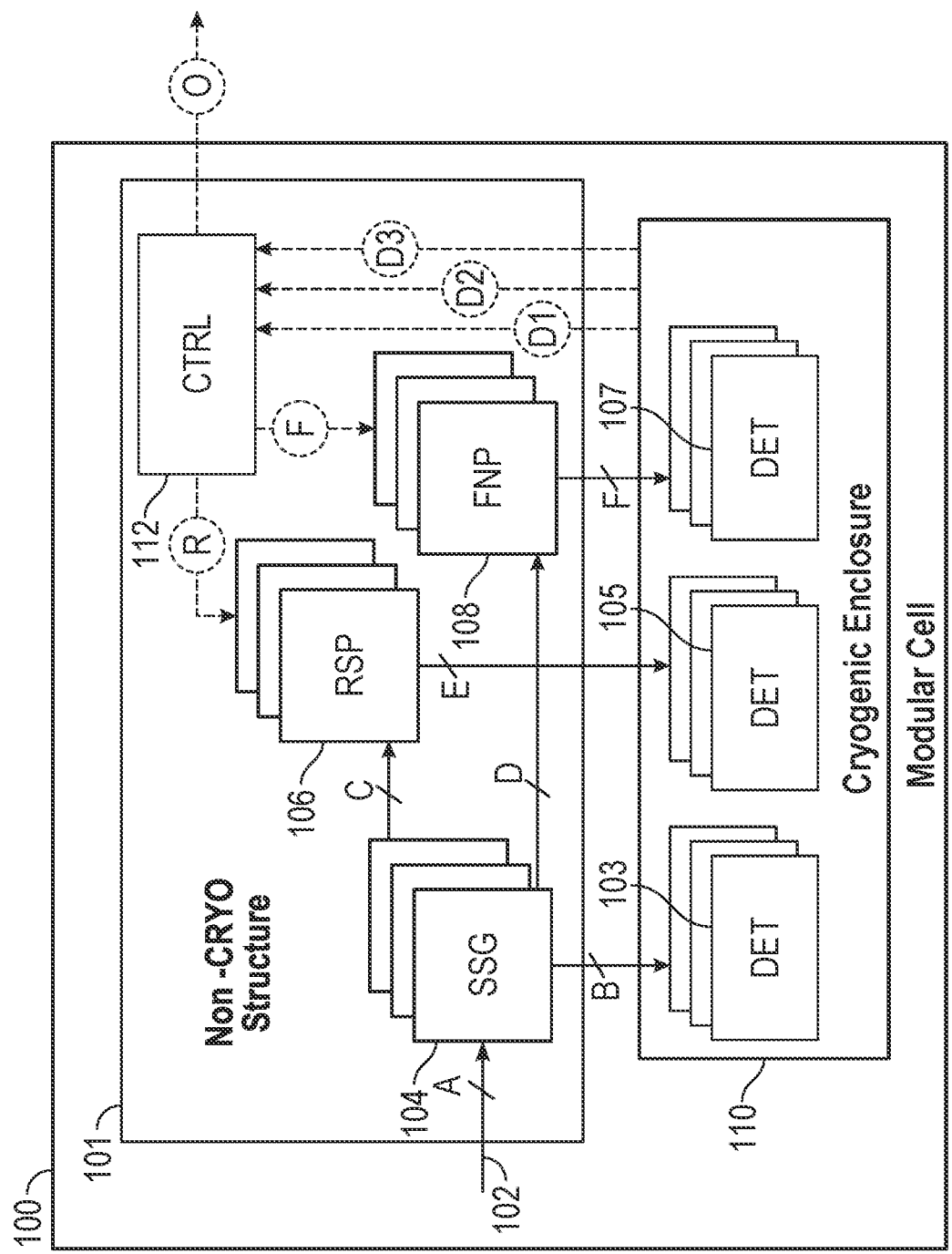
FIGS. 1A and 1B show example modular cells, in accordance with some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As discussed, it can be difficult to implement quantum information processing systems in a scalable manner with practical available resources. To address the foregoing, a modular quantum system can be implemented that comprises a plurality of modular cells that can be interconnected with one another using classical (non-quantum) data connections and quantum (e.g., qubit) interconnections. In some example embodiments, a modular cell can include one or more cryogenic structures (e.g., cryogenic chamber) and room temperature structures (e.g., racks, towers), where cryogenic components can be coupled to the room temperature components using a plurality of optical cables (e.g., fiber optic cables, single mode fiber). In some example embodiments, each modular cell comprises a plurality of entanglement devices, such as seed state generator (SSG) system that generates a first entangled state, a resource state projection (RSP) system that forms second entangled states using projective measurements, and a fusion network projection (FNP) system that can perform additional measurements on qubits from different resource states. In some example embodiments, the room temperature components comprise optical switches (e.g., multiplexers, interference circuits) that can switch couplings of light (e.g., single photons, entangled states) between chips of the different systems to implement the projective measurements. In some example embodiments, in a given cell the photonic chips and assemblies can be configured in different arrangements to implement different entanglement schemes (e.g., resource states) and measurement networks (e.g., fusion networks), where each cell can be connected to other cells in an an extendable array.

In some example embodiments, the measurements are projective measurements on two particle (e.g., two qubit) systems. For example, XX, YY, XY, and/or ZZ measurements refer to fusion measurements (e.g., Type II Fusion, YY Type II Fusion, XY Type II Fusion, ZZ Type II Fusion, and so on). In quantum information, a fusion operation applies a particular two-particle projective measurement (e.g., a Bell projection) which, depending on the Bell basis chosen, can project the two qubits onto one of the four Bell states. The projective measurements produce two measurement outcomes that correspond to the eigenvalues of the corresponding pair of observables that are measured in the chosen basis. For example, an XX measurement (e.g., XX fusion) is a Bell projection that measures the XX and ZZ observables, each of which could have a +1 or −1 eigenvalue (e.g., alternatively: each could have 0 or 1, depending on the convention used). Similarly, a XZ measurement (e.g., XZ fusion) is a Bell projection that measures the observable XZ and ZX observables, and so on. Further details of projective measurements and example circuits are discussed in further detail below. While some of the examples discussed below are in a linear optical setting, it is appreciated by one of ordinary skill in the art that the projective Bell measurements can likewise be implemented in other qubit architectures without departing from the scope of the present disclosure.

Generally, qubits can be a collection of quantum systems or entangled states. Qubits can be formed using different qubit architectures. For example, qubits of entangled states can be implemented as atoms, ions, nuclei, and/or photons. In some example embodiments, qubits and entangled states thereof can also be implemented using engineered systems such as flux qubits, phase qubits, or charge qubits (e.g., formed from a superconducting Josephson junction), topological qubits (e.g., Majorana fermions), spin qubits formed from vacancy centers (e.g., nitrogen vacancies in diamond), neutral atoms (e.g., Ryberg atoms), or qubits otherwise encoded in multiple quantum systems, such as Gottesman-Kitaev-Preskill (GKP) encoded qubits and the like. Furthermore, for the sake of clarity of description, the term "qubit" is used herein although the system can also employ quantum information carriers that encode information in a manner that is not necessarily associated with a binary bit. For example, qudits (e.g., quantum systems that can encode information in more than two quantum states) can likewise be implemented in accordance with some example embodiments.

FIG. 1A shows an example modular cell 100 (e.g., cell entanglement system) for processing of entangled states, in accordance with some example embodiments. In the illustrated example, an arrow with an intersecting diagonal segment and a nearby letter corresponds to one or more modes (e.g., optical channels, fibers, waveguides), where the mode count can correspond to a number of physical light pathways (e.g., fibers, integrated waveguides), and the mode count can have the value of the letter. For example, input light 102 (e.g., photons) can be input into 64 channels ("A"=64 channels into a plurality of SSGs) where each channel can be implemented as an integrated waveguide or fiber (e.g., 64 fibers). In some example embodiments, the input light 102 is generated by photon source PICs (e.g., heralded single photon source assembly 400) included in the modular cell, where the photon source PICs have integrated detectors that are in a cryogenic structure as further discussed in FIG. 1B.

Figure 1B:
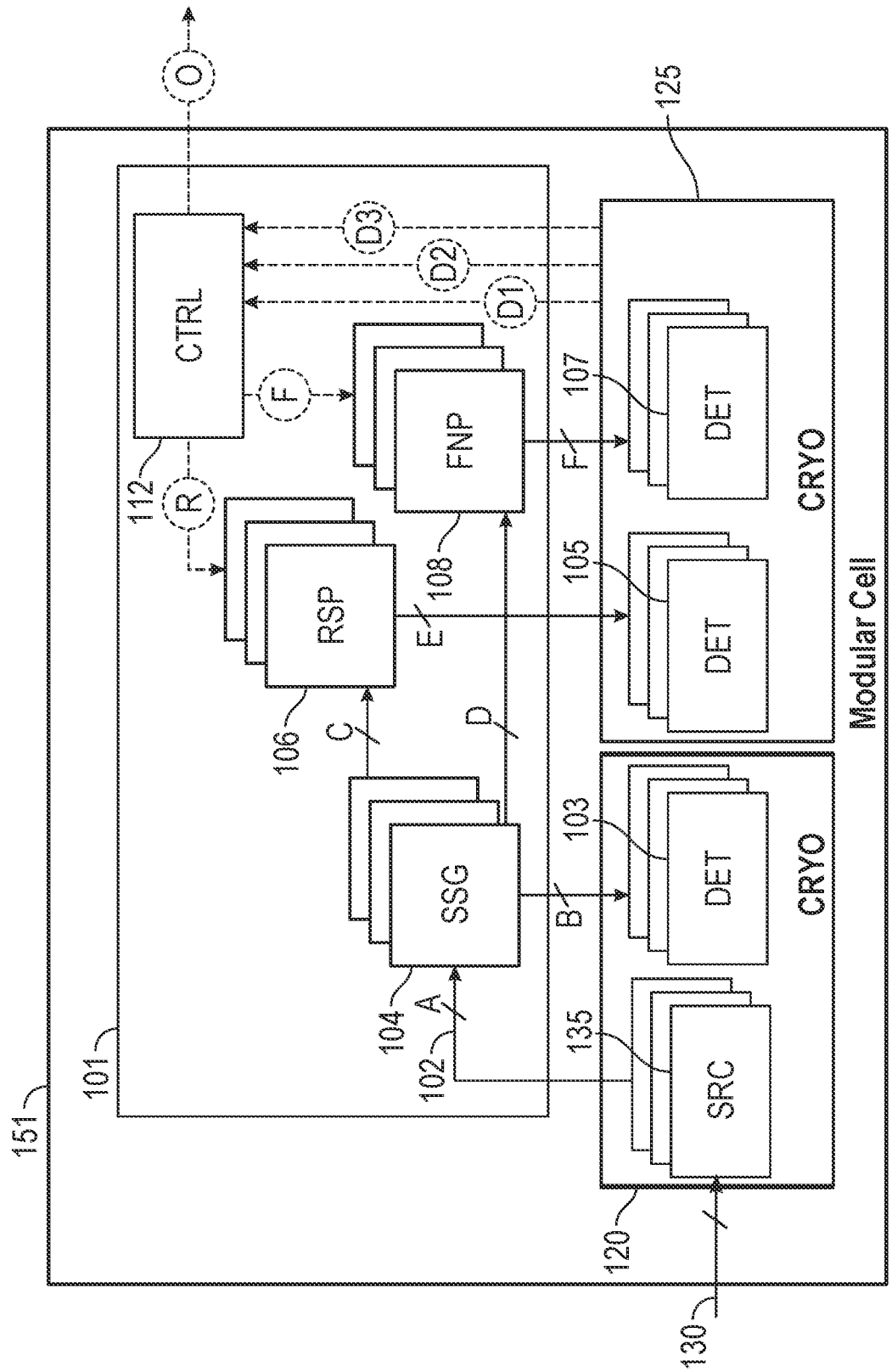

Further, in FIGS. 1A and 1B, dotted-line arrows correspond to data lines (e.g., classical data, electrical data cables, optical fibers transmitting classically modulated light (e.g., pulse amplitude modulation (PA-M), quadrature amplitude modulation (QAM))). The data lines can be implemented to send and receive data (e.g., "D1", "D2", "D3", "F", "R", and "O") to different devices. For example, the controller 112 (e.g., a central processing unit (CPU), a microcontroller, a graphical processing unit (GPU), a field programmable gate array (FPGA), electrical logic circuitry) can receive readout data (e.g., D1, D2, and D3) that can be stored in memory of the controller 112. Further, the controller 112 can generate instructions to be performed by photonic and electrical components in the modular cell 100 (e.g., instructions F, and R), and can further generate outcome data (O), which may be transferred to devices that are external to the modular cell 100 (e.g., to other cells, to a control console). Although controller 112 is illustrated in FIGS. 1A and 1B as a single unit, in some example embodiments the modular cell 100 comprises multiple controllers (e.g., a controller to manage the SSG set 104, another controller to manage the RSP set 106, and a further controller to manage the FNP set 108).

At a high level, the modular cell comprises a non-cryogenic structure 101 (e.g., service racks, towers) having a plurality of non-cryogenic photonic and electric systems. For example, the non-cryogenic structure 101 can include a seed state generator set 104 having SSG units (e.g., FIG. 13) that generate seed state entanglements, a resource state projection set 106 having RSP units (e.g., FIG. 14) that generate resource states, and a fusion network projection set 108 having FNP units (e.g., FIGS. 15 and 16) that perform projective measurements on the generated resource states.

As further illustrated in FIG. 1A, the modular cell 100 comprises a cryogenic enclosure 110 (e.g., a cryogenic structure, such as cryostat or cryo-cabinet) to manage cryogenic components. The cryogenic enclosure 110 can be cooled to cryogenic temperatures (e.g., below 120 Kelvin (K), 2K, 4K, 77K) using circulation of cryogenic coolants, such as liquid nitrogen and liquid helium. In some example embodiments, the connections between the components of the non-cryogenic structure 101 and the cryogenic enclosure 110 are implemented using a plurality of optical cables and electrical cables. For example, a plurality of optical fibers and electrical cables can connect the components of the non-cryogenic structure 101 to the components in the cryogenic enclosure by passing through feed throughs (e.g., vacuum feed throughs, ports) of the cryogenic enclosure 110.

In some example embodiments, the cryogenic enclosure 110 can include a sealed environment under moderate or high vacuum in which cryogenic coolants (e.g., liquid Helium, liquid Nitrogen) are circulated to cool chips that function at cryogenic temperatures, such as detectors 103, detectors 105, and detectors 107 (e.g., photonic detector circuits). Although the example of FIG. 1A shows all the detectors in the same single cryogenic enclosure 110, in some embodiments, multiple cryogenic enclosures are implemented, as discussed with reference to FIG. 1B.

FIG. 1B shows an example modular cell 151, in accordance with some example embodiments. In the modular cell 151 of FIG. 1B, the detectors 103 are in a first cryogenic enclosure 120 and the detectors 105 and detectors 107 are in a second cryogenic enclosure 125 which may be separated from one another (e.g., across from each other in a room, in different buildings). Further, in the example of FIG. 1B, the modular cell 151 comprises source circuits to generate the input light 102. For example, a plurality of photon source circuits 135 can include on-board single photon detectors to detect one photon of the photon pair, where the other photon is output to the SSG set 104. Further, in some example embodiments, the plurality of source circuits 135 receive pump light 130 from an external source (e.g., mode locked laser source, not depicted), where the pump light 130 comprises classical light pulses in a pulse train or sequences of pulses.

The following is a general explanation of example operations of the modular cell 100 with reference to FIG. 1A, though it is appreciated that the details and configurations are examples, and quantities of channels, types of entangled states, and configurations of the components may be implemented differently, as discussed in further detail below.

With reference to FIG. 1A, a plurality of single photons are provided as the input light 102 into the SSG set 104. Each SSG unit comprises photonic circuits to generate seed state entanglements (e.g., Bell pair, GHZ (Greenberger-Horne-Zeilinger) state). Each SSG unit comprises a plurality of output channels, including "B" channels that are coupled to a plurality of detectors 103. In some example embodiments, each SSG (e.g., an entanglement device) is coupled to other entanglement devices using entanglement device optical interconnects (e.g., fibers), such as "C" channels that are coupled to RSP units of the RSP set 106, and "D" channels that are coupled to FNP units of the FNP set 108. In some example embodiments, the plurality of seed state generators run at a seed state clock cycle (e.g., a seed state frequency, such as 1 GHz), where in a given cycle, each SSG receives its own set of photons (e.g., 3 photons, six photons) for generation of seed entangled states.

Figure 8B:
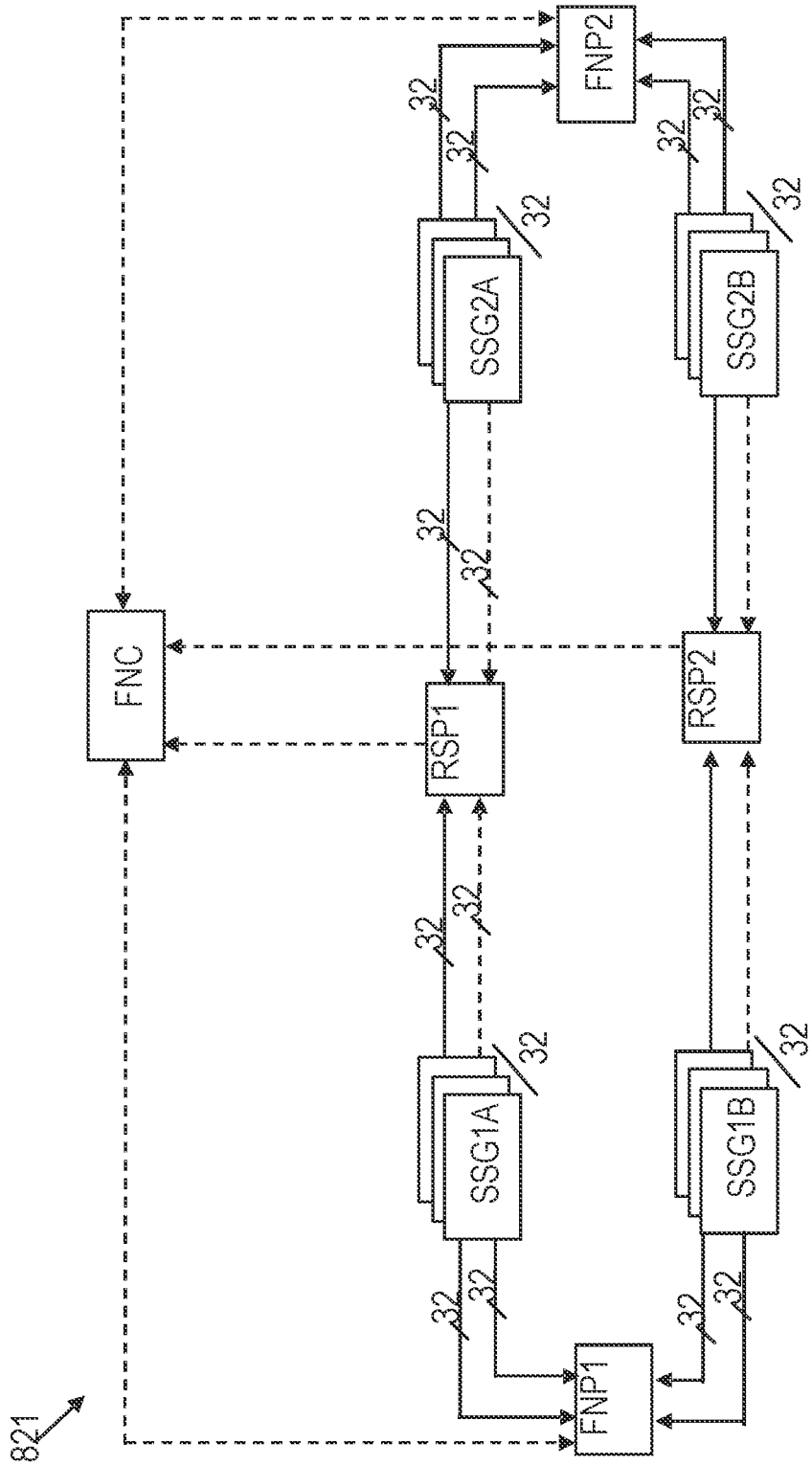
Figure 8C:
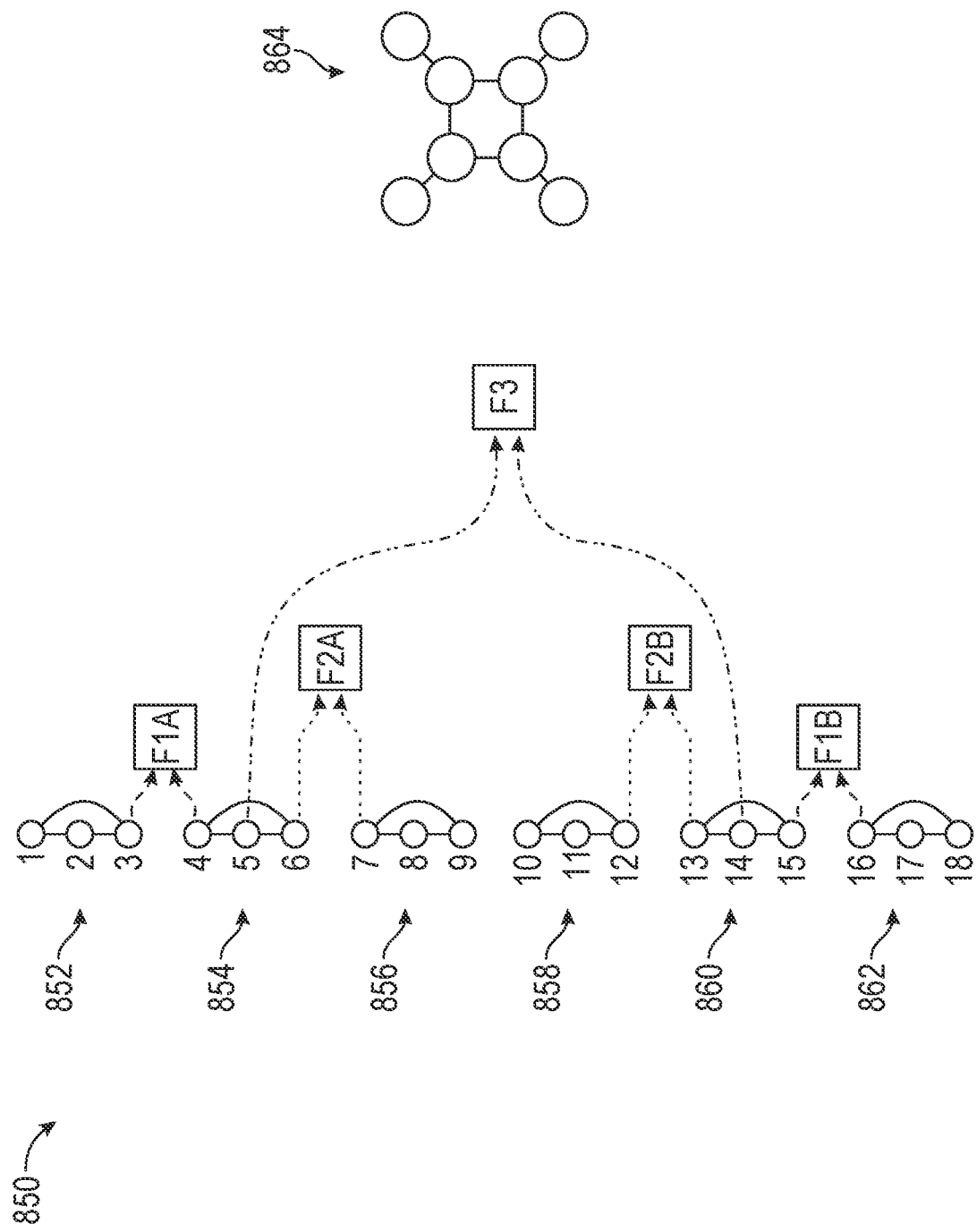
Figure 8D:
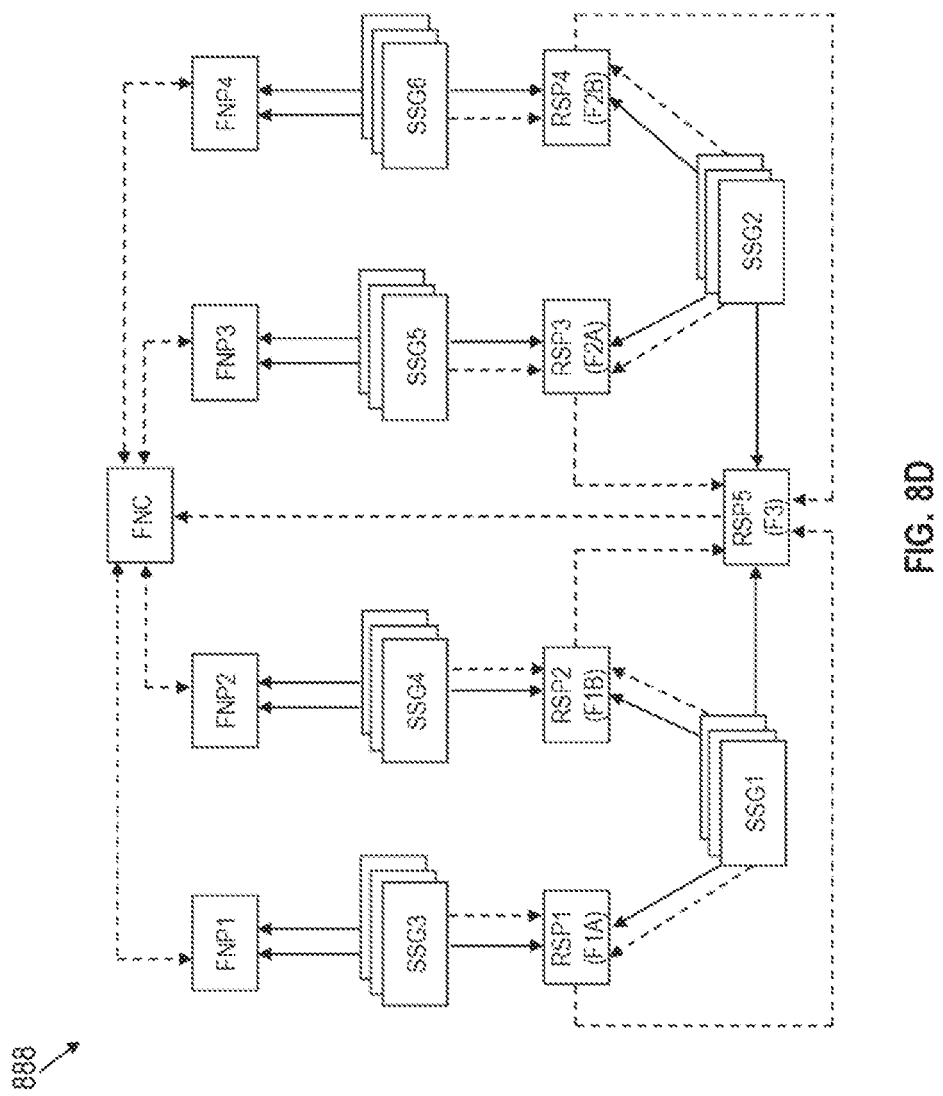

The outputs on the B channels are measured by the detectors 103 to output detection data D1 that is transmitted to the controller 112 (e.g., fusion network controller (FNC), FIGS. 8B and 8D). In some example embodiments, the controller 112 determines which sets of B channels have success patterns and transmits resource state configuration settings "R" to the RSP units of the RSP set 106 (e.g., informing the RSP units which channels comprise seed states and settings to preform projective measurements). In some example embodiments, while the RSP set 106 receives the resource state configuration settings and configures the RSP components (e.g., phase shifters), the light that is on the C channels is delayed (e.g., via optical delays, lengths of fiber).

The RSP set 106 then receives the light on the C channels and performs interference on the light, where the interfered light (e.g., interfered qubits) is output on the "E" channels to the detectors 105. The detectors 105 generate detection data D2 (resource entangled state readout data) that is transmitted to the controller 112. In some example embodiments, the controller 1712 determines from the detection data D2 which of the RSP units successfully performed projective measurements, thereby indicating which of the D channels comprise resource state entanglements (e.g., 4 GHZ). For instance, light on the C and D channels may be entangled, and a RSP unit can perform a two-particle projective measurement on qubits on the C channel such that their corresponding entangled states on the D channel are in a resource state, as discussed in further detail below. In some example embodiments, the RPS units have a clock rate that is longer than the seed state cycles (e.g., RSPs can operate at 1 to 2 MHz, whereas the seed state system 115 (and pump light system) may run at approximately 200 MHz or above).

In some example embodiments, after determining which of the RSP units of the RSP set 106 successfully performed their respective projective measurements, the controller 112 generates fusion network configuration settings "F", which is transmitted to the FNP units of the FNP system 108. The fusion network configuration settings data "F" can include data indicating which channels of D have resource states on them based on successful projection measurements being performed by the RSP units. As further discussed below, the settings data for the FNP system 108 can include optical switch setting data to implement interferences for various measurements (e.g., XX, ZZ and the like; single particle measurements). In some example embodiments, the light on the D channels is delayed (e.g., via an optical delay, length of fiber) while the FNP system 108 receives the data "F" and configures the FNP units (e.g., configures phase shifters). In some example embodiments, the FNP units have a clock rate that is longer than the SSG and RSG units (e.g., lower than 1 MHz).

The FNP set 108 then receives the light on the D channels and performs interference of the light. In some example embodiments, the interfered light (e.g., interfered qubits) from the FNP system 108 is then output on the "F" channels to the detectors 107. The detectors 107 generate detector data D3, which is received by the controller 112 and transmitted as outcome data "O" to one or more external destinations, such as a control consol (e.g., control console 210, FIG. 2).

Figure 2:
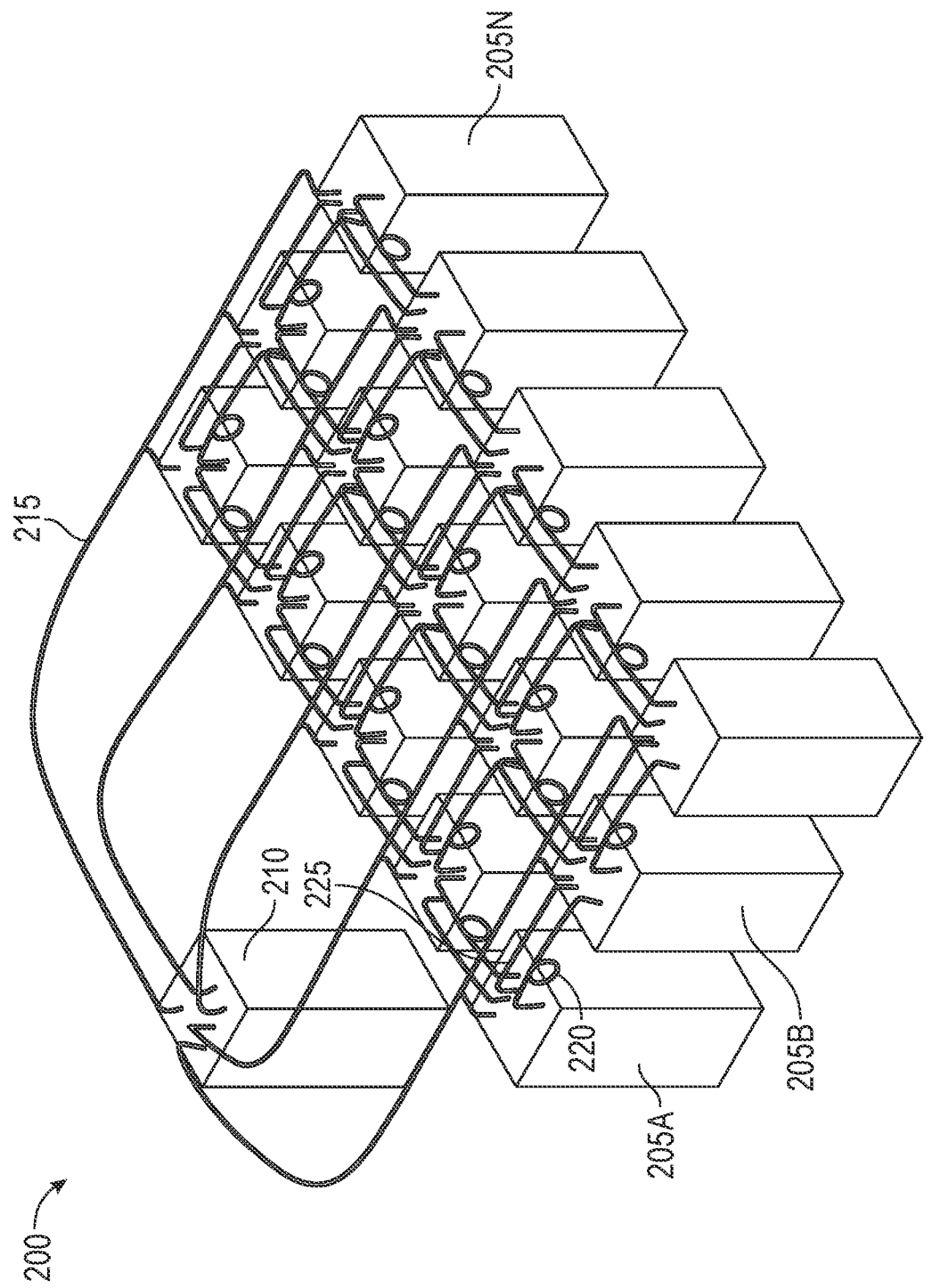
FIG. 2 shows a modular array system, in accordance with some example embodiments.

FIG. 2 shows a modular array system 200, in accordance with some example embodiments. In the illustrated example, the modular array system 200 comprises an array of modular cells 205A-205N (e.g., cell entanglement systems; modular cell 100, FIG. 1). In some example embodiments, each modular cell comprises a cryogenic portion (e.g., cryogenic enclosure) to manage cryogenic components (e.g., chips, assemblies that are designed operate at or below 120K) and a non-cryogenic portion for room temperature components (e.g., chips, assemblies operable above 120K). Although in the example of FIG. 2, each modular cell is shown as a rectangular tower, in some example embodiments each cell can include one or more separate physical structures that operate as a single modular cell (e.g., FIGS. 17A-17C).

In some embodiments, each modular cell is connected to one or more other cells using classical interconnections 225 (e.g., electrical or optical cabling, illustrated as gray straight-lined connections, cell optical interconnects) that transmit non-quantum information (e.g., digital data, bright light). Further, each cell can couple entangled states (e.g., qubits) to one or more other cells using qubit interconnects 220 (e.g., illustrated as looped connections in FIG. 2). In some example embodiments, the qubit interconnects 220 are implemented as a plurality of optical fibers (e.g., cell optical interconnects to transmit quantum states). In some example embodiments, the qubit interconnects 220 comprise off the shelf optical fiber cables, while in other example embodiments the qubits interconnects 220 comprise optical fiber cables in a stabilized housing, such as a temperature regulated pipe or sheath.

Figure 27:
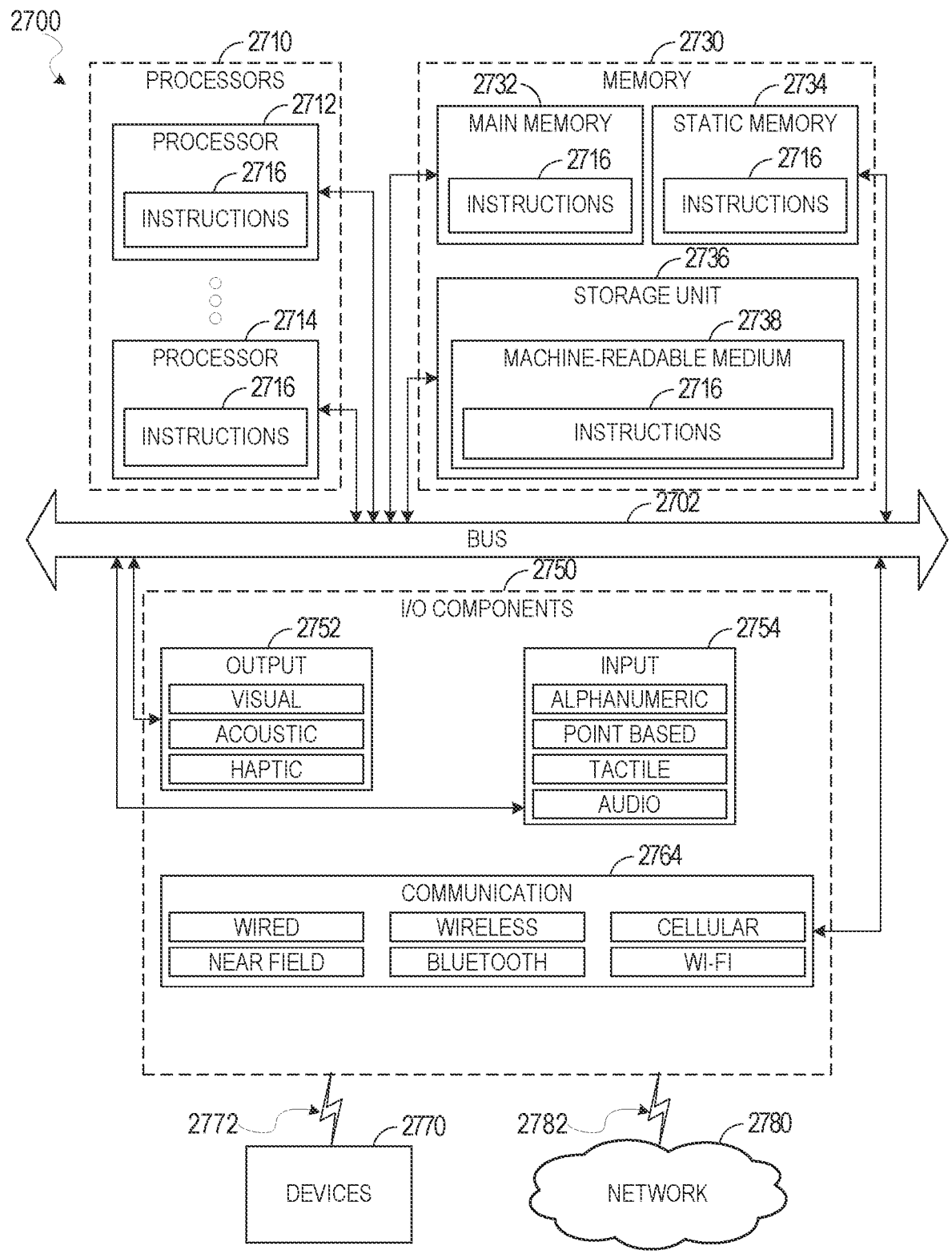
FIG. 27 shows an example classical computing system, in accordance with some example embodiment.

In some example embodiments, each modular cell comprises classical connections 215 to a control console 210, which has one or more classical computing systems (e.g., CPUs, FPGAs, GPUs, memory; FIG. 27). In some example embodiments, the control console 210 can store network graph data comprising instructions for a list of tasks to be performed by the cells in the array. For example, the control console 210 can store fusion network graph data that can be distributed in portions (e.g., portions generated from decomposition, spectral decomposition) to the modular cells for processing and receive readouts from the modular cells to determine a next set of fusion instructions to be distributed to the array of cells. In some example embodiments, the control console 210 interfaces with local controllers in each cell (e.g., controller 112, an FNC of a cell) and the local controllers implement the parsed instructions for that cell (e.g., portions of fusion layers distributed to that cell, as discussed in further detail below). In some example embodiments, upon fusion measurements being performed by the FNP systems, the readout data from each cell is transmitted to the control console 210 for decoding to determine next instructions for distribution. In some example embodiments, the control console 210 can implement a decoding scheme, such as minimum weight perfect matching and variations thereof, or Union Find decoding, or other off the shelf decoding software. In some example embodiments, the control console 210 comprises a modularized decoding system that can perform decoding of the data in a distributed manner (e.g., in parallel on different processing cores, such as CPU cores or GPU units). Further details of modular decoding are described in PCT/US24/14510, titled "Modular Decoding", filed on Feb. 5, 2024, which is hereby incorporated by reference in its entirety.

Figure 3A:
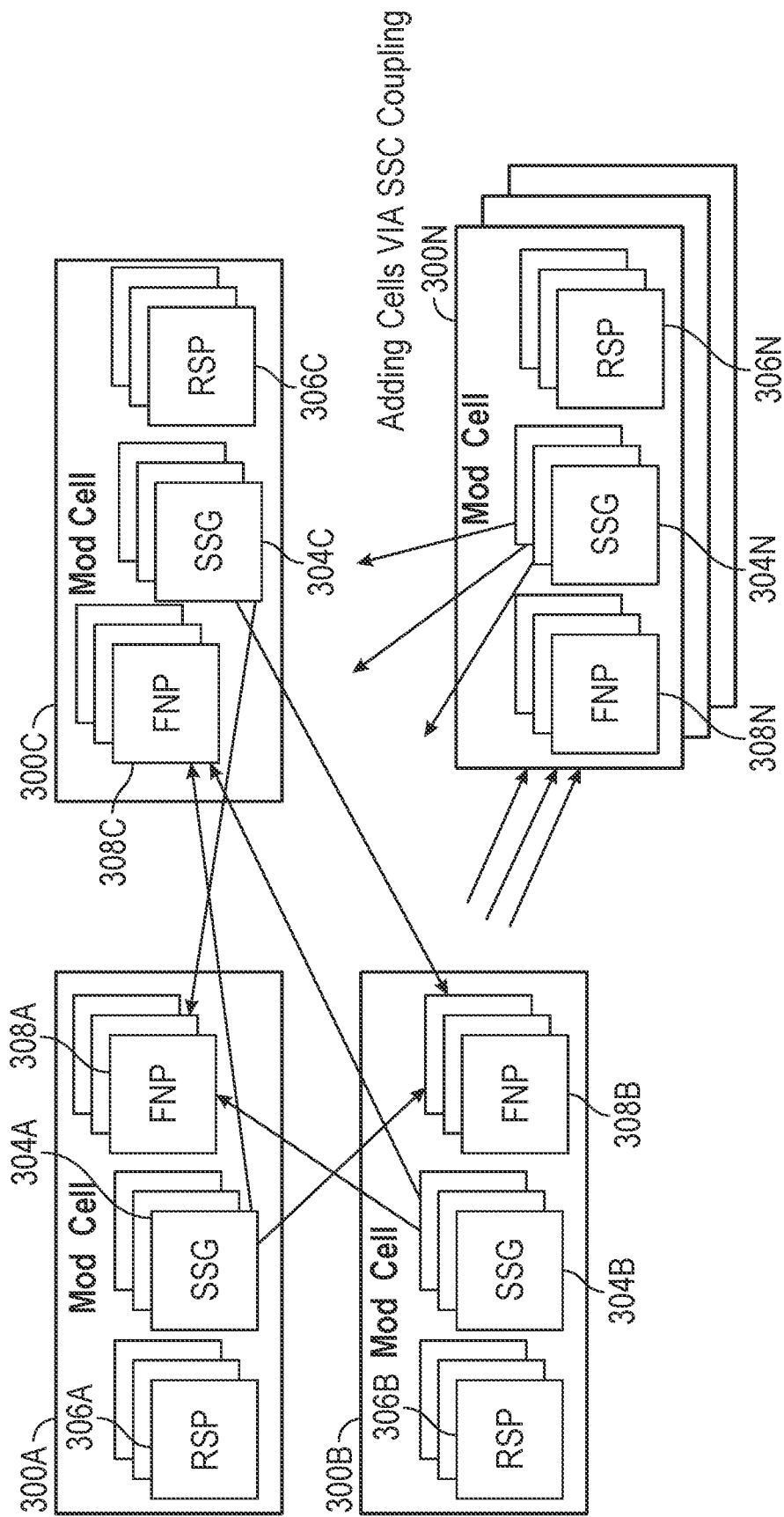
FIGS. 3A and 3B show interconnections and scaling of the modular array by adding additional modular cells, in accordance with some example embodiments.
Figure 3B:
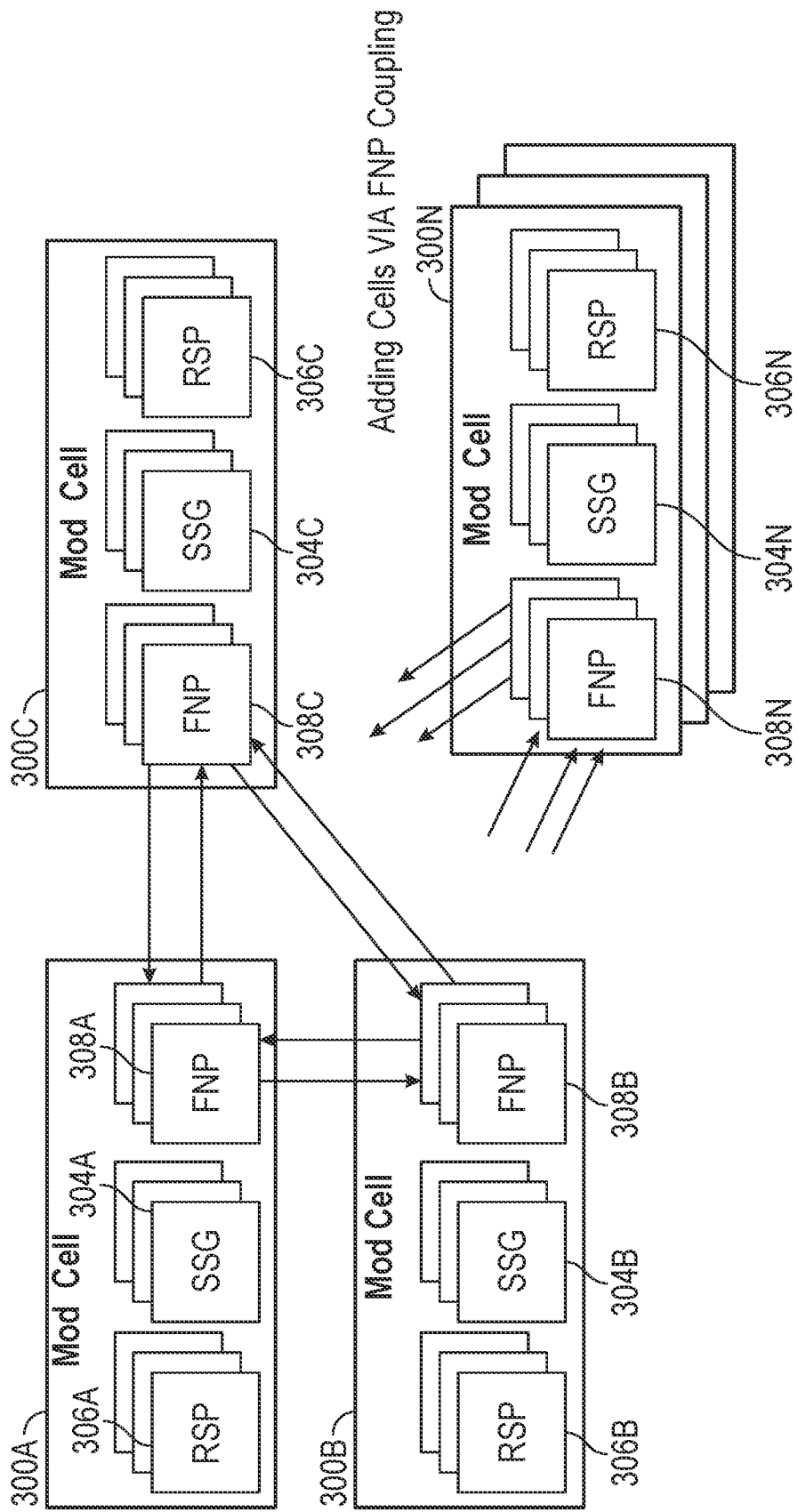

FIGS. 3A and 3B show approaches for implementing qubit interconnections between modular cells, in accordance with some example embodiments. In the example of FIG. 3A, qubit interconnections are illustrated as solid arrows that interconnect three modular cells 300A-300C. Each modular cell 300A-300C comprises entanglement devices, such as respective SSG systems 304A-304C, RSP systems 306A-306C, and FNP systems 308A-308C. In some example embodiments, qubits from different states can be directed to other cells in an interleaving scheme that implements layers of a fusion network, as further discussed below.

In FIG. 3A, entangled portions of states (e.g., qubits of resource states) can be sent between the different modular cells by directing qubits from SSG units to FNP units of other cells. For example, a qubit of a seed state from modular cell 300A can be switched to be an input into a FNP of another cell, such as FNP 308B. Further, additional cells, such as modular cell 300N having SSG 304N, RSP 306N and FNP 308N, can be added to the array by coupling the outputs of the SSG units 304N to the FNPs of the existing cells. In some example embodiments, each SSG is coupled to a finite set of FNPs that is less than the full set of FNPs of the array (e.g., each SSG need not be coupled to each existing FNP). For example, in some embodiments, each SSG is connected to a nearest set of 10 FNPs in other nearby cells. As an additional example, the number of SSG to FNP connections may vary; e.g., a first set of SSGs connected to at least two FNPs in at least two other cells, a second set of SSGs connect to at least four FNPs in at least four other cells, in a scaled manner to enable flexible switching of qubits between near cells and farther away cells.

In the example of FIG. 3B, entangled portions of states (e.g., qubits of resource states) can be sent between different modular cells by directing qubits received by a first FNP to a second FNP in another cell using switches located within or coupled to the first FNP. For example, the first FNP can include a row of optical switches (e.g., multiplexer circuits 1502 to 1510 depicted in FIG. 16) that receives qubits of resource states from SSGs and can direct the received qubits to other FNPs (via output ports 1605, FIG. 16).

Further, in the example embodiment of FIG. 3B, additional cells, such as modular cell 300N, can be added to the array by coupling FNPs of the modular cell 300N to other FNPs of the existing cells 300A-300C. In some example embodiments, each FNP is coupled to a finite set of FNPs that is less than the full set of FNPs of the array (e.g., each FNP need not be coupled to each existing FNP). For example, in some embodiments, each SSG is connected to a nearest set of 10 FNPs in other cells. As an additional example, the number of SSG to FNP connections may vary; e.g., a first set of SSGs connected to at least two FNPs in at least two other cells, a second set of SSGs connect to at least four FNPs in at least four other cells, in a scaled manner to enable flexible switching of qubits between near cells and farther away cells.

FIG. 4 shows example photonic circuits (e.g., chips, assemblies or boards comprising multiple chips) that can be implemented in modular cells, in accordance with some example embodiments. Each photonic circuit can be implemented as a discrete chip (e.g., die), or collection of chips on a chip assembly (e.g., card, board, optical interposer). The example photonic circuits include a heralded single photon source assembly 400 ("HSPS"), a detector assembly 410, a multiplexer assembly 420 (e.g., an optical switch), a seed state assembly 430, and a fusion measurement circuit (FMC) assembly 440.

The heralded single photon source assembly 400 (comprises a plurality of source photonic integrated circuits (PICs), such as source PIC 402A, to generate photon pairs using a pair photon scheme, such as four wave mixing or parametric down conversion. In the illustrated example, source PIC 402A receives control signals (e.g., clock rate, tuning) from electrical controller 402B. Further, classical pump light (e.g., optical pulse train) can be coupled to input 404, where the pulses cause generation of photon pairs, which are coupled to outputs 406 (e.g., ports coupled to fibers or waveguides).

In some example embodiments, the photon pairs can include a signal photon that is detected by an on-board single photon detector at cryogenic temperatures, and an idler photon that is output by the heralded single photon source assembly 400 for further processes. In some example embodiments, the heralded single photon source circuits have on-board photon detectors.

In some example embodiments, the detector assembly 410 comprises a plurality of single photon detectors (e.g., single photon detectors, number resolving single photon detectors, super conducting nanowire-based detectors, avalanche detectors) to detect photons at cryogenic temperatures. In some example embodiments, chips or assembles of the heralded single photon source assembly 400 and the detector assembly 410 are managed in a cryogenic enclosure to maintain single photon detectors at a consistent cryogenic operating temperature (e.g., 3K, 4K, 30K, 77K). In the illustrated example of FIG. 4, the detector assembly 410 comprises a detector PIC 412A having detection components (e.g., nanowires) and an electrical control circuit 412B that is wire bonded to the detector PIC 412A. In some example embodiments, a plurality of inputs 414 (e.g., fibers) can couple light, such as single photons, to the detectors which can be detected and transmitted as data out of the detector assembly 410 on a data channel 408 (e.g., data cables to pass through cryo chamber feed throughs).

The multiplexer assembly 420 is an optical switching circuit that comprises a reconfigurable interferometer PIC 422A (e.g., a Generalized. Mach Zehnder Interferometer (GMZI) with active elements (e.g., phase shifters, thermal phase shifters, electro-optic-based phase shifters) or passive elements (waveguides in asymmetric GMZIs) to implement N-to-1 or N-to-M multiplexing to route photons and qubits. The multiplexer assembly 420 further comprises an electrical controller 422B to apply control signals to the PIC 422A. For instance, the phase shifter can receive voltage settings that cause shifts in light propagating through the PIC such that a target transfer matrix is applied to light that is input via the N-inputs ports 424 and are output according to the transfer matrix on on M-outputs 426 (e.g., route all input photons to a top-most port of the M-outputs, route input photos to every other output port, etc.). In some example embodiments, the interference circuits are implemented as higher channel count GMZIs (e.g., 64 inputs and outputs, with 64 phase shifters between the splitter networks: 128 inputs and outputs and 128 phase shifter arms, or larger).

Figure 6:
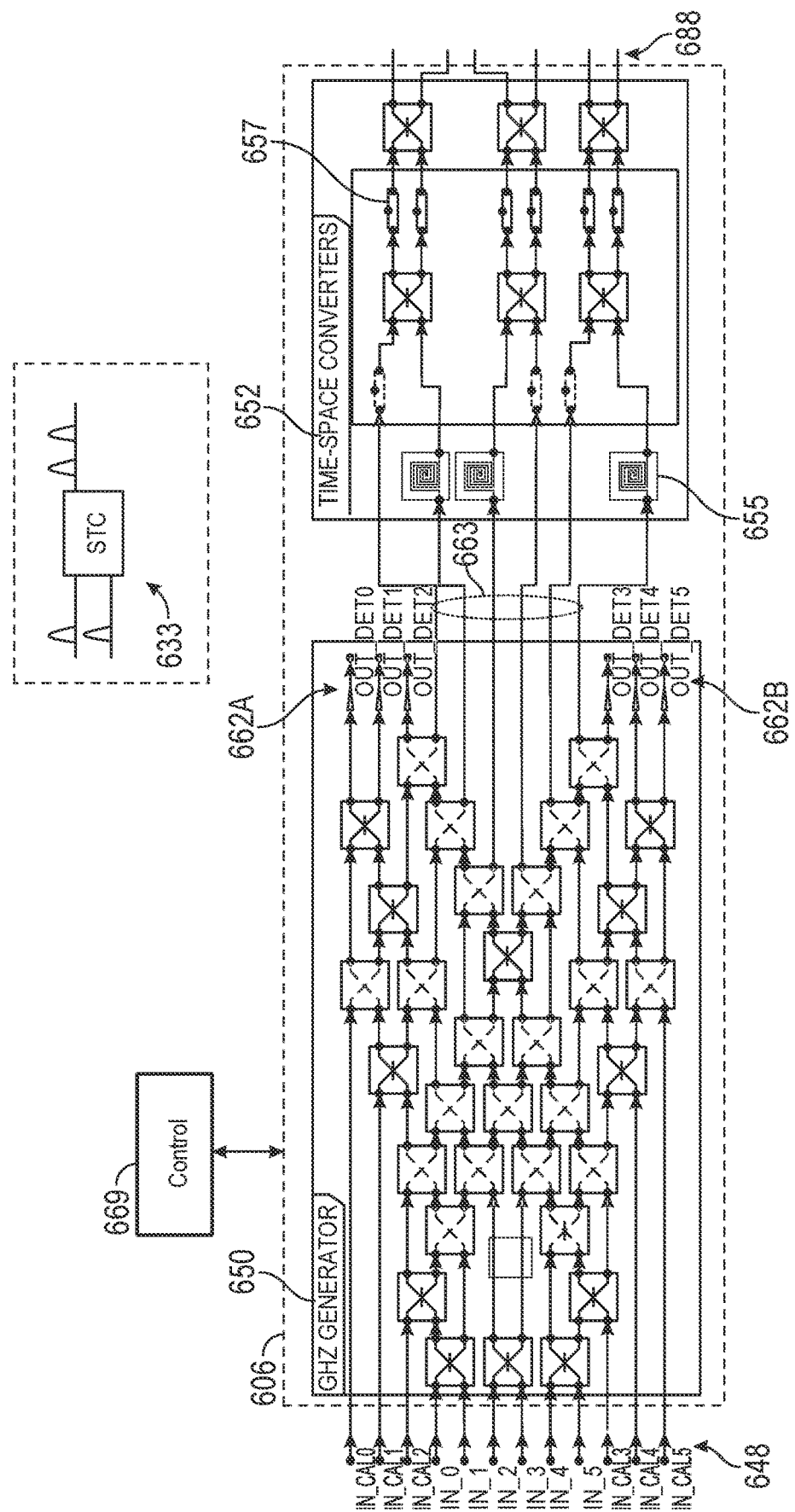
FIG. 6 shows an example seed state circuit, in accordance with some example embodiments.

The seed state assembly 430 contains a photonic integrated circuit 432A to interfere photons and output entangled seed states (e.g., Bell states, GHZ states, legged states, any other entangled state type). In some example embodiments, an electrical control circuit 432B is connected to the PIC 432A to control active components in the PIC 432A, such as space to time converter circuits. In some example embodiments, the seed state assembly 430 further includes switch circuitry to convert the entangled seed states from a given mode (e.g., dual rail spatial mode) to another format (e.g., time bin, temporal mode) for transmission to other components, such as FMCs in resource state systems or fusion systems. In the illustrated example of FIG. 4, the SSC assembly has a plurality of input ports 434 that can receive photons (e.g., six photons, eight photons), and output interfered light (e.g., in a superposition) to output ports 436A, 436B, and 436C (e.g., coupled to fibers). In some example embodiments, the seed state outputs direct portions of the seed state outputs to different destinations. For example, a first output set 436A can be coupled to detectors, a second output set 436B can be coupled to another device (e.g., resource state chips), and a third output set 436C can be coupled to further device (e.g., fusion chips). As used here, SSC refers to a interference circuit (e.g., chip, assembly; FIG. 6), whereas SSG refers to a system level implementation (e.g., FIG. 13) that can include one or more SSCs (e.g., seed state circuit 1306, FIG. 13).

The FMC assembly 440 comprises a controllable interference PIC 442A to perform fusion operations (e.g., Type-I fusion, Type-II fusion measurements, single qubit measurements). In some example embodiments, an electrical controller chip 442B is electrically connected to the PIC 442A to send phase shifter instructions to active elements to perform specified operations (e.g., GMZI operations for ZZ, XX, other operations). In some example embodiments, one or more FMCs are included in the resource state system to perform fusion operations to generate resource states, and one or more other sets of FMCs are included in the fusion measurement system to perform fusions that fuse together resource states. In some example embodiments, light (e.g., resource states) is received via input ports 444 (e.g., fibers connected to seed state circuits) and the FMC assembly 440 outputs the light on outputs 446A-446C, such as fibers that are connected to detectors in a cryogenic chamber.

Figure 5:
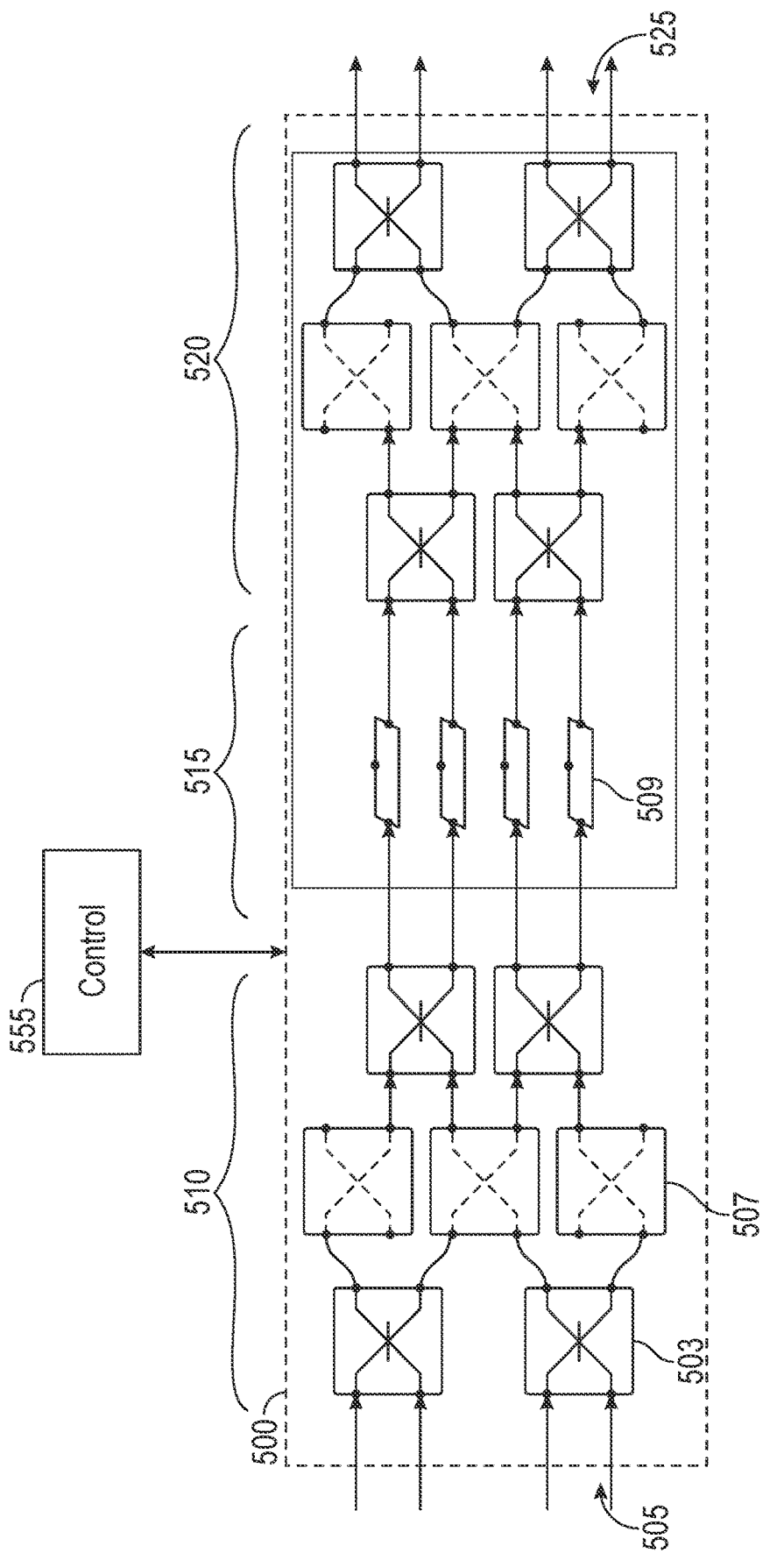
FIG. 5 shows a multiplexer circuit, in accordance with some example embodiments.
Figure 7:
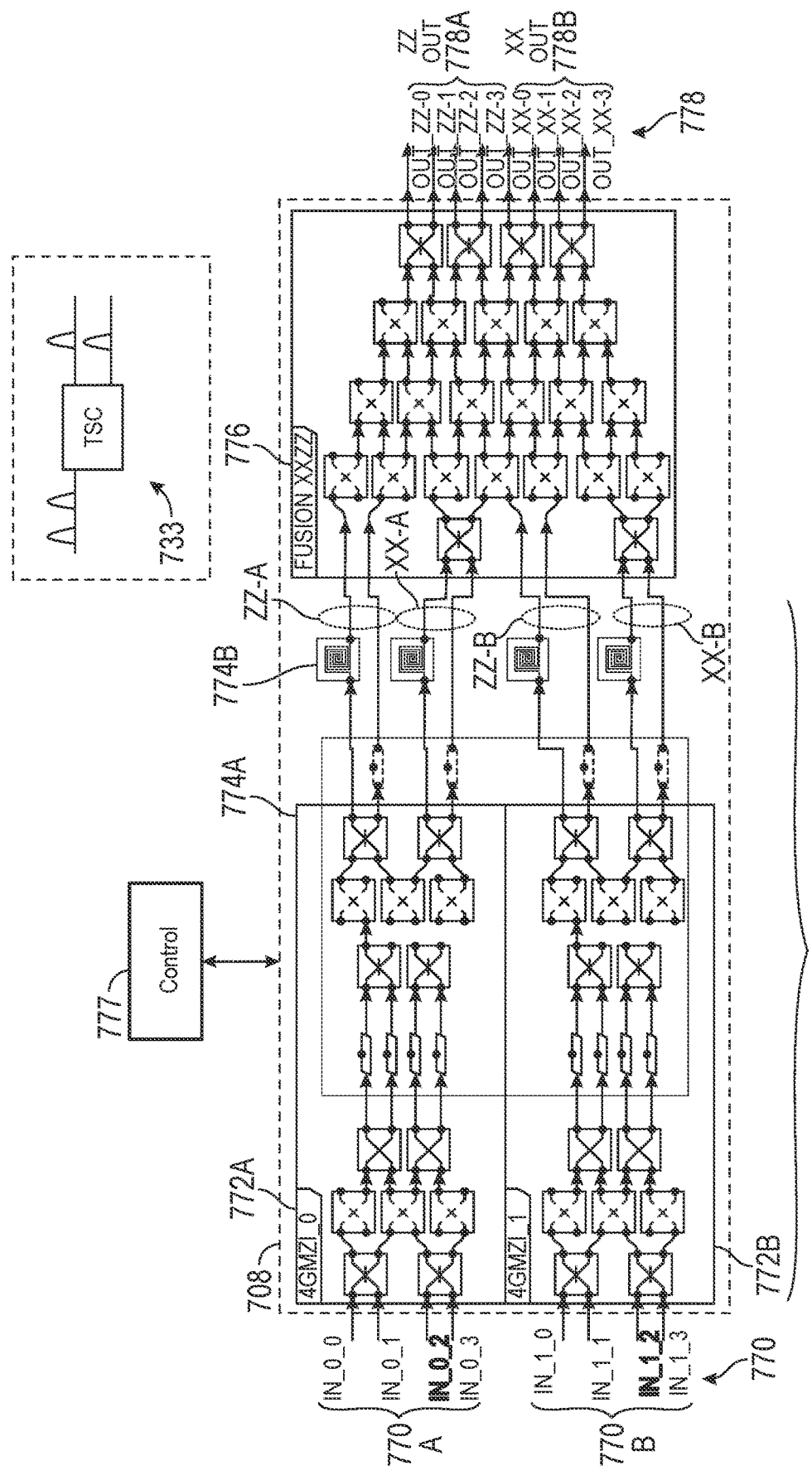
FIG. 7 shows an fusion measurement circuit, in accordance with some example embodiments.

FIG. 5 shows a multiplexer circuit 500, in accordance with some example embodiments. In FIGS. 5-7, beam splitters are illustrated as directional couplers, such as directional coupler 503 in FIG. 5 (an x with a horizontal bar segment in the middle), and waveguide crossings are illustrated crossing couplers, such as crossing coupler 507 in FIG. 5 (e.g., an x, a crossing of two waveguides in the same layer, a crossing of two waveguides in different layers). Further, in FIGS. 5-7, phase shifters are illustrated as parallelograms or rhombuses, such as phase shifter 509 in FIG. 5.

The multiplexer circuit 500 is an example photonic circuit of multiplexer assembly 420, which can be implemented to route light (e.g., bright light, single photons) from one or more inputs 505 to one or more output ports 525. In the illustrated example, the multiplexer circuit 500 comprises a first splitter network 510 (e.g., a 4×4 Hadamard network, a 256×256 Hadamard network), and a second splitter network 520 (e.g., another 8×8 Hadamard network, another 256×256 Hadamard network) that is arranged as opposite of the first splitter network. In some example embodiments, the splitter network comprises power splitters, such as directional couplers (e.g., directional coupler 503, a 50:50 splitter) and crossing couplers (e.g., crossing coupler 507). Further, in some example embodiments, each arm between the splitter networks comprises a phase adjustment section 515, such as a passive waveguide hump or an active phase shifter that is controllable via control signaling from control circuit 555. In some example embodiments, the multiplexer circuit 500 operates as a GMZI, which applies a transfer matrix to a set of input modes which are then output at the output ports 525. Further details for optical switches are described in PCT/US23/22143, titled "Photonic Switch," filed on May 12, 2023, which is hereby incorporated by reference in its entirety.

FIG. 6 shows an example seed state circuit 606, in accordance with some example embodiments. The seed state circuit 606 comprises an interference circuit 650 that generates the seed state, an encoding conversion circuit 652 to convert the output state from spatial encoding to time bin encoding for transfer to other devices. In some embodiments, the active components of the seed state circuit 606 receive control signaling from controller 669 to set phase shifts to convert the encoding of the light for transmission to other components (e.g., space to time format conversion). An example space-to-time converter (STC) diagram 633 is included as an example of spatial path encoding to time bin encoding. With reference to STC circuit 633: on the left side, a dual rail qubit is in superposition on an upper arm and a lower arm in a spatial path encoding format (e.g., same time bin, different paths). The STC box comprises delays (e.g., waveguide delay 655, fiber delay, waveguide spiral) to delay one of the arms (the upper arm) while one or more phase shifters (e.g., phase shifter 657 of a switch, a GMZI) directs the lower qubit portion to the upper arm, albeit in a different time bin. The output is the qubit on a single arm, the upper arm, but spread out on two different time bins.

In some example embodiments, the seed state circuit 606 at a clock rate (e.g., seed state clock rate, pump light clock rate), and the encoding conversion circuit 652 has delays and phase shifters that operate based at least in part on the clock rate to perform path encoding to time bin encoding conversion. For example, the clock rate of the received light (e.g., seed states, pump light) can be 1 GHz, and each delay (e.g., delay 655) is 25 ps to 500 ps long, and the phase shifters operate at least twice the speed of the clock rate (e.g., at 2 GHz or higher). In some example embodiments, during a first half of a given clock cycle the phase shifters (e.g., phase shifter 657) are turned on to impart phase, and then in the second half of the same clock cycle the phase shifters are turn off, such that the qubit is output in different time bins on a same mode.

In FIGS. 6 and 7, delays are illustrated as spirals, such as delay 655 in FIG. 6. The delays can be implemented as waveguide delays (e.g., integrated waveguide spirals) or if longer delays are implemented per a given network design, an integrated waveguide can be coupled to a length of fiber (e.g., a fiber spool or reel of optical fiber). In some example embodiments, six photons are input into the middle six ports of the input ports 648 (where the other ports can be implemented as calibration ports during a calibration phase). The six photons are interfered in the interference circuit 650 and output to the detector ports 662A and 662B (six ports) and intermediate ports 663. In some example embodiments, the photons coupled to the detector ports 662A and 662B undergo detection on detector PICs to generate output data, which is analyzed to determine whether the output data is success data or failure data. In some example embodiments, success patterns are those in which, between a pair of detectors A and B in a single detection cycle, only one of the detectors detects exactly one photon (e.g., 1 click) and the other of the detectors detects zero photons (e.g., 0 clicks); whereas failure patterns can include double detections on a single detector or one photon detection per detector. For instance, for example detectors A and B in a given detection cycle using the click tuple [A, B], success patterns can include [1,0] and [0,1]; whereas failure patterns can include [2,0] and [0,2]. In the example of FIG. 6, a 3-GHZ is determined to be successfully output on the intermediate ports 663 when the detectors collectively detect three photons (e.g., three photons are detected, 1 on each pair of detectors of the six detectors that are coupled to detector ports 662A and 662B). The 3-GHZ is converted from spatial encoding to time bin encoding using the encoding conversion circuit 652 for output on output ports 688 for transfer to other components in the system, such as FMC chips. Although FIG. 6 shows an example photonic circuit that forms an entangled (e.g., a 3-GHZ), it is appreciated that other entangled states can be implemented by other seed state circuits; e.g., where the other entangled states are input into resource projection systems for interference and fusion projection systems for fusion projections, in accordance with some example embodiments.

Figure 25B:
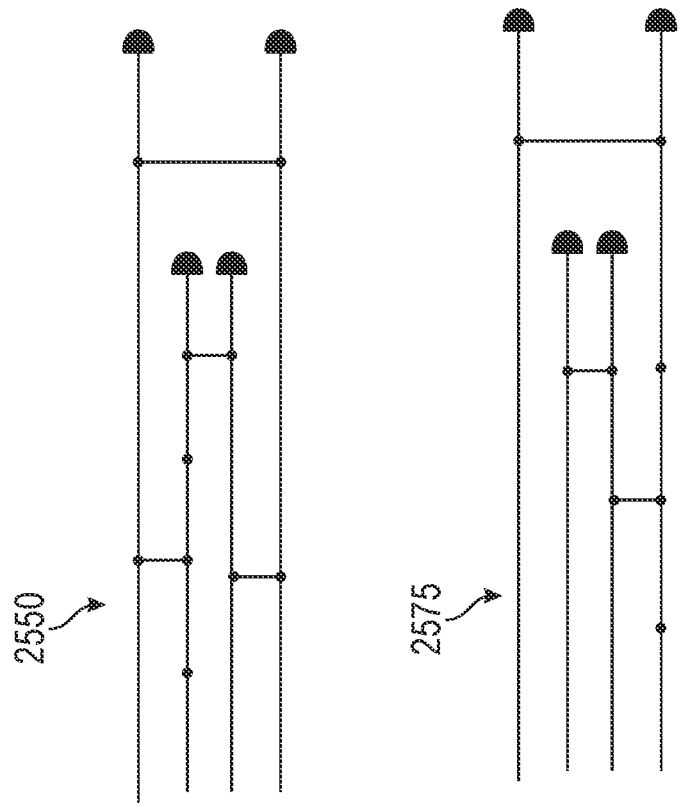
FIGS. 25A and 25B show example fusion schemes implemented as circuits, in accordance with some example embodiments.
Figure 25A:
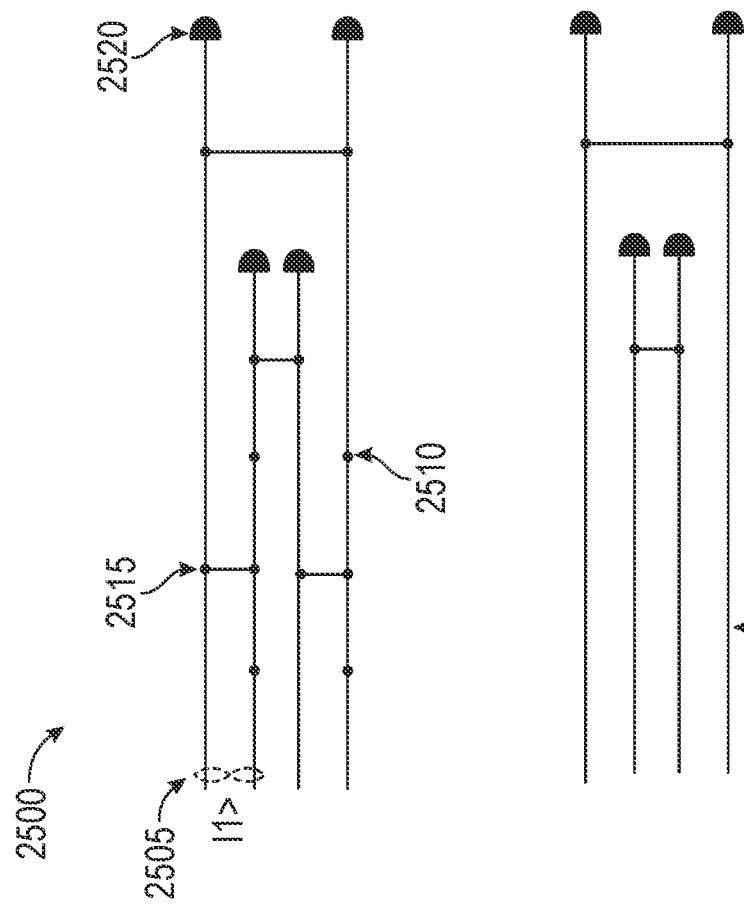

FIG. 7 shows an FMC 708, in accordance with some example embodiments. The FMC 708 includes input ports 770 comprising a first input port set 770A that can receive a first qubit and a second input port set 770B that can receive a second qubit. In some example embodiments, the input ports 770 receive the qubits in dual rail time bin encoding (e.g., four input ports are implemented to receive a single qubit on the first input port set 770A and likewise for a second qubit on the second input port set 770B). In the illustrated example, the FMC 708 includes two GMZIs 772A and 772B, a reverse encoding conversion circuit 774 (time bin to path conversion) and an interference circuit 776 that implement interferences for joint measurements where the interfered light (e.g., interfered (qubits) are output on the output ports 778. In some example embodiments, the interference circuit 776 comprises a passive interferometer to interfere light, where the couplers are optical components to couple light from different modes (e.g., directional couplers). In some example embodiments, control circuitry 777 (e.g., EIC, FPGA, electrical circuit) receives signaling indicating which phase shifter settings are applied in a given scenario or scheme (e.g., joint schemes; FIG. 25A; FIG. 25B; and/or single particle measurements) and path or time encoding conversion operations.

In some example embodiments, the reverse encoding conversion circuit 774 is implemented in part by the GMZIs 772A and 772B which perform switching to direct light to a given set of output ports (e.g., for a ZZ scheme, or XX scheme), where the the GMZIs 772A and 772B further perform switching to implement time to space encoding conversion with the delays 774B. An example time-to-space converter (TSC) circuit 733 is included as an example of time bin to spatial path encoding. At a high level, the TSC works in reverse of the STC circuit of FIG. 6. With reference to TSC circuit 733 in FIG. 7: on the left side, a dual rail qubit is in superposition on an upper arm spread across two different time bins. The TSC box comprises a phase shifter to switch the first qubit portion to the lower arm and delay the second qubit portion such that the qubit is output on the right side of the TSC box in spatial path encoding (two qubit portions in the same time bin, but on different arms). In some example embodiments, the FMC 708 operates at a clock rate that is the same or slower than the seed state clock rate (e.g., where both the FMC clock rate and the seed clock rate are system or network clock rates that are independent from the machine clock rate (e.g., quartz crystal based clock rate that operates classical controllers).

As an example, the clock rate of the FMC 708 can be 1 MHz, and the phase shifters and delays of the reverse encoding conversion circuit 774 are implemented such that the phase shifter can be activated during one half of the clock rate cycle and deactivated during the second half of the same clock cycle. In this way, qubits are input into the reverse encoding conversion circuit 774 on the same arm (in time bin encoding), but when detected (e.g., by the detectors in cryo) the qubits are in the path encoding format. In some example embodiments, the seed state system operates at a seed state clock rate, the FMC run at a projection clock rate, and the STC circuit 633 and TSC circuit 733 of the different systems are configured so they are matched to each other regardless of the seed and projection clock rates (e.g., the clock rate of the STC circuit 633 and TSC circuit 733 are coordinated such that they are reverse of one another, and the seed and projection system clock rates may vary while the STC circuit 633 and TSC circuit 733 remain matched to one another; have the same delay length, and switch periods).

In some example embodiments, the ZZ scheme outputs are directed to the top four output detector ports 778A and XX scheme outputs are directed to the bottom four output detector ports 778B, where the output ports 778 are coupled (e.g., via fibers) to detector chips in the cryogenic environment. In some example embodiments, the GMZIs 772A and 772B have pre-configured phase shifter settings (e.g., transfer matrices implemented by voltages applied to phase shifters) to select the input qubits for the ZZ or XX scheme, or single qubit measurements. For example, in a ZZ scheme, a first qubit that is input into input 770A is directed to the ZZ-A path set and a second qubit that is input into input 7701 are directed to the ZZ-B path set, where the two qubits are both directed to the top four output detector ports 778A. Whereas in a XX scheme, a first qubit that is input into input 770A is directed to the XX-A path set and a second qubit that is input into input 770B are directed to the XX-B path set, where the two qubits are both directed to the bottom four output detector ports 778B. Further, to implement single qubit measurements, one of the input qubits is directed to the top four output detector ports 778A (e.g., ZZ-A path set) and another input qubit is directed to the bottom four output detector ports 773B.

In some example embodiments, the FMC 708 can be implemented in fusion FNP circuits as well as in resource RSP circuits. In an RSP setting, the two qubits are input into the FMC 708 and are output by default to the top four output detector ports 778A (e.g., ZZ ports). In an FNP configuration, any one of the XX scheme, ZZ scheme, or single particle measurements can be implemented based upon control signals, and thus the full layout of the FMC 708 is implemented (e.g., based on inputs, choosing an XX or ZZ; or for lattice surgery, performing a single (qubit measurement and so on). Although FIG. 7 shows an example fusion measurement circuit, it is appreciated that other photonic circuits can be formed to implement the projective measurements (e.g., ZZ, XX, and single particle measurements). For instance, in some example embodiments a first FMC chip can be configured as a dedicated ZZ circuit chip and a second FMC chip can configured as a dedicated XX circuit chip, where the two chips can receive entangled states as discussed above, to implement projective measurements between two qubits or to perform single particle measurements, in accordance with some example embodiments.

FIGS. 8A-8D show example resource state system configurations, in accordance with some example embodiments. For example, FIG. 8A shows a resource state generation protocol for generating a type of resource state (e.g., 4 GHZ), and FIG. 8B shows an example configuration of cell components (e.g., modular cell components, such as SSG systems, RSP systems, and FNP systems) to implement generating the same type of resource state. Further, FIG. 8C shows a resource state generation protocol for another type of resource state (e.g., legged state), and FIG. 8D shows an example configuration of cell components and sequencing of resource state systems for generating the another type of resource state, in accordance with some example embodiments.

In FIG. 8A, a resource state generation protocol 800 can be implemented to generate a type of resource entangled state 820 (e.g., square shaped entanglement, a 4 GHZ), in accordance with some example embodiments. A first seed state 805 (e.g., qubits 1-2-3) and a second seed state 810 (e.g., qubits 4-5-6) correspond to seed states (e.g., 3-GHZs) that are generated by a seed state system (e.g., SSG system 1300, having a seed state circuit 1306; see also FIG. 6). In some example embodiments, a resource state 820 (e.g., a 4-GHZ) is created from the seed states by fusing one of the qubits from each seed states in fusing circuit (e.g., an FMC, FIG. 7) that is in a resource system (e.g., resource state projection system 1400, FIG. 14). For example, the "3" qubit of the first seed state 805 and the "4" qubit of the second seed state 810 can be fused together 815 (e.g., in a ZZ scheme), which leaves the remaining four qubits 1-2-5-6 entangled as the resource state 820. The resource state 820 can then undergo additional processing, such as fusions with other resource states, in accordance with some example embodiments.

FIG. 8B shows a modular unit cell configuration 821, in accordance with some example embodiments. The modular unit cell configuration 821 illustrates interconnections between SSG, RSP and FNP systems within a single modular cell. The modular unit cell configuration 821 can implement the resource generation scheme illustrated in FIG. 8A. As illustrated, there are two sets of physical SSG systems. A first set can include SSG1A and SSG1B, where SSG1A comprises 32 seed state systems (e.g., 32 instances of seed state generator (SSG) system 1300 in FIG. 13), and SSG2A comprises another 32 seed state systems. Further, a second set can include SSG2A and SSG2B, each having 32 instances of a seed state system. In some example embodiments, each seed state system outputs a seed state, such as a 3-GHZ on three channels (e.g., fibers). In some example embodiments, the second set of SSGs (SSG2A and SSG2B) can be repetitive fall back systems of the first set of SSGs (SSG1A and SSG2B) and can be switched to in run time upon as needed for on-demand seed states using switches in the FNPs (e.g., based on whether SSG1A or SSG2A are successful). For example, the second row of switches (multiplexer circuits 1512 and 1514) can select between SSG1A or SSG2A as the RS1 input, as discussed in further detail below.

In some example embodiments, each SSG system generates a 3-GHZ and one qubit from each 3-GHZ is directed to an RSP, and the other two qubits from each 3-GI-Z is directed to an FNP. Thus, in the illustrated embodiment and with reference to SSG1, there are 32 SSGs (as an example quantity), where each produces 3-GHZs (one 3-GHZ per three physical optical channels), and therefore there are 32 optical channels (e.g., 32 fibers) connecting the SSG1 chips to an RSP, such as RSP1, and there are two sets of 32 channels (e.g., 96 fibers) connecting the same SSG1 chips to an FNP, such as FNP1.

In FIG. 8B, the solid lines/arrows correspond to optical channels and dashed lines/arrows correspond to data channels (e.g., detection data). At a high level, SSG1A (32 instances of a seed state system, such as the seed state generator system 1300, FIG. 13) generates a first set of 3-GHZ seed states and SSG2A (32 other instances of seed state circuit 306 in FIG. 3B) generates a second set of 3-GHZ seed states, where SSG1A outputs to RSP1 and FNP1, and where SSG2A outputs to RSP1 and FNP2.

The RSP1 then interferes its qubits and performs detections and generates electrical data that is output to the Fusion Network Controller (FNC) (e.g., controller 112). The FNC then instructs the FNP1 which sets of input ports have a resource state. Then, the FNP1 interferes its inputs and performs detections to fuse together its qubits (e.g., East and West qubits, as discussed in further detail below). Similarly, FNP2 interferes its inputs and performs qubits to fuse together its qubits (e.g., North and South qubits).

FIG. 8C shows a different resource state generation protocol 850 that generates a different type of resource entangled state 864 (e.g., a legged-square shaped entanglement), in accordance with some example embodiments. In the example of FIG. 8C, six different seed states—seed states 852 to 862—are generated by one or more seed state circuits. Pairs of qubits from the different seed states can be fused (e.g., projective measurement, ZZ based interference and detection) by fusion circuits, including F1A, F1B, F2A, F2B, and F3 (e.g., instances of an FMC assembly 440 in different resource state systems, such as resource state projection system 1400, FIG. 14).

In some example embodiments, the seed states are generated by a plurality of seed state circuits, and the fusion circuits F1A, F1B, F2A, F2B, and F3 implement projective fusions in parallel to form the resource state 864. In some example embodiments, pairs of the fusion operations are implemented in sequence. For example, fusion circuit F1A and F1B can be performed and when successful completed, can transmit success messages to fusion circuits F2A and F2B, where multiplexer circuits route lines (e.g., qubit lines) from the resource state 854 and resource state 856 to fusion circuit F2A and further route resource state 860 and resource state 858 to fusion circuit F2B. In some example embodiments, upon fusion circuits F2A and F2B being performed, the multiplexer circuits further route qubits from resource state 854 and resource state 860 to fusion circuit F3, thereby forming resource entangled state 864.

FIG. 8D shows an example modular cell configuration 888, in accordance with some example embodiments. The example of FIG. 8D shows an example in which the fusion sites of FIG. 8C transfer data to each other and operate in a sequence. In FIG. 8D dashed lines correspond to data interconnections (e.g., non-quantum connections to transfer binary binary data) and the solid lines are optical channels that can contain light (e.g., entangled light, light from failed entanglements operations such as photons and/or bright light). As illustrated, SSG1 comprises a plurality of SSG systems (e.g., instances of FIG. 13) having three outputs: one to RSP1, one to RSP2 and one to RSP5. Similarly, SSG2 has three outputs: one to RSP3, one to RSP4, and one to RSP5.

In some example embodiments, the RSPs of FIG. 8D correspond to the fusion gates in FIG. 8C. For example, RSP1 corresponds to F1A, RSP2 corresponds to F1B, RSP3 corresponds to F2A, RSP4 corresponds to F2B, and RSP5 corresponds to F3. As discussed, in some embodiments, the fusions of the seed states 852-862 can be performed in sequence or in parallel. As an example of sequencing, in a first stage, RSP1 (F1A) and RSP2 (F1B) succeed in fusing their respective seed states, and in the same first stage, RSP3 (F2A) and RSP4 (F2B) succeed in fusing their respective seed states. Upon the first stage being successful F1A/F1B and F2A/F2B signal to F3 to perform fusions in a second stage. For example, with reference to FIG. 8D, in the second stage, RSP5 receives one qubit from SSG1 and another qubit from SSG2 (where the qubits were delayed in fibers until the second stage begins). Further, the RSP5 then fuses the two qubits together, and upon success, signals to the FNC that a resource state is on the respective fibers connecting SSGs 1-6 to FNPs 1-4. The FNPs 1-4 can then be configured to perform fusions according to fusion instructions received from the FNC (e.g., controller 112). In some example embodiments, to fuse resource states from otter cells, upon a resource state being successfully generated, either one or more of the SSGs 3-6 can route one of the qubits of the resource state to another cell; or alternatively, one or more of FNPs 1-5 route qubits of the resource state to their cells for fusion measurements.

Figure 9B:
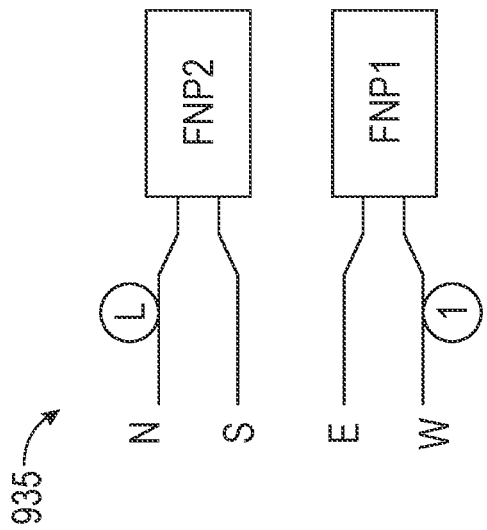
FIGS. 9A-9D show interleaving schemes and fusion networks, in accordance with some example embodiments.
Figure 9A:
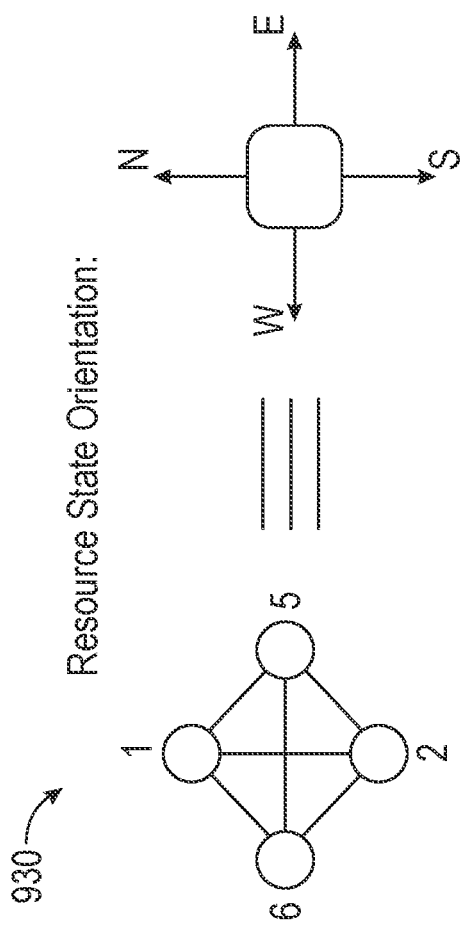

FIG. 9A-9D shows example interleaving schemes to implement resource states in a fusion network, in accordance with some example embodiments. FIG. 9A shows a mapping 930 of the resource state: the four resource state qubits 1-2-5-6 are mapped to North, South, East, and West, for ease of reference in discussing the fusion network. In some example embodiments, a fusion network is a graph comprising operations to be performed via fusion measurements (e.g., in FMCs). In some embodiments, in a given fusion network, each vertex corresponds to a resource state, each edge corresponds to a two-qubit projective measurement (e.g., fusion measurement), and each half-edge connected to a single vertex corresponds to a single-qubit measurement.

FIG. 9B shows an interleaving configuration 935 for FNPs, in accordance with some example embodiments. Each of the FNPs can be implemented as a FMC circuit where the delays are fiber or waveguide delays of a given length that are coupled into the inputs of a particular FNP. With reference to FNP1, for a given resource state, the East and West qubits are input into FNP1 to undergo fusion, where there is a 1 resource cycle delay ("1") on the West channel. With reference to FNP2, the North and South qubits undergo fusion, where there is a delay of length L on the North channel. In some example embodiments, the value of L corresponds to width of a row of the fusion network, such as the fusion network 940 shown in FIG. 9C.

Figure 9D:
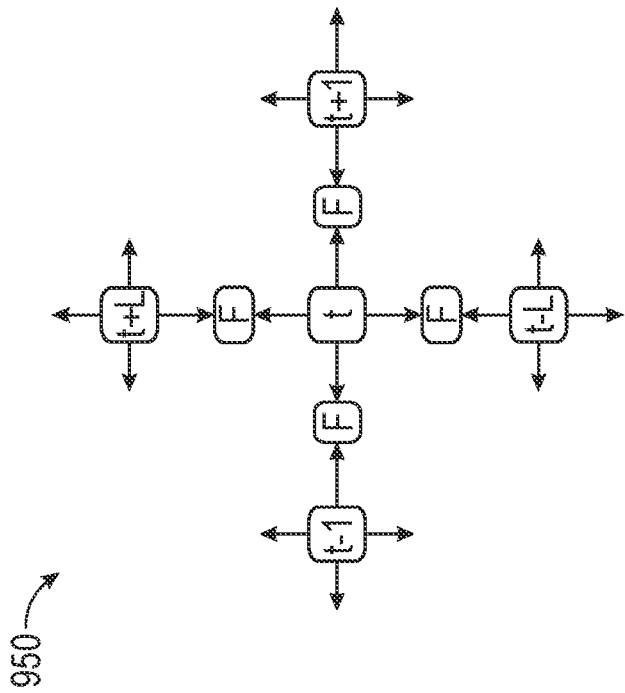
Figure 9C:
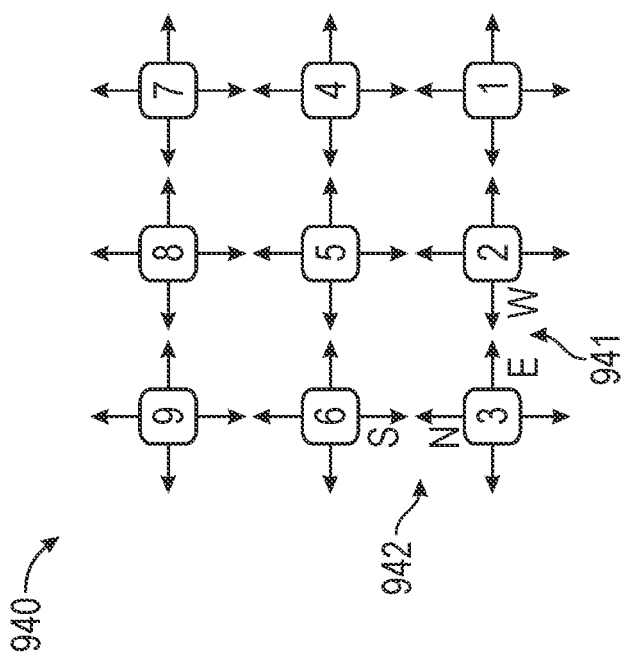

FIG. 9C shows an example fusion network 940 (a 3×3 network, planar or two-dimensional network) comprising nine resource states, labeled 1-9, where each of the nine resource states has four qubits: North, South, East and West (only some are labeled in FIG. 9B to reduce drawing clutter). In some example embodiments, the fusion network 940 is formed from generating one resource state per cycle (e.g., 1, 2, 3, from right to left in FIG. 9C), where which qubits are fused from the resource states is assigned by position of the respective resource states in the fusion network.

For example, in FIG. 9C resource state 2 is generated before resource state 3, and the West qubit of resource state 2 is coupled to fusion site 941 (e.g., info FNP1), where it undergoes a delay of 1 until the next resource state is generated.

In the next cycle, resource state 3 is generated and its East qubit is input in the fusion site 941 (e.g., into FNP1 in FIG. 9B) and the East qubit undergoes no delay such that the East and West qubits from resource states 1 and 2 get fused at in the same event (e.g., exactly the same time, within a few nanoseconds of each other, coincident on detectors within the same resource state cycle and so on).

As further shown, resource state 3 includes a North qubit which is input into fusion site 942 (e.g., input into FNP2 in FIG. 9B) which undergoes a delay of length L, which delays the North qubit long enough for resource state 6 to be generated (the resource state "above" resource state 3 as depicted in FIG. 9C).

Upon resource state 6 being generated its South qubit is input into fusion site 942 for measurement (e.g., detection) with the North qubit of resource state 3, which being delayed in the L delay. In some example embodiments, the length of the delays "1" and "L" can be adjusted. For example, based on the photonic circuits and network design, the resource state clock rate (e.g., 1 to 2 MHz) can be lowered or increased to better align with the rate of resource state generation; in those cases, the length of "1" applied to the West qubit can be adjusted (e.g., longer or shorter fiber lengths, or implementing smaller integrated waveguide based delays) to ensure that the "1" delay corresponds to a delay of 1 resource state cycle. In some example embodiments, the length of L can similarly be adjusted to be congruent with the network design and characteristic performance parameters (e.g., clock rate, errors, loss, and so on).

In some example embodiments, the length of L is a multiple of the length of "1". For instance, in in FIG. 9C the fusion network 940 is a 3×3 network, and as such the length of L is three times longer than "1". In some example embodiments, to generate (e.g., interleave, weave, tessellate) together longer fusion networks, the length of L can be increased. For instance, if the fusion network is to have rows 36 resource states in a row (in the same plane), then the length of L can be set to a length of fiber 36 times the length of "1" (e.g., thereby fusing resource state 3's North qubit, with resource state 37's South qubit). In some example embodiments, each fusion site of the fusion network 940 generates readout data which is decoded to generate outcome data (e.g., decoded using off the shelf decoders, such as Minimum Weight Perfect Matching (MWPM), Union Find, or custom decoders built per network).

FIG. 9D shows an example interleaving protocol 950 for details of the resource states and the delays. In FIG. 9D, the middle resource state is labeled "t" (e.g., a current cycle). As shown in FIG. 9D, the middle resource state t fuses with South resource states at t-L (with L being a multiple of 1 resource state cycle length "1"). Furthermore, "t" fuses with a next resource state using t-1, fuses with a previous resource state using t+1, and fuses with a North resource state using t+L.

Figure 10A:
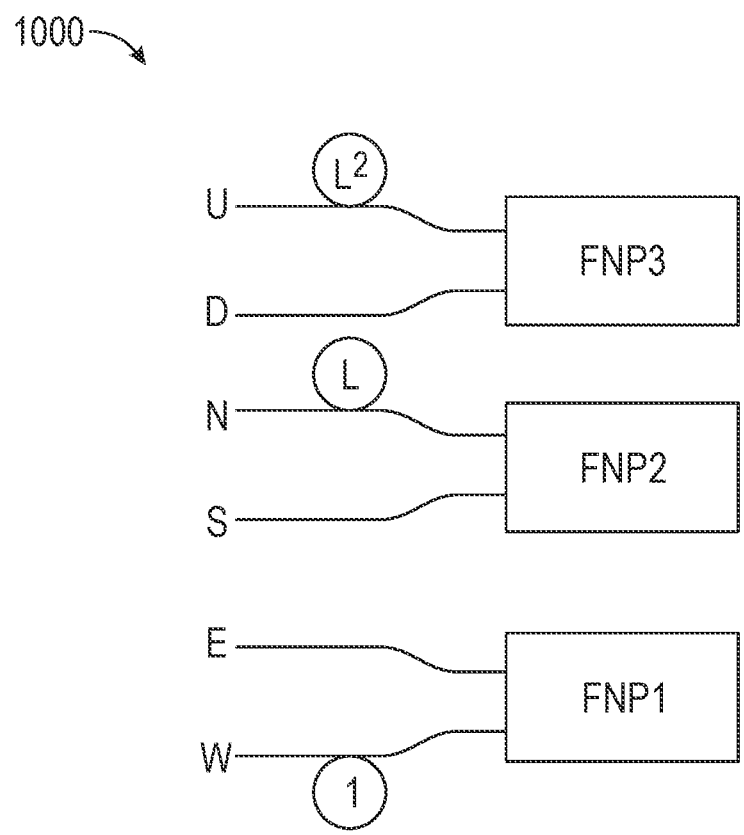
FIGS. 10A and 10B show interleaving and fusion networks, in accordance with some example embodiments.
Figure 10B:
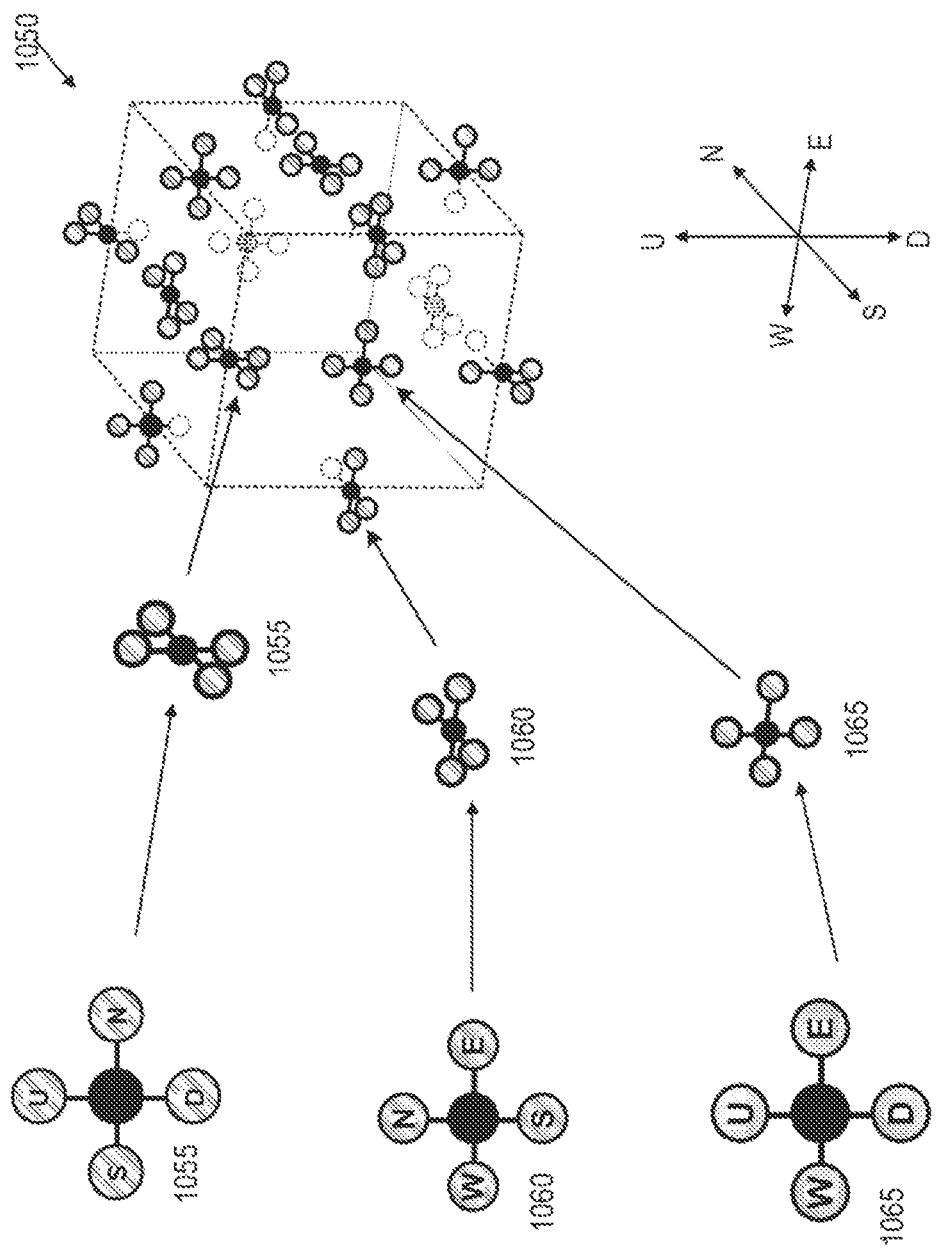

FIGS. 10A and 10B show example interleaving and fusion networks using additional delays, in accordance with some example embodiments. In the example of FIG. 10A, the three FNPs 1000 can be implemented as three FMC chips having different delays at their inputs. Similar to FIG. 9A, in which an FNP1 has a delay of "1" and can receive qubits assigned as East and West, and there FNP2 has a delay of length "L" and can receive qubits signed North and South, in FIG. 10A and additional FNP3 can be implemented having a input delay of L^2, and input qubits comprising Up ("U") and Down ("D").

In some example embodiments, three or more FNPs with different delays can be implemented to perform fusions of resource states in a three dimensional code structure, such as fusion network 1050 shown in FIG. 10B. As illustrated in FIG. 10B, the fusion network 1050 is three dimensional and comprises dimensions that are labeled as East, West, North, South, and Up and Down. The East/West and North/South dimensions correspond to horizontal plane (XY) or slice into the fusion network 1050 (from the view of FIG. 10B), where the lip and Down axis is orthogonal to the East/West and North/South dimensions. At a high level, the East/West and North/South dimensions can create fusion layers as in the example of FIGS. 9A and 9B, and the Up/Down dimension can create fusions in the vertical direction.

In some example embodiments, qubits of the resource states have their assigned "directions" alternated to form the three dimensional fusion network 1050. For example, in a given horizontal level, the fusions are performed using East to West fusions (using a 1 delay) and North to South fusions (using L delay), where some alternating resource states in that level do not fuse with the level above in the higher up "Up" direction.

For example, resource state 1065 can be generated before resource state 1060, and resource state 1065 can have its West qubit undergo a delay of 1 to wait for resource state 1060 to be generated, whereby the East qubit of resource state 1060 can then be fused with the waiting West qubit of resource state 1065. Further, once a horizontal layer of fusions are performed, the next level of fusions can be accessed using the L^2 delay of FNP3. For example, the resource state 1065 has an Up qubit and can be input into a delay of length L^2 which delays it long enough such that resource state 1055 can be generated, whereby the down qubit of 1055 is fused immediately with the Up qubit of resource state 1065 as it comes out of the delay of L^2 (e.g., qubits of a remaining state that couple with qubits in a next "layer" of resource states generated).

Although four qubit resource states for a three dimensional fusion graph are discussed as an example, it is appreciated that some resource states having higher numbers, such as a six state resource state (e.g., each having N, S, E, W, U, D qubits) can be implemented using the three FNPs having 1, L, and L^2 delays, where no alternation of resource state orientation is implemented. That is, each six state has qubits in each six directions and can fuse directly with other six states, where all the resource states are lined up and have the same qubit assignments. Further details of interleaving are described in U.S. application Ser. No. 18/274,957, filed on Jan. 31, 2022, which is hereby incorporated by reference in its entirety.

Figure 11:
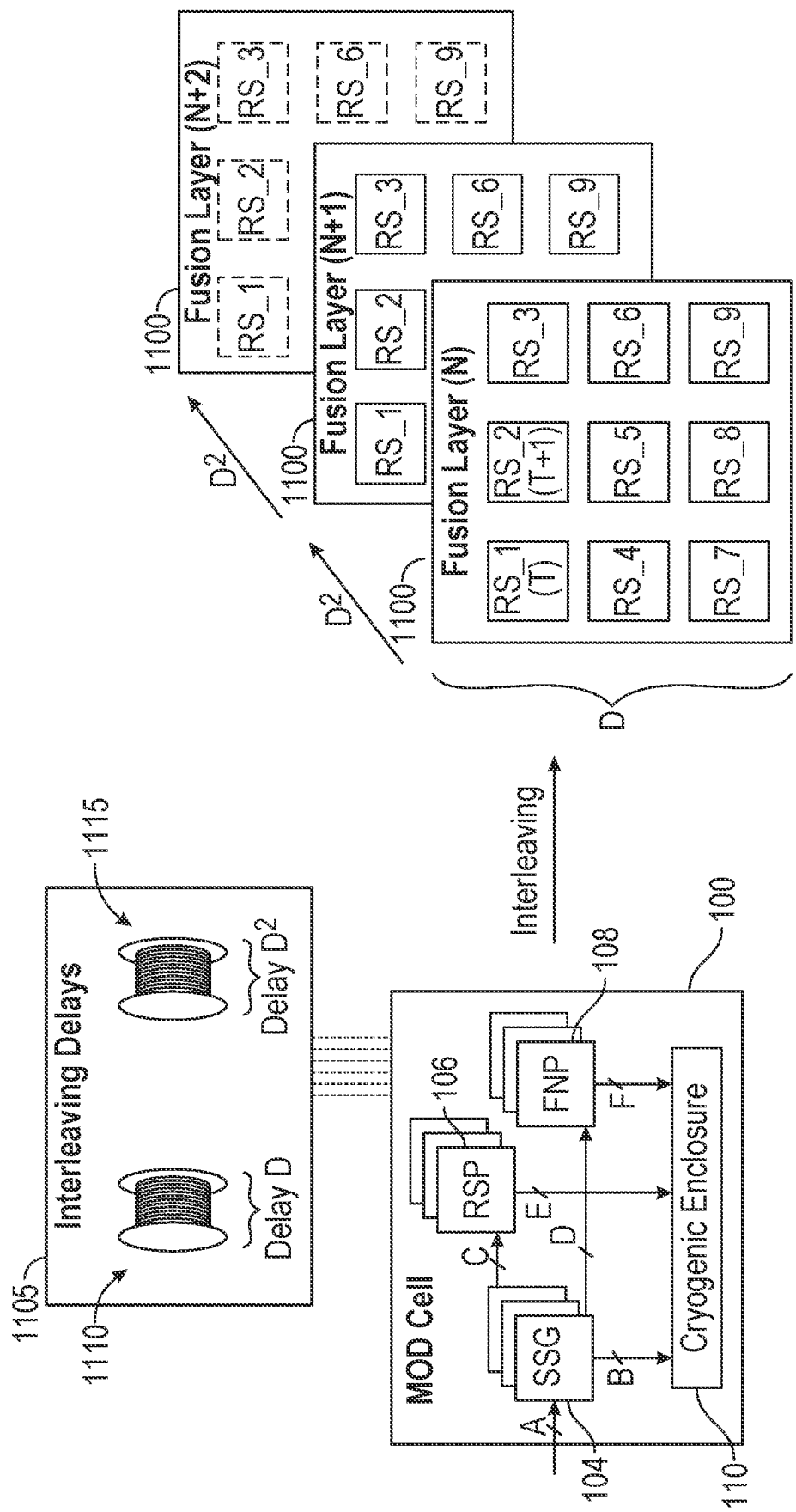
FIG. 11 shows interleaving delays and layers, in accordance with some example embodiments.

FIG. 11 shows interleaving layers, in accordance with some example embodiments. In FIG. 11, a modular cell 100 can be coupled to interleaving delays 1105 (e.g., waveguides, fibers, spools of fiber, free-space) having different lengths, such as D and D^2, where D can be a multiple of a resource state cycle. In some example embodiments, the interleaving delays are integrated in the FNP units of the FNP system 108 (e.g., between switches and fusion circuits) to switch qubits to delays of different lengths to implement interleaving. In the illustrated example, the interleaving delays 1105 include a first interleaving delay 1110 having a length of D (e.g., 5 meters of fiber), where the length, D, corresponds to the number and arrangement of resource stages to be in a fusion layer 1100 (e.g., a logical layer of a fusion network based processes).

In some embodiments, the number and/or arrangement of the resource states to be included in a fusion layer is dependent on the code distance of d (e.g., fault tolerance of the code). As further illustrated in FIG. 11, the interleaving delays 1105 can comprise a second interleaving delay 1115 (e.g., one or more spools of fiber) having a maximum length of D^2 (e.g., 25 meters of fiber) for layer to layer fusing (e.g., vertically, or up and down with respect to a Z axis, or temporal axis). For example, qubits of resource states of a fusion layer 1100 at event layer time N and qubits of the same fusion layer 1100 but at the next event layer time N+1 can be fused using FNPs (e.g., having a L^2 delay; FNP3, FIG. 10A), thereby fusing remaining qubits of a remaining state from fusion layer 1100 at N to other qubits of fusion layer 1100 at N+1.

In some example embodiments, each resource site within the fusion layer 1100 corresponds to a fusion site (e.g., FMC chip, fusion site 941, fusion site 942). In some example embodiments, the fusion layer has a width in the same plane of D, where there are multiple adjacent fusion layers in a single slice of a fusion network graph as discussed in further detail below. In some example embodiments, fusions between neighboring fusion layer sites is performed between resource states generated by different modular cells. In some example embodiments, qubits of resource states can be routed between cells to perform the fusions using qubit interconnect lines (e.g., fiber optical cables), as discussed above with reference to FIGS. 2, 3A and 3B.

Figure 12A:
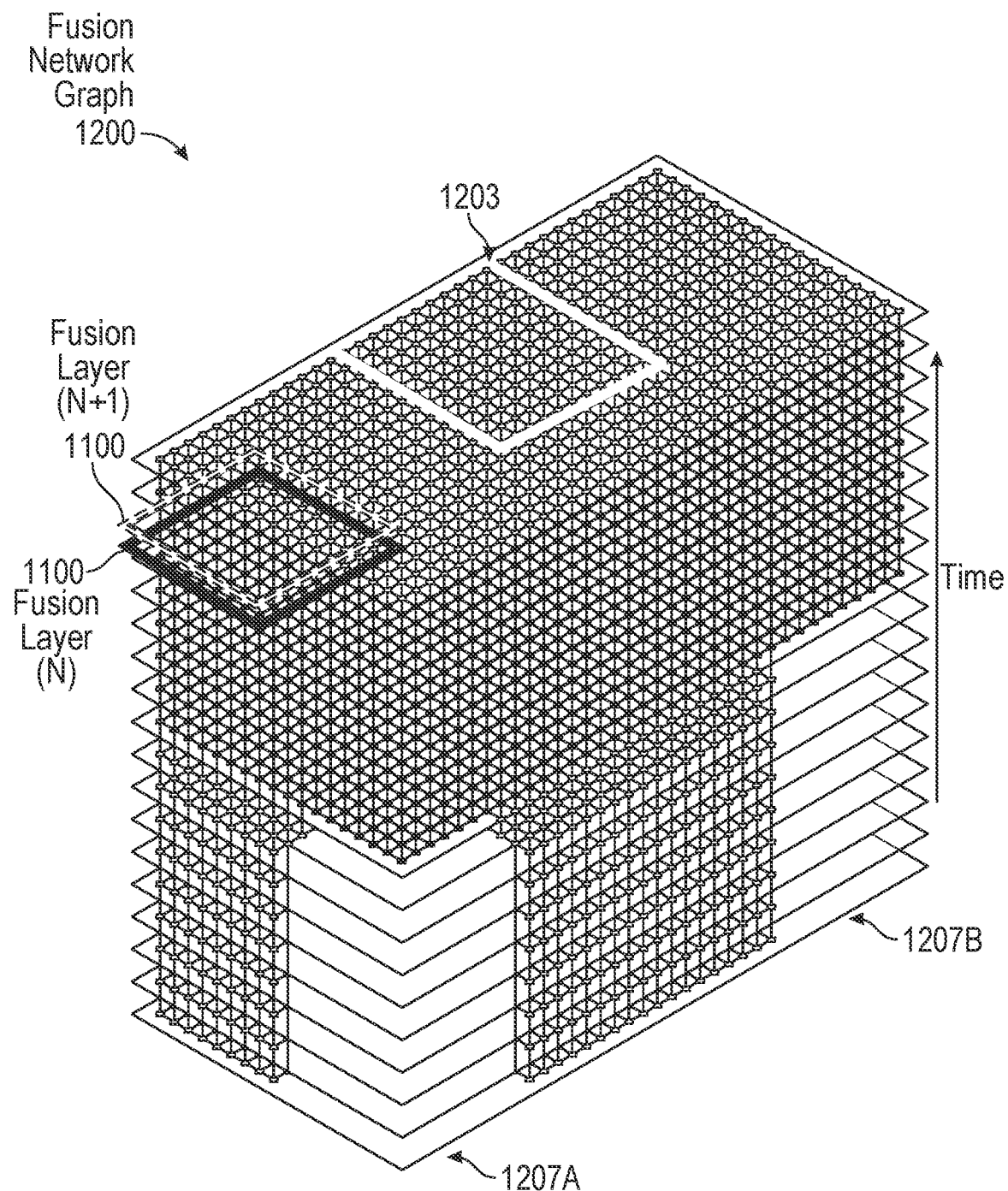
FIGS. 12A-12D show a quantum application and a fusion network graph, in accordance with some example embodiments.
Figure 12B:
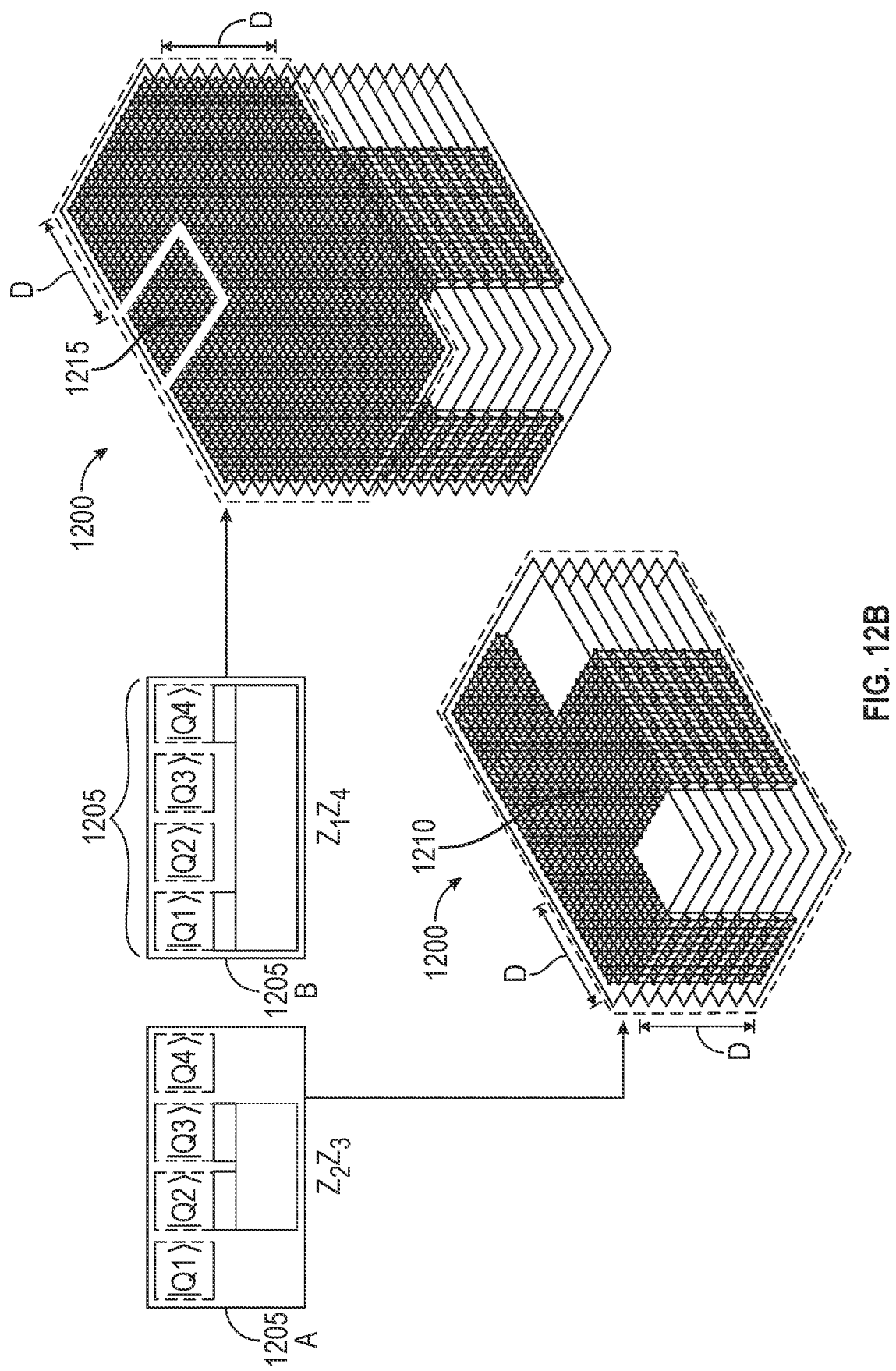

FIGS. 12A and 12B show logical blocks for algorithmic processing using fusions, in accordance with some example embodiments. In FIG. 12A, a fusion network graph 1200 (e.g., qubit lattice) corresponds to fusion operations or gates to be performed by the cells of a modular array, in accordance with some example embodiments. In the fusion network graph 1200, each vertex (point) is connected by edges (lines), where each vertex in the fusion network graph 1200 corresponds to a resource state that are connected by edges where fusions are formed by FNPs (e.g., fusion site 941, fusion site 942, two-qubit measurements). The fusion network graph 1200 can further include one or more half-edges 1203, which corresponds to a single qubit measurements. Further, the fusion network graph 1200 can include empty regions 1207A and 1207B which correspond to inactive fusion portions (e.g., inactive qubit patches $|q_1\rangle$ and $|q_4\rangle$ in second logical operation 1205B, in FIG. 12B).

The fusion network graph 1200 (e.g., logical network block, ZX diagram, quantum circuit) can include a plurality of fusion slices that are sequenced in time (e.g., time extending upward (in the view of FIG. 12A). For example, a bottom slice of fusion network graph 1200 is first processed, followed by processing the next slice up in the next block slice time. In some example embodiments, each fusion slice is composed of a plurality of fusion layers (e.g., fusion layer 1100). For example, as shown in FIG. 12A, the fusion layer 1100 (at event time N) is first processed by a plurality of FNPs, followed by processing the same fusion layer 1100 in a latter slice (at event time N+1). In some example embodiments, algorithms or lists of tasks to be performed can be implemented as a fusion network graph, as further discussed below.

FIG. 12B shows an example quantum application 1205 implemented as the fusion network graph 1200, in accordance with some example embodiments. The example quantum application 1205 comprises four logical qubits (e.g., patches), including $|q_1\rangle$, $|q_2\rangle$, $|q_3\rangle$, and $|q_4\rangle$. In the quantum application 1205, the first logical operation 1205A comprises measurements of $Z_2$ times $Z_3$, followed by the second logical operation 1205B that comprises the measurements $Z_1$ times $Z_4$.

As shown in FIG. 12B, the first logical operation 1205A corresponds to a first portion 1210 (sub-block) of the fusion network graph 1200 which arranges fusion operations in a set of vertical slices to be performed sequentially according to the graph layout.

After the first logical operation 1205A is implemented by the first portion 1210 of the fusion network graph (e.g., by FNPs receiving qubits of resource states), a new portion 1215 (sub-block) is formed by generation of layers of resource states until a collection of slices forms the new portion 1215. The new portion 1215 is implemented to perform the processing of the second logical operation 1205B. Further details of logical block networks are described in U.S. application Ser. No. 17/974,513, filed on Oct. 26, 2022, titled "Resource Efficient Logical Quantum Gates," which is hereby incorporated by reference in its entirety.

Figure 12C:
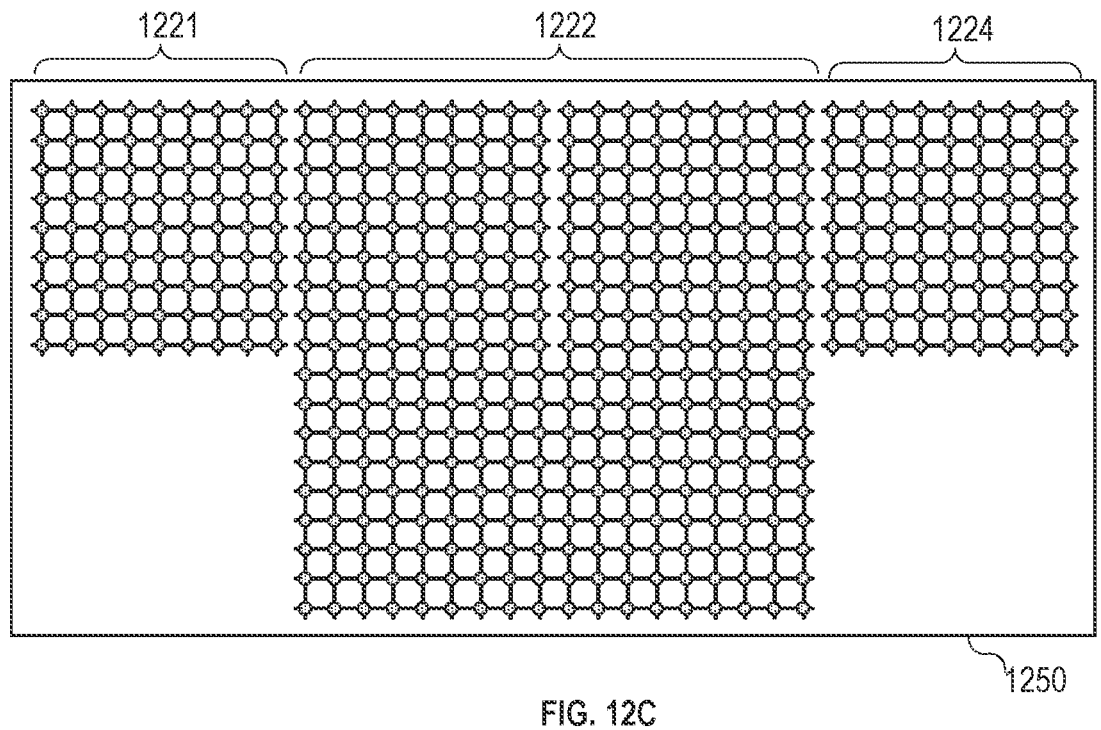

FIG. 12C shows an example layer 1250 (e.g., slice) that corresponds to first portion 1210 (e.g., $Z$: times $Z$; measurement), in accordance with some example embodiments. The example layer 1250 has an example code distance of 9 (D=9) though it is appreciated that the distance is a configurable parameter that can be adjusted (e.g., code distance based on particular hardware implementations, such as expected photon losses and success rate of measurements, and the like). In the illustrated example, the lattice section 1221 represents logical qubit $|q_1\rangle$ "at rest" (e.g., not interacting with any other qubit), and lattice section 1224 represents logical qubit $|q_4\rangle$ at rest. U-shaped lattice section 1222 represents the $Z_2$ times $Z_3$ measurement on logical qubits $|q_2\rangle$ and $|q_3\rangle$.

Figure 12D:
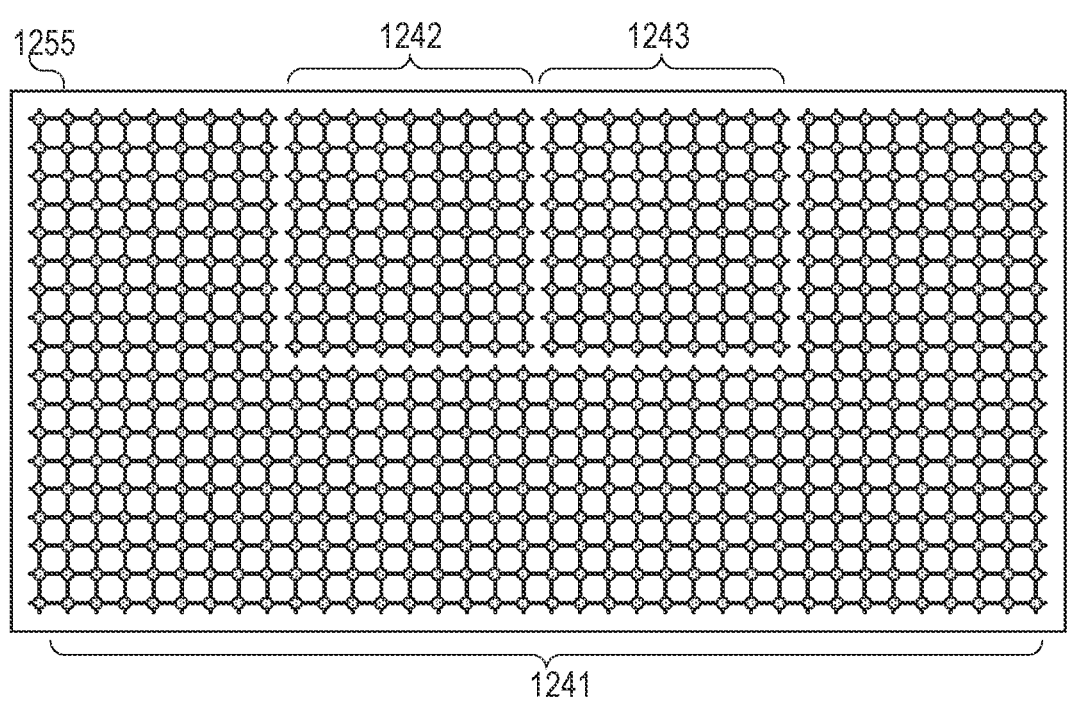

FIG. 12D shows an example layer 1255 that corresponds to new portion 1215 (e.g., $Z_1$ times $Z_4$ measurement), in accordance with some example embodiments. In the example of FIG. 12D, lattice sections 1242 and 1243 represent logical qubits $|q_2\rangle$ and $|q_3\rangle$ at rest, and U-shaped lattice section 1341 represents the $Z_1$ times $Z_4$ measurement on logical qubits $q_1\rangle$ and $|q_4\rangle$. The fusion network graph is an example of list of tasks that can be processed, and it is appreciated that additional measurements and qubits can be included in the tasks in a similar manner.

Further, although a fusion network graph is discussed as an example, it is appreciated that other space-time protocols for logical qubits can be implemented in place of the fusion network graph, such as quantum circuits, quantum instrument networks, ZX diagrams, and the like. Further details of blocks for fusion graphs are described in U.S. application Ser. No. 17/974,513, filed on Oct. 26, 2022, titled "Resource Efficient Logical Quantum Gates," which is hereby incorporated by reference in its entirety.

Figure 13:
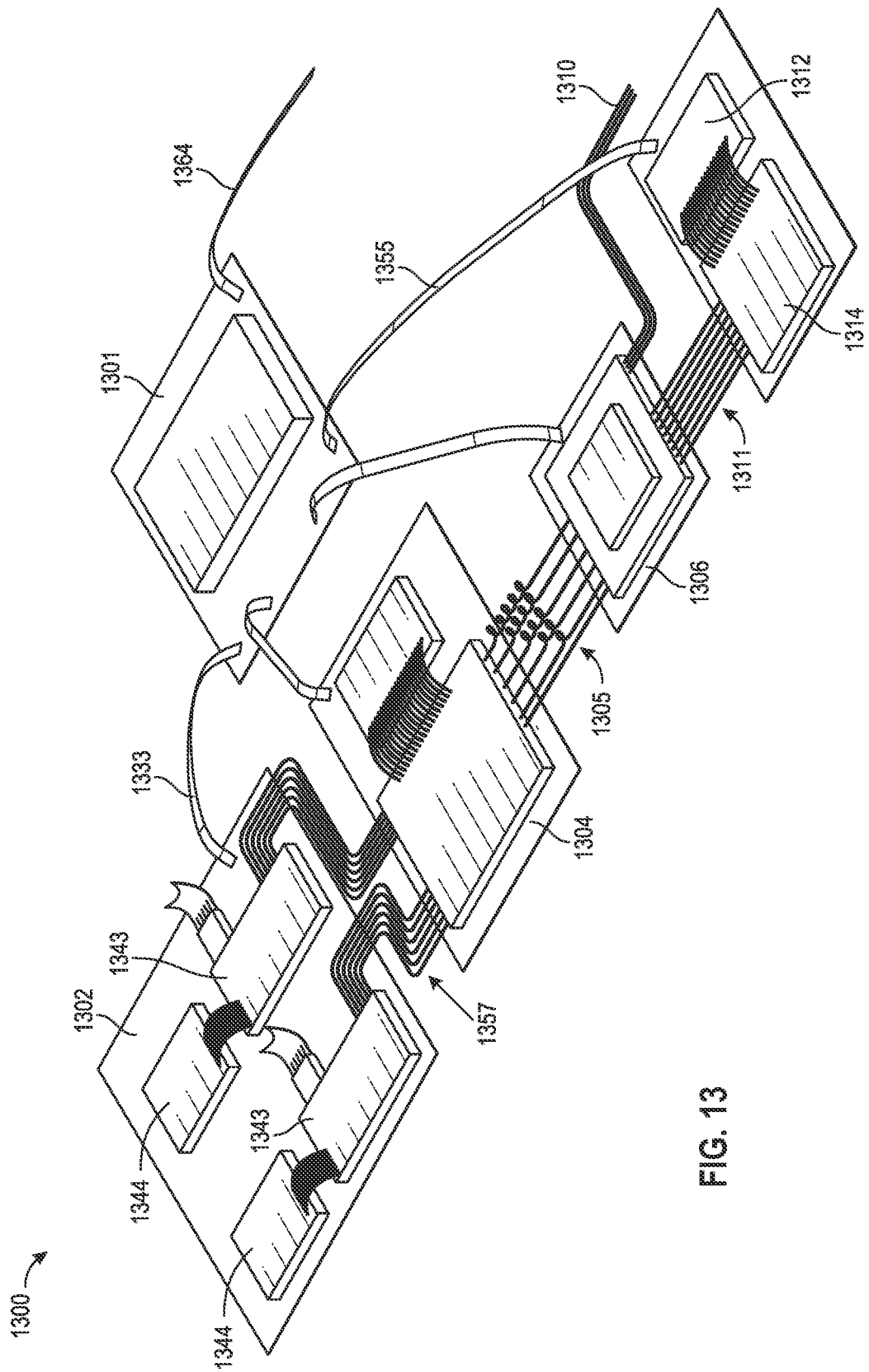
FIG. 13 shows a seed state system, in accordance with some example embodiments.

FIG. 13 shows an example seed state generator (SSG) system 1300, in accordance with some example embodiments. In some example embodiments, the seed state generator system 1300 corresponds to one of the SSG units in the SSG set 104 in FIG. 1A. For example, the SSG set 104 can include a plurality of SSG systems, such as the seed state generator system 1300 (e.g., if SSG set 104 comprises three SSG units, then three instances of seed state generator system 1300 are in the SSG set 104).

In the illustrated example of FIG. 13, a source circuit 1302 comprises photon source circuits 1343 that are controlled by controllers 1344 to generate photons that are coupled onto interconnects 1357 (e.g., fibers). Upon a given photon being generated, control signals (detection readouts) are sent as herald signals that are transmitted via herald signal lines 1333 (e.g., electrical data, classical data) to the seed state system controller 1301. In some example embodiments, the components in FIG. 13 that are in the cryogenic enclosure include the photon source circuits 1343 (e.g., each having an on-board single photon detector) and detector circuit 1314 (to detect single photons of entangled states).

The seed state system controller 1301 controls the multiplexer circuit 1304 (e.g., switches) to sequence the photons into a multiplexed arrangement that are output as multiplexed photons that are delayed by different lengths of fibers 1305 such that the multiplexed photons arrive at the seed state circuit 1306 at the same time for interference and seed state generation, where the outputs are coupled via fibers 1311 (e.g., connector optical interconnects) to detector circuit 1314 in a cryogenic enclosure. As shown in FIG. 13, the fibers 1305 can be delayed by delays of longer lengths, as switched to in sequential order by the multiplexer circuit 1304. For example, the first photon is switched by multiplexer circuit 1304 to the fiber having 5 delay loops, and a second next-up photon is switched to, by multiplexer circuit 1304, to the fiber having 4 delay loops, and so on; such that all photons are in step and are input into the seed state circuit 1306 at the same time (or within the same time period, such as 1 seed state cycle).

In some example embodiments, which seed state fibers correspond to successful fibers is not indicated until the detections are performed by the detector circuit 1314, which has a controller 1312 to read current from photon detectors and send detection data 1355 to the seed state system controller 1301 for identifying successfully generated seed states (e.g., pattern matching to identify successfully generated seed states). Upon identifying the fibers having qubits of seed state entanglements (e.g., target entangled state, such as Bell Pair or GHZ), the fibers are designated as qubit lines 1310. For example, the qubit lines 1310 correspond to the fibers connecting SS1 and SS2 (the successful seed state units) to the resource state projection system 1400 and fusion network projection system 1500.

In some embodiments, the seed state system controller 1301 receives the qubit line information (e.g., which fibers have qubits of seed states) informs the resource state units and the fusion state assemblies (to which (qubit lines 1310 are connected) using the control line 1364. For example, the seed state system controller 1301 sends the seed state data to the resource state units and fusion state units so they may switch their input ports to the fibers of the successful seed state units and ignore the fibers that have no seed states on them. In some example embodiments, the generated seed state is converted from spatial encoding to time bin encoding for transfer to other components. For example, the qubit lines 1310 can correspond to three fibers (as depicted) having a 3-GHZ in time bin encoding format, or each of the qubit lines 1310 can correspond to two fibers if the 3-GHZ is transferred out in spatial encoding format.

Figure 14:
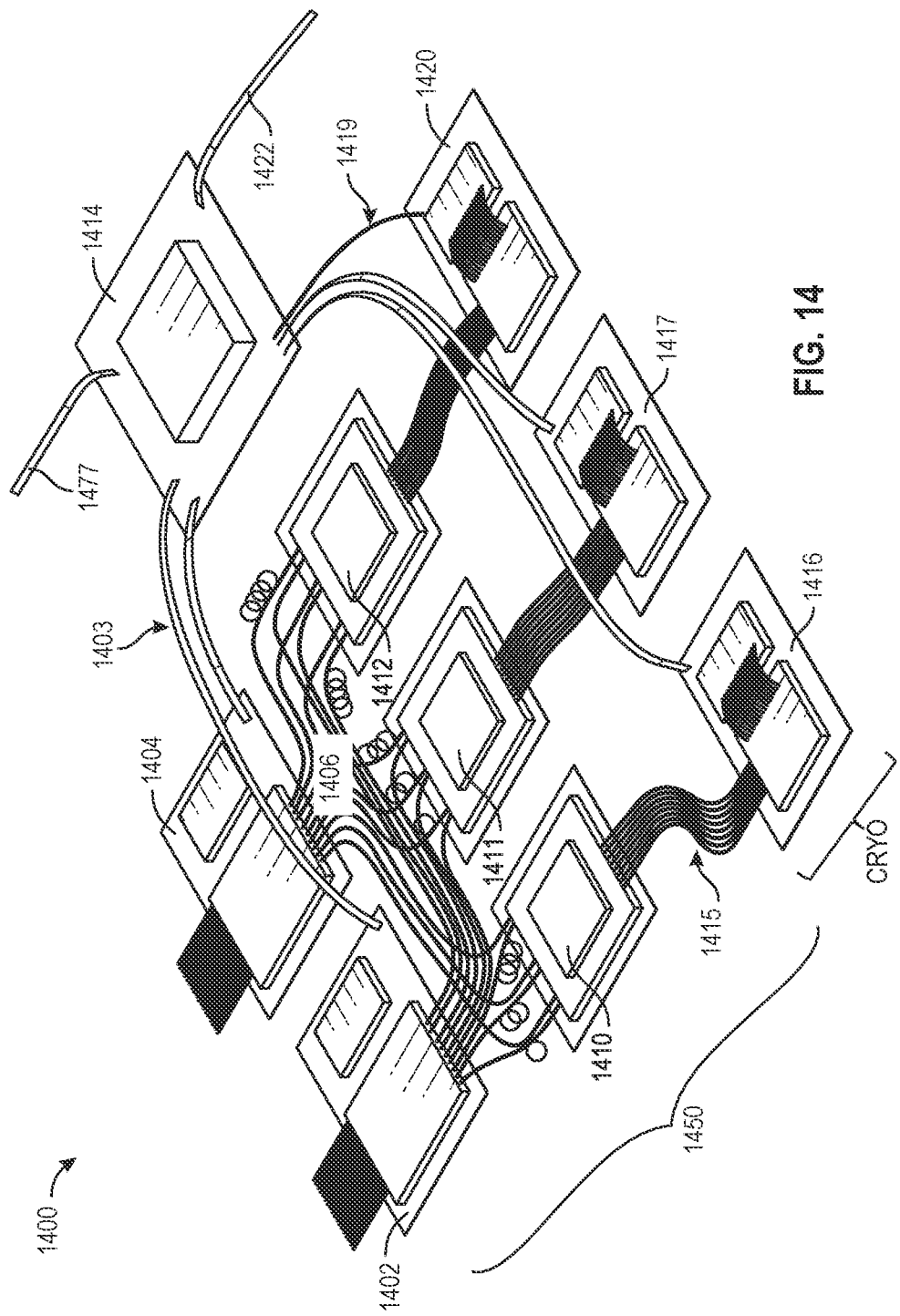
FIG. 14 shows a resource state projection system, in accordance with some example embodiments.

FIG. 14 shows a resource state projection system 1400, in accordance with some example embodiments. The resource state projection system 1400 can correspond to one RSP unit of the RSP set 106 (FIG. 1A). For example, FIG. 8A illustrates two RSP units (RSP1 and RSP2), each corresponding to an instance of the resource state projection system 1400 depicted in FIG. 14, in accordance with some example embodiments. As a further example, FIG. 8D illustrates five RSP units (RSP1-RSP5), each corresponding to an instance of the resource state projection system 1400, in accordance with some example embodiments.

In the illustrated example, the resource state projection system 1400 implements fusion projection measurements to generate resource states. In some example embodiments, a resource state projection circuit 1450 comprises networked circuit components that include interference circuits 1410, 1411, and 1412 (e.g., FMCs) that are at room temperature, and corresponding detector circuits 1416, 1417, and 1420 that are at cryogenic temperatures. The resource state projection circuit can implement fusion projections (e.g., via measurements) to form resource states to be fused together.

The resource state system controller 1414 receives the seed state data via data lines 1477 (where the seed state data indicates which seed state units were successful) and transmits multiplexer instructions 1403 to the multiplexer circuits 1402 and 1404 (e.g., switches). In some example embodiments, the multiplexer circuits 1402 and 1404 are implemented as GMZIs that can apply transfer matrices to: (1) couple to the correct fiber lines that are connected to successful SSG units to receive the seed state entanglements and (2) arrange the coupled-in seed state qubits into a delay array 1406 (e.g., rastering delays) such that the seed states can be rastered into the interference circuits 1410, 1411, and 1412 for generation of resource states.

In some example embodiments, the resource state system controller 1414 further transmits resource state matrix transfer data to the interference circuits 1410, 1411, and 1412 (FMCs) so that the interference assemblies (e.g., chips) can adjust phase shifter settings (e.g., phase shifter settings of GMZI sub-circuits in an FMC) to perform interferences according to the respective received resource state transfer matrices (e.g., to direct the received qubits to the ZZ outputs of a given FMC).

Continuing, each of the interference circuits 1410, 1411, and 1412 outputs resource state superpositions (interfered qubits) to the detector circuits 1416, 1417, 1420 in the cryogenic environment using a plurality of optical interconnects 1415 (e.g., fibers, connector optical interconnects). The detector circuits 1416, 1417, and 1420 generate readout data via data lines 1419 to identify resource state interferences were successful, and thereby further identifying whether there is a resource state on the fibers connecting seed state units to the FNP units. For example, the resource state system controller 1414 receives the readout data via data lines 1419 and determines, based on the readout data, whether resource states are on the fibers connected to the fusion system, and then transmits data indicating which fibers comprise the resource states via lines 1422 which can be conveyed to the FNP system for configuration.

As one of ordinary skill in the art having the benefit of this disclosure would appreciate, in some embodiments, the RSP can receive seed states that are generated from systems other than linear optical systems and thus, embodiments of the modular interconnected quantum photonic system disclosed herein can advantageously provide for the ability to interconnect many different types of quantum computing modules to form, e.g., large-scale quantum computers or quantum networks. For example, photonic seed states could be generated (e.g., generated directly, or through appropriate transduction techniques) from entangled states of qubits that are themselves atoms, ions, nuclei, flux qubits, phase qubits, or charge qubits (e.g., formed from a superconducting Josephson junction), topological qubits (e.g., Majorana fermions), spin qubits formed from vacancy centers (e.g., nitrogen vacancies in diamond, T centers in silicon), neutral atoms (e.g., trapped neutral atoms, Rydberg atoms), quantum dot emitters, and the like. Accordingly, the modular interconnected quantum photonic system disclosed herein can be thought of as an extremely versatile photonic interconnect and processing layer for any type of modular quantum computer architecture.

Figure 15:
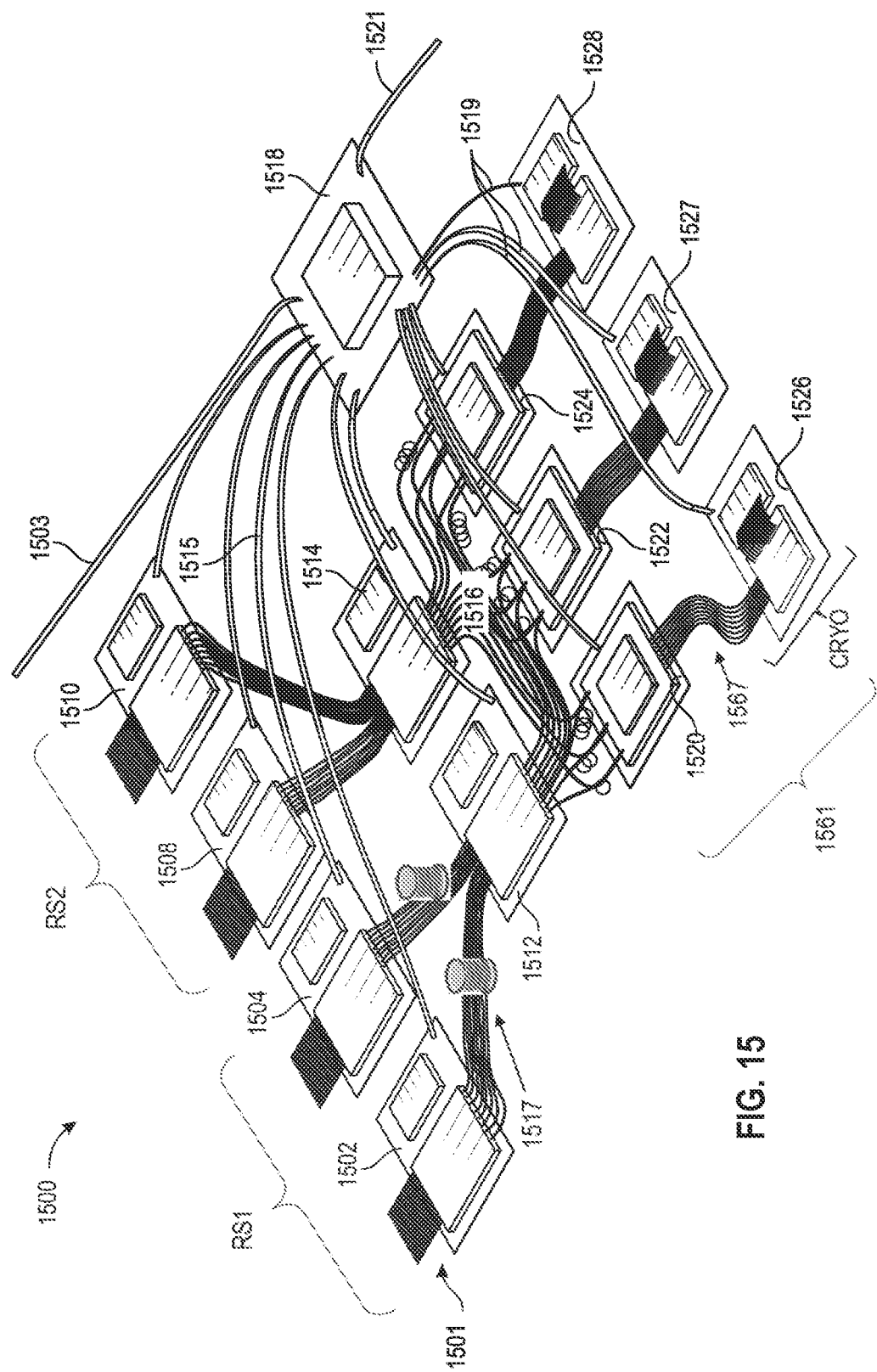
FIGS. 15 and 16 show fusion network projection systems, in accordance with some example embodiments.

FIG. 15 shows an fusion network projection system 1500, in accordance with some example embodiments. The fusion network projection system 1500 can correspond to one FNP unit of the FNP set 108 in FIG. 1A. For example, FIG. 8A illustrates two FNP units (FNP1 and FNP2), each corresponding to an instance of an fusion network projection system 1500 depicted in FIG. 15. As a further example, FIG. 8D illustrates four FNP units (FNP1-FNP4), each corresponding to an instance of fusion network projection system 1500. In some example embodiments, a fusion projection circuit 1561 comprises networked circuit components that include interference circuits 1520, 1522, 1524 (e.g., FMCs) that are at room temperature, and corresponding detector circuits 1526, 1527, and 1528 that are at cryogenic temperatures and connected by a plurality of optical interconnects 1567 (e.g. fibers, connector optical interconnects). The fusion projection circuit 1561 can implement projection measurements (e.g., ZZ, XX; XZ, ZX) to implement fusing together of resource states or implement single qubit measurements according to a fusion graph.

In some example embodiments, the fusion system controller 1518 receives input data 1503, including herald data indicating which fibers from the seed states are successful and have a resource states. The input lines 1501 shown in FIG. 15 are qubit lines comprising qubits from different resource states for interference by the interference circuits 1520, 1522, and 1524 (e.g., FMCs) according to fusion measurements being performed. In some example embodiments. FMCs of the FNP units run at the same system level clock rate as FMC in the RSP units, while in other example embodiments, the FMCs in FNPs run a slower system level clock rates that FMCs that are integrated in the RSP units.

In some example embodiments, the fusion system controller 1518 transmits multiplexer instructions via lines 1515 to first level switches, including multiplexer circuits 1502, 1504, 1508, and 1510 and to the second level multiplexer circuits 1512 and 1514 to implement switching the coupled-in qubits from different resource states into the delay array 1516. In some embodiments, the outputs of some of the switches, such as multiplexer circuits 1502 and 1504, are delayed using longer delays 1517 (e.g., spools of fiber) to implement interleaving of resource states (e.g., an L delay, L^2 delay). In some example embodiments, only one of the switches for a given input resource state are used in a given cycle. For example, a resource state qubit can be input into multiplexer circuit 1502 or input into multiplexer circuit 1504, depending on which set of SSGs were successful in the resource state given cycle. For instance, with reference to FIG. 8B, the FNP1 can correspond to portions of the fusion network projection system 1500. Further, as shown in FIG. 8B, the FNP1 is connected to SSG1A and SSG1B. In some example embodiments, return to FIG. 15, the multiplexer circuit 1502 has fixed connections to SSG1A and multiplexer circuit 1504 has fixed connections to SSG1B, where multiplexer circuit 1502 is selected by default (e.g., seed states and resource states from SSG1A is implemented by default). However, if SSG1A fails in a given resource state cycle, the multiplexer circuit 1504 can be selected to couple-in entanglements from SSG2B.

Similarly, multiplexer circuit 1508 and multiplexer circuit 1510 can be implemented in a similar manner. For instance, in FIG. 8B, FNP2 can correspond to portions of fusion network projection system 1500 in FIG. 15. For example, a qubit from a second resource state (RS2) can be input into multiplexer circuit 1508 (that has fixed connections to SSG2A) or multiplexer circuit 1510 (that has fixed connections from SSG2B) based on whether SSG2A or SSG2B is successful in a given cycle. In some example embodiments, the selection of the first row of multiplexer circuit is selected by the second row of switches (multiplexer circuit 1512, multiplexer circuit 1514) of the fusion network projection system 1500.

In some example embodiments, the SSGs are configured with high success such that in each cycle same multiplexer circuit receives a qubit of a resource state. For example, multiplexer circuit 1502 and multiplexer circuit 1504 can be combined as a single switch that is connected to a fixed set of SSGs such that in a given cycle the single switch always receives a qubit of a resource state. Likewise, multiplexer circuit 1508 and multiplexer circuit 1510 can be combined into a single switch circuit and coupled to a fixed set of SSGs and receive another qubit of another resource state in the given cycle. In these example embodiments, in which the multiplexer circuit in the first level switches are combined into single switches, the second level switches (multiplexer circuit 1512, multiplexer circuit 1514) can be omitted.

In some example embodiments, the fusion system controller 1518 further transmits fusion transfer matrix data to the interference circuits 1520, 1522, and 1524 (FMCs) to perform fusion operations on the qubits of the two different resource states. The interfered outputs from the interference circuits 1520, 1522, and 1524 are coupled to the detector circuits 1526, 1527, and 1528, which generate fusion outcome data 1519 which can be stored locally and/or decoded. For example, a control console can collect outcome data from each of the FNPs and implement decoding on the outcome data from each FNP to determine logical instructions.

As one of ordinary skill in the art having the benefit of this disclosure would appreciate, in some embodiments, the FNP can receive resource states that are generated from systems other than linear optical systems and thus, embodiments of the modular interconnected quantum photonic system disclosed herein can advantageously provide for the ability to interconnect many different types of quantum computing modules to form, e.g., large-scale quantum computers or quantum networks. For example, the resource states could be generated (e.g., generated directly, or through appropriate transduction techniques) from entangled states of qubits that are themselves atoms, ions, nuclei, flux qubits, phase qubits, or charge qubits (e.g., formed from a superconducting Josephson junction), topological qubits (e.g., Majorana fermions), spin qubits formed from vacancy centers (e.g., nitrogen vacancies in diamond, T centers in silicon), neutral atoms (e.g., trapped neutral atoms, Rydberg atoms), quantum dot emitters, and the like. Accordingly, the modular interconnected quantum photonic system disclosed herein can be thought of as an extremely versatile photonic interconnect and processing layer for any type of modular quantum computer architecture.

Figure 16:
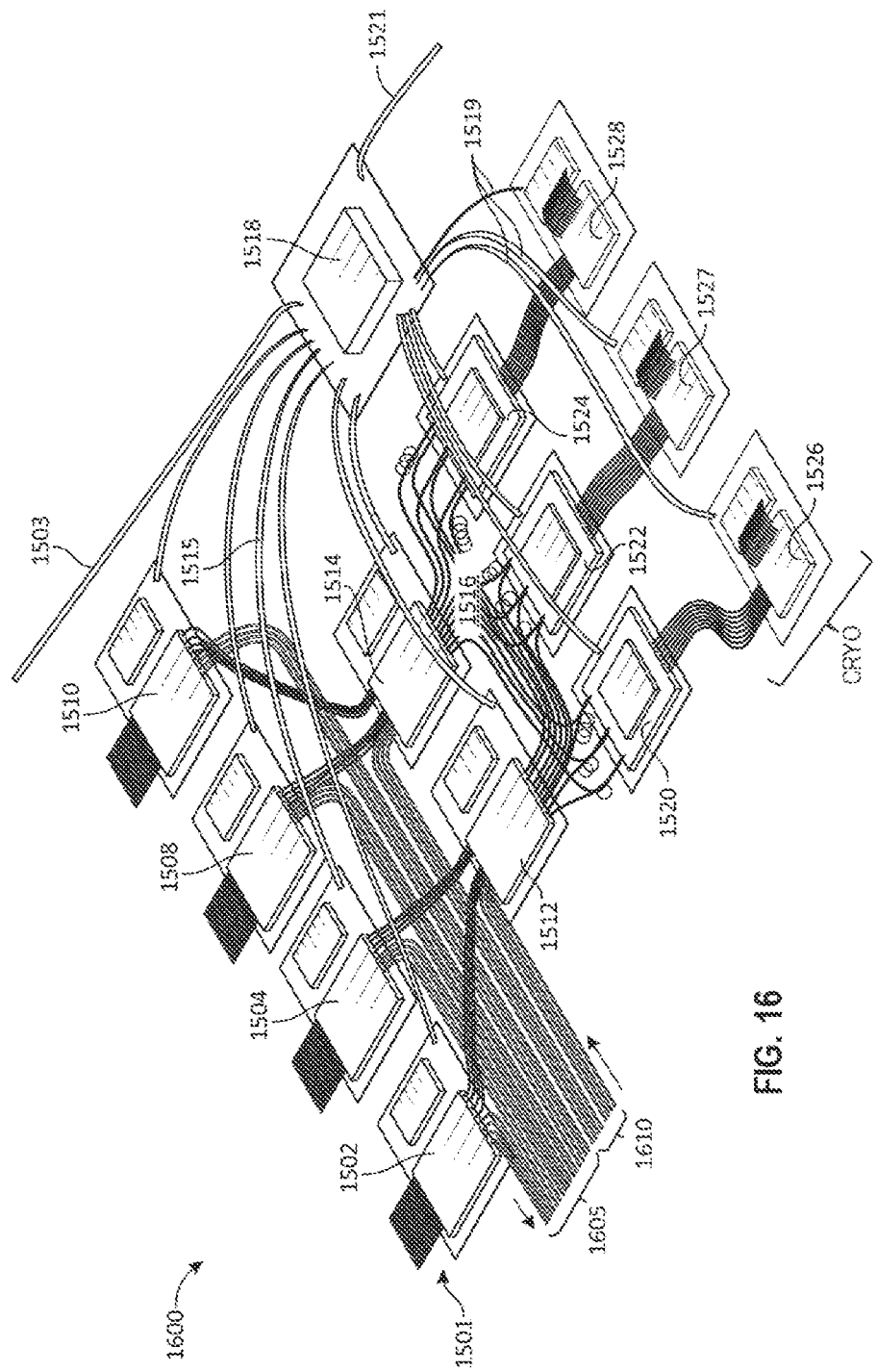

FIG. 16 shows an example fusion network projection system 1600, in accordance with some example embodiments. In the example of FIG. 16, the first level of switches have output ports 1605 that can output qubits (e.g., qubits of resource states) out of the fusion network projection system 1600; for example, to other FNPs in other cells. As an additional example, the first level of switches may direct qubits to the output ports to long delays that are stored in a different physical area (e.g., 2 kilometer delays). Similarly, the FNP system has input ports 1610 that input to the second level of switches (multiplexer circuits 1512 and 1514). As an example, the input ports can be implemented to receive qubits from long delays or receive qubits from other FNPs.

Figure 17A:
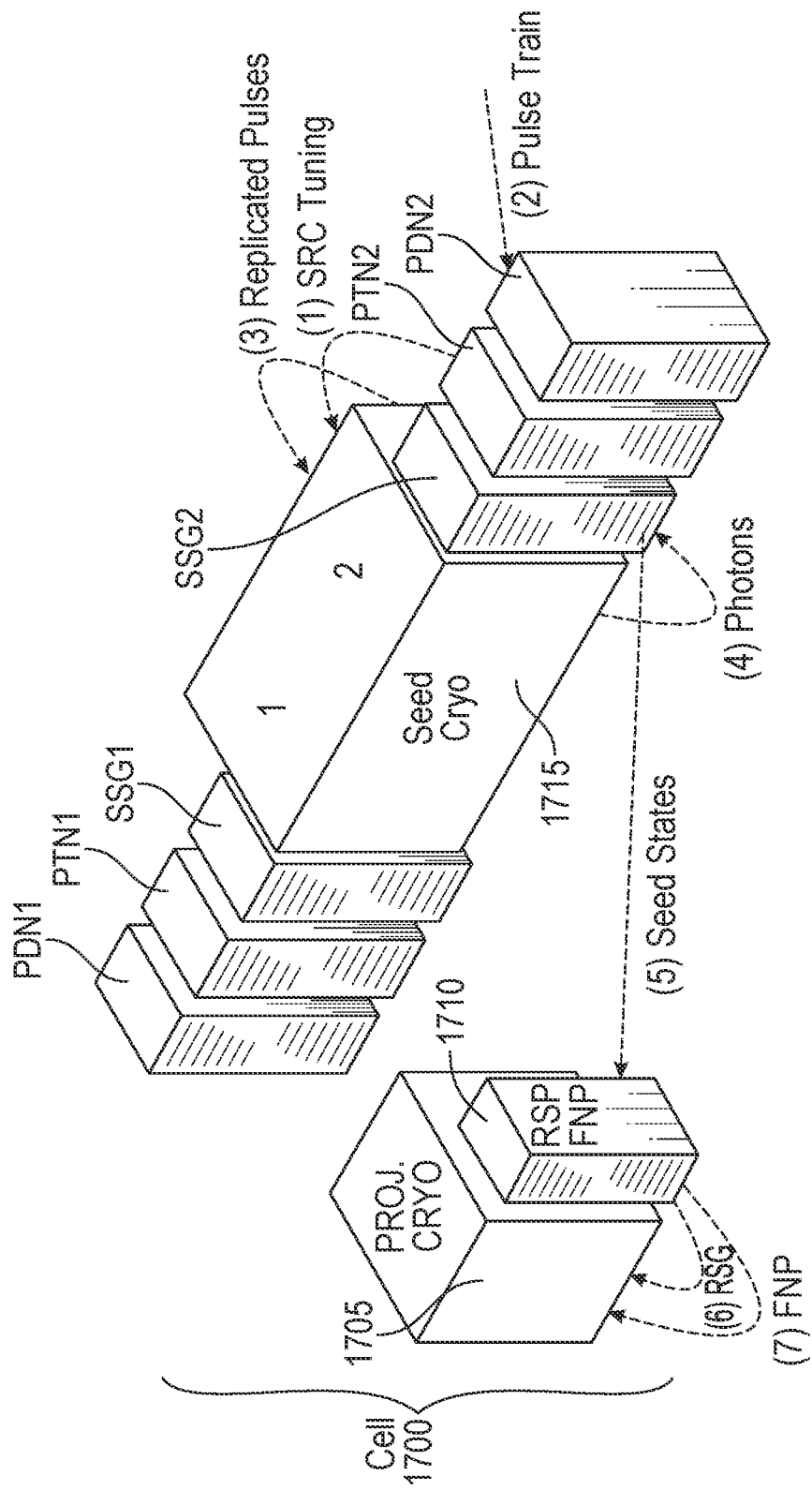
FIGS. 17A-17C show physical cryogenic structures and non-cryogenic structures, in accordance with some example embodiments.

FIG. 17A shows an example physical modular cell 1700, in accordance with some example embodiments. Although only one cell is illustrated in FIG. 17A, it is appreciated that multiple cells can be implemented in a scalable manner (e.g. FIGS. 3A-3B). In some example embodiments, a seed state cryogenic enclosure 1715 comprises a metal vacuum chamber that can be cooled by cryogenic coolants (e.g., liquid nitrogen, liquid helium) to maintain cryogenic chips at a cryogenic operating temperature. The seed state cryogenic enclosure 1715 can include two cold regions, marked "1" and "2" in FIG. 17A. The different seed cold regions can include cold plates having assemblies and chips, as further discussed below. In some example embodiments, the cold plates are cryogenically cooled by liquid helium (e.g., to 2K, to 4K). Further, each seed cold region has is surrounded by its own metal box (copper box, not part of the vacuum chamber wall) which is cooled by liquid nitrogen to provide cryogenic thermal shielding.

Each seed region 1 and 2 can include a plurality of cryogenic chips, such as HSPS source chips that have cryogenically cooled single photon detectors (e.g., to generate photon pairs and detect one of the photons) and detector arrays to perform detection for interference and switch chips. Further each seed cold region is interfaced and supported by a plurality of room temperature structures, including an SSG rack (e.g., SSG1, SSG2) having seed state chips (e.g., SSC 430), a PTN rack (e.g., PTN1, PTN2) having tuning components (e.g., heaters, polarization control elements, amps and control circuitry) to provide tuning to the different HSPSs in cryo, and a PDN rack (e.g., PDN1, PDN2) that receives pulses, replicates the pulses, and distributes the replicated pulses to HSPS chips in the seed cryo. For example, the source circuit 1302 and the detector circuit 1314 of seed state generator system 1300 in FIG. 13 can be supported in the seed state cryogenic enclosure 1715 and can be coupled to multiplexer circuit 1304 and seed state circuit 1306 that are housed in the room temperature racks.

Further illustrated within the modular cell 1700 includes a projection cryogenic enclosure 1705. In some example embodiments, the projection cryogenic enclosure 1705 is implemented as a separate cryogenic chamber (e.g., first cryogenic enclosure 120, FIG. 1B) having an arrays of detectors on a Helium cooled cold plate, which is surrounded by the a metal thermal shield (e.g., copper box inside the vacuum chamber), where the metal thermal shield is cooled by liquid nitrogen to provide thermal cryogenic buffering or shielding that protects the colder components (e.g., detectors at 2K). Further illustrated is a projection rack 1710 (e.g., rack, tower, housing) having RSP and FNP components to implement switching and interference operations for projective fusion measurements, as discussed above. For example, multiplexers and FMCs of the RSP and FNP systems (in FIGS. 14 to 16) can be in the projection rack 1710, and outputs can be coupled to detectors in the projection cryogenic enclosure 1705. In some example embodiments, the projection rack 1710 further comprises tuning components (e.g., control circuitry) to tune and calibrate and maintain the tuning of the active elements (e.g., phase shifters) in the multiplexers and FMCs in the projection rack 1710.

An example process is here discussed with reference to one side of seed cryogenic enclosure ("2") and its corresponding room temperature racks (SSG, PTN2, and PDN2); however, it is appreciated that the other cryo units and towers can be implemented similarly (though no extra cables and labels are shown to reduce drawing clutter).

In some example embodiments, at (1) in FIG. 17A, during a calibration stage before operational runtime, the phase tuning elements in the PTN2 use electrical control signals and light (e.g., bright light, single photons) to calibrate each HSPS source in cryo-side-2. At run time, a mode locked laser (not depicted in FIG. 17A) generates a shaped optical pulse of classical light that is shaped and tuned for the HSPS sources in the the cryo-side-2. For example, the mode locked laser can generate a optical pulse having a sufficient width (bandwidth), power (amplitude) and frequency such that when the pulse (or a replicated version thereof) is input into an HSPS, the optical pulse generates a photon pair using a photon pair production scheme (e.g., four wave mixing, spontaneous parametric down conversion). In some example embodiments, the mode locked laser generates a series of the shaped pulses that form a sequence of pulses, which can be referred to as a pulse train.

At (2) in FIG. 17A, the pulse train is received by a PDN2 which has splitters and amplifiers (e.g., waveguide based amplifiers, doped fiber amps) to replicate the pulses enough times such that each HSPS in cryo receives its own replicated pulse.

At (3) in FIG. 17A, the replicated pulses are coupled to the HSPS chips in cryo-side 2 for photon pair production. In some example embodiments, the replicated pulses are coupled to the HSPSs using fibers that pass through vacuum chamber feed throughs. The HSPS generates photons pairs, which are output from the HSPSs and some of the output photons are detected in cryo (e.g., signal photons) to indicate that their corresponding photons (e.g., idler photons) are propagating on waveguides or fibers, which are coupled to the SSG4, as shown at (4) in FIG. 17A.

In some example embodiments, at (5) in FIG. 17A, the SSG2 receives the photons and interferes them to generate seed states (e.g., 3-GHZs) that are coupled to the the projection rack 1710 (e.g., to the projection circuits including the RSPs and FNPs). For example, the seed state circuits in the SSG2 can have outputs edge coupled to fibers that couple the seed states to the projection rack 1710 (e.g., one photon from the seed state to an RSP, another two photons of the same seed state to an FNP, or other arrangements).

At (6), the resource state circuits interfere the seed states and couple the outputs to detectors in the projection cryogenic enclosure 1705 for detection, where the readout data from the RSP detectors indicate that one or more resource states were generated (e.g., on fibers connected to the FNPs).

At (7), to perform fusion measurements, the FNP receives qubits from different resource states and perform interferences and the outputs are coupled to detectors in the projection cryogenic enclosure 1705 to generate readout data, which is received by the control console (e.g., controller 112 in FIG. 1A; control console 210 in FIG. 2).

Figure 17B:
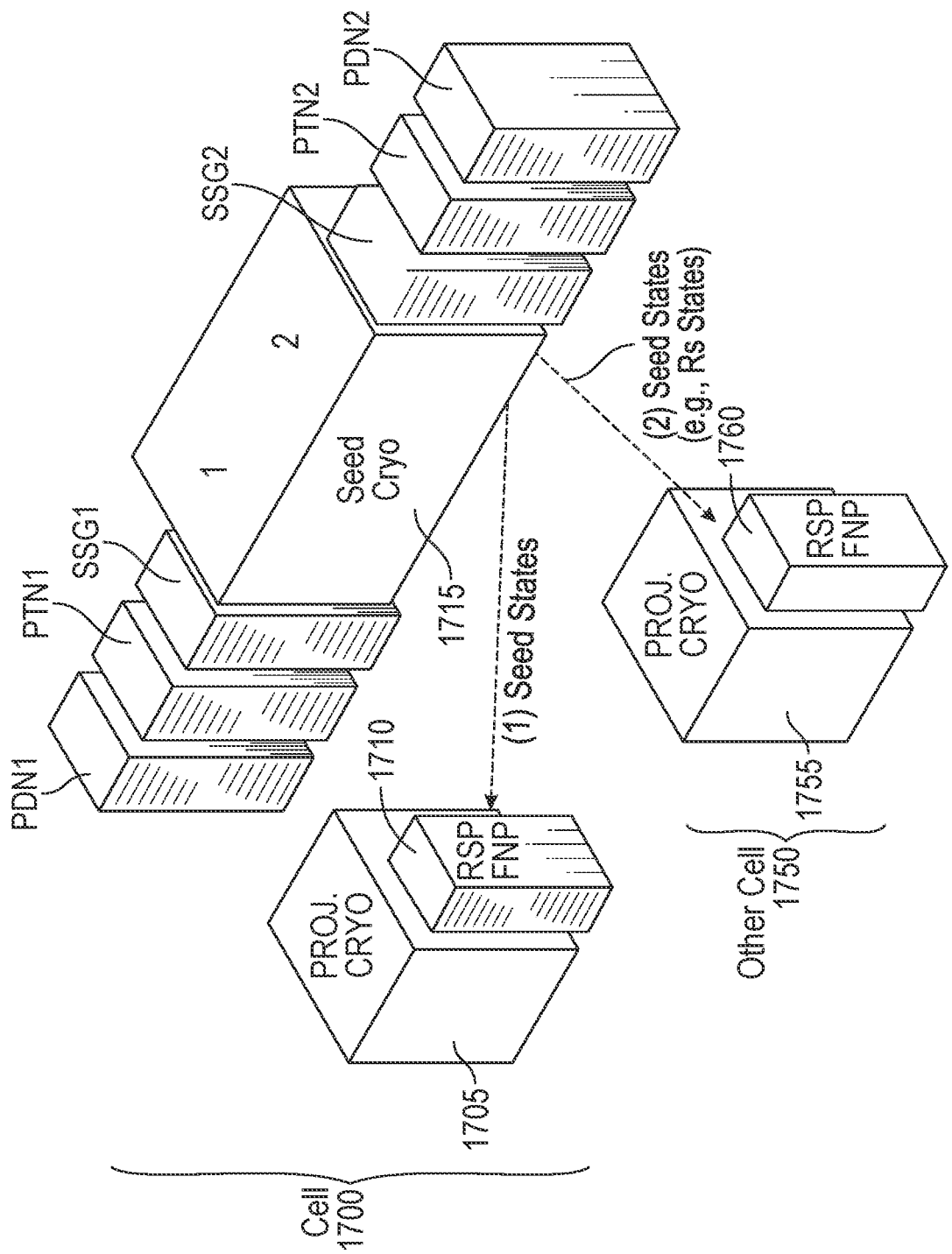
Figure 17C:
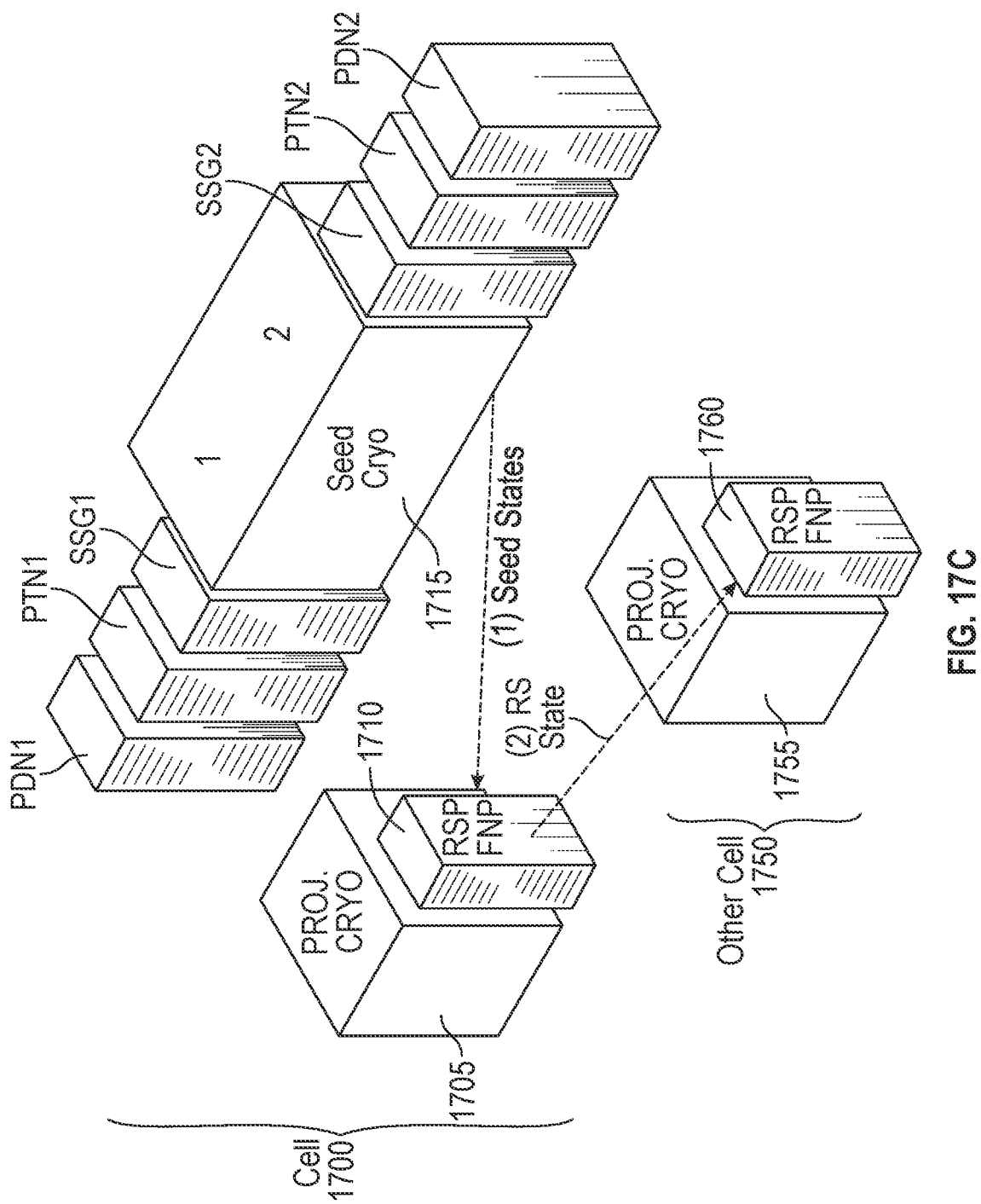

FIGS. 17B and 17C show examples of coupling entangled states between cells, in accordance with some example embodiments. In the example shown in FIG. 17B, a projection cryogenic enclosure 1755 and a projection rack 1760 of another cell 1750 are shown (and other parts of the cell are omitted). In the illustrated example, the modular cell 1700 can couple seed states to its own RSPs and FNPs as shown at (1). Or, alternatively, one or more of the seed state chips in the SSGs (e.g., SSG2) can couple qubits of a seed state to FNPs in the other cell 1750, as discussed above with reference to FIG. 3A.

In the example shown in FIG. 17C, the qubits are coupled to the another cell by way of coupling between FNP units in the different cells, as discussed above with reference to FIG. 3B (e.g., implementing fusion network projection system 1600). For example, and FNP assembly in the projection rack 1710 can switch one or more qubits of a resource state to an FNP assembly in projection rack 1760 that is in the other cell, thereby enabling fusion of of two RSPs across cells in a scalable and flexible manner.

FIG. 18 shows an example seed state cryogenic structure 1800 (e.g., cryogenic structure, cryo-chamber), in accordance with some example embodiments. The seed state cryogenic structure 1800 can be pumped and maintained in a low to medium vacuum state, and one or more cryogenic coolants can be coupled into the seed state cryogenic structure 1800 through coolant ports 1877 for circulation and cooling of components inside the seed state cryogenic structure 1800 using cryogenic coolants (e.g., liquid Helium, liquid Nitrogen). As illustrated, the seed state cryogenic structure 1800 comprises a plurality of cryogenic chamber ports 1805A and 1805B (e.g., feed throughs) to pass through fibers and data cables into the chamber, and the other side of the seed state cryogenic structure 1800 has additional plurality of feed throughs to feed through other fibers in and of the chamber (the opposite side is facing away in the perspective FIG. 18 and not shown). Additionally, the seed state cryogenic structure 1800 comprises an access door 1867 to access the interior of the seed state cryogenic structure 1800.

As discussed above with reference to FIG. 17A, the seed cryo can have two seed cold regions "1" and "2", that each has a cold plate system having cryogenic chips that are coupled through their respective nearby feed throughs. For example, a first seed cold region 1 can have a first set of cold plate components that have fibers coupled out through cryogenic chamber ports 1805A in the direction of 1A, and another cold plate of components in the same cold region 1 can face the other direction and couple its components out through the backside feed throughs (not shown in FIG. 17A in the direction of 1B. Further, the cold region 2 can have its own cold plate system with a first cold plate set of components that are coupled using fibers in the direction of 2A and a backside cold plate set of components that are coupled out using fibers in the direction of 2B. Additional details of the cold plates are discussed below.

Figure 19:
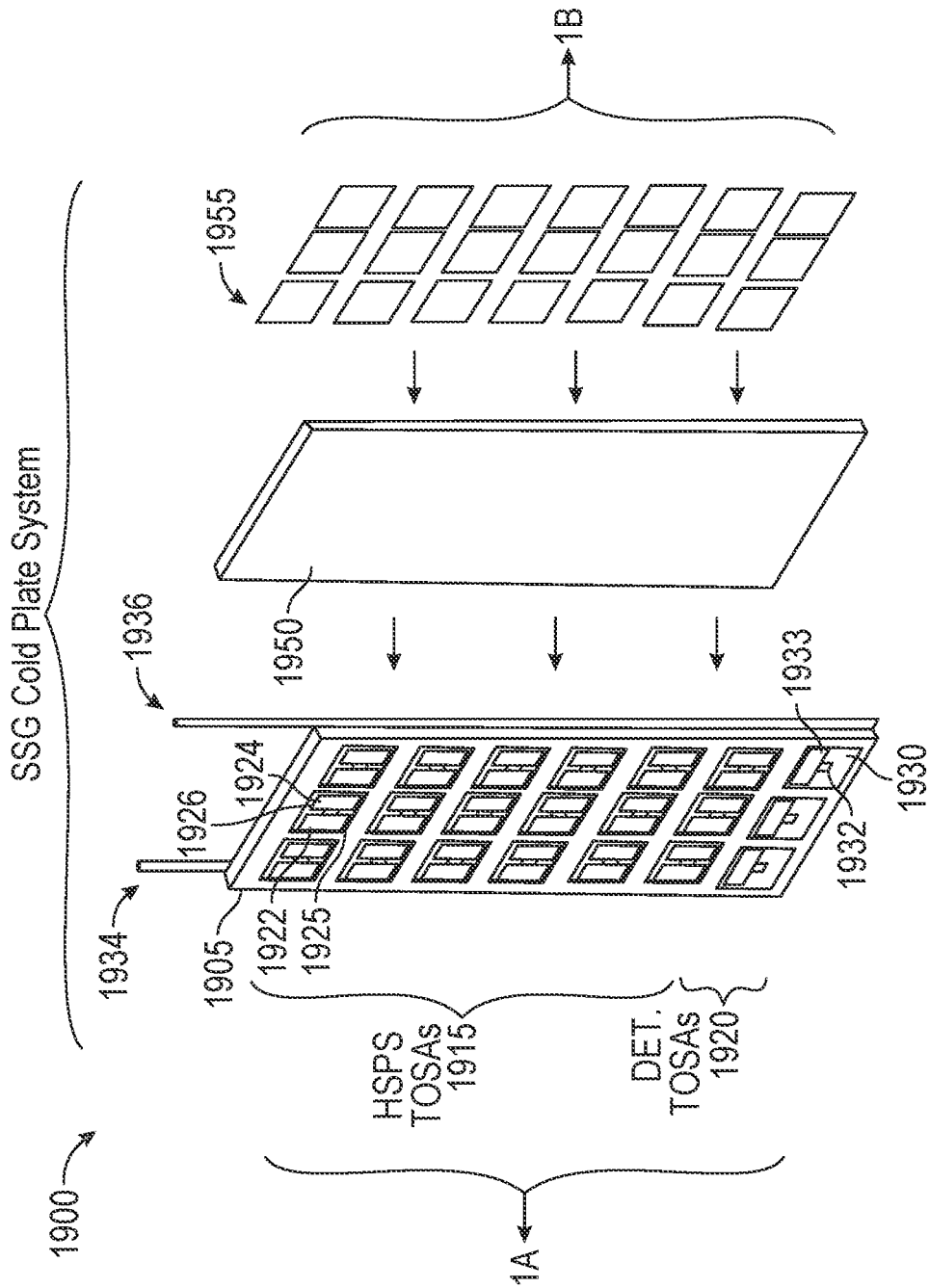
FIG. 19 shows a cryogenic plate system, in accordance with some example embodiments.

FIG. 19 shows an example cold plate system 1900, in accordance with some example embodiments. The cold plate system 1900 can be implemented with a cryogenic thermal shield to implement parts of the cryogenic cold region modules discussed above. For clarity, the enclosed thermal shield metal box is omitted to show the components inside. The cold plate system 1900 is example system that can be implemented twice in each cold region 1 and 2, as discussed above. For example, the cold plate system 1900 in FIG. 19 can be implemented in the seed cold region 1 and have components that are coupled to fibers that are output through feed throughs (e.g., feedthrough 1805, FIG. 18) in the direction of 1A, and other components couple to fibers that are output in the direction of 1B (e.g., through backside feedthroughs).

In the illustrated example, a liquid helium pipe system can receive liquid helium from inlet 1934 and circulate the liquid helium to two connected cold plates, including cold plate 1905 and cold plate 1950, to cool the cold plates (and components mounted to the cold plates) to 2.3 to 4.5K. After circulation, the liquid helium is output from the outlet 1936.

As illustrated, the cold plate 1905 comprises a plurality of heralded single photon assemblies (TOSAs) 1915 and detector TOSAs 1920. An example HSPS TOSA includes ISPS TOSA 1925, which supports a photon pair production PIC 1926 and two control ASICs 1922 and 1924. Further, the cold plate 1905 supports a plurality of detector TOSAs, such as detector TOSA 1930 which has a detector PIC 1932 (e.g., superconducting nanowire photon detector) and a control ASIC 1933. The cold plate 1905 can correspond to the 1A side of the "1" seed cold region "1" discussed above in FIGS. 18 and 17A. Further, an additional cold plate 1950 can support a plurality of additional TOSAs 1955, where components of the cold plate 1950 output to fibers through a backside feedthrough in the 1B direction.

Figure 20:
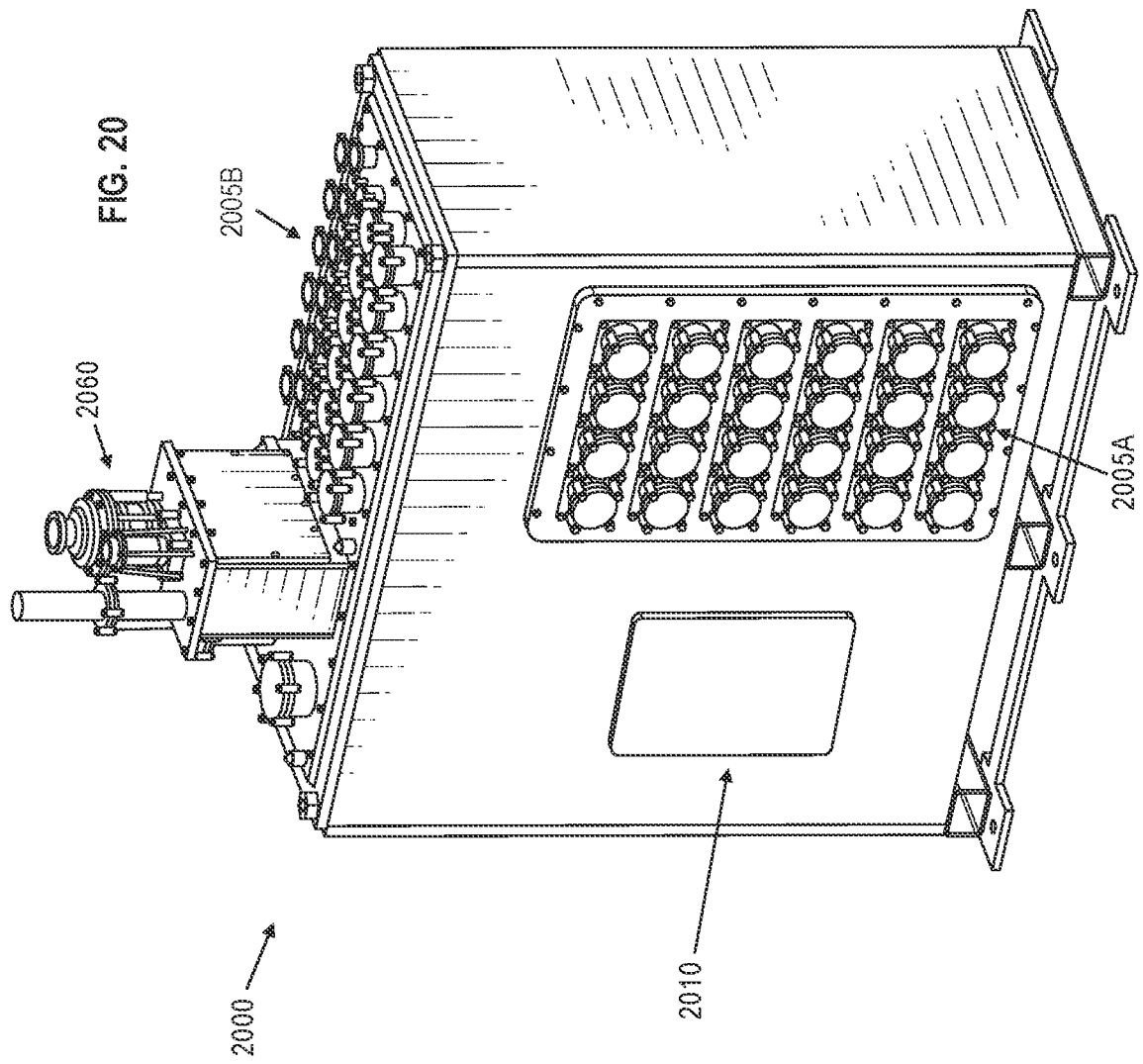
FIG. 20 shows a projection cryogenic structure, in accordance with some example embodiments.

FIG. 20 shows an example projection cryogenic structure 2000, in accordance with some example embodiments. As discussed above, the projection cryogenic structure 2000 can have a cold area (e.g., cryogenically thermally shielded metal box) that houses a projection cold plate system having one or more cryogenic chips, as further discussed below. In some example embodiments, the projection cryogenic enclosure comprises coolant ports 2060 to fluidly couple cryogenic coolants (e.g., liquid Helium, liquid Nitrogen) for circulation and cooling of components within the projection cryogenic enclosure.

In some example embodiments, the projection cryogenic structure 2000 includes cryogenic chamber ports 2005A and 2005B to pass through fiber and data connections (e.g., electrical wires, cables) to components on the cold plates. Further, the projection cryogenic structure 2000 can include one or more access doors 2010 to access the interior of the projection cryogenic structure 2000.

Figure 21:
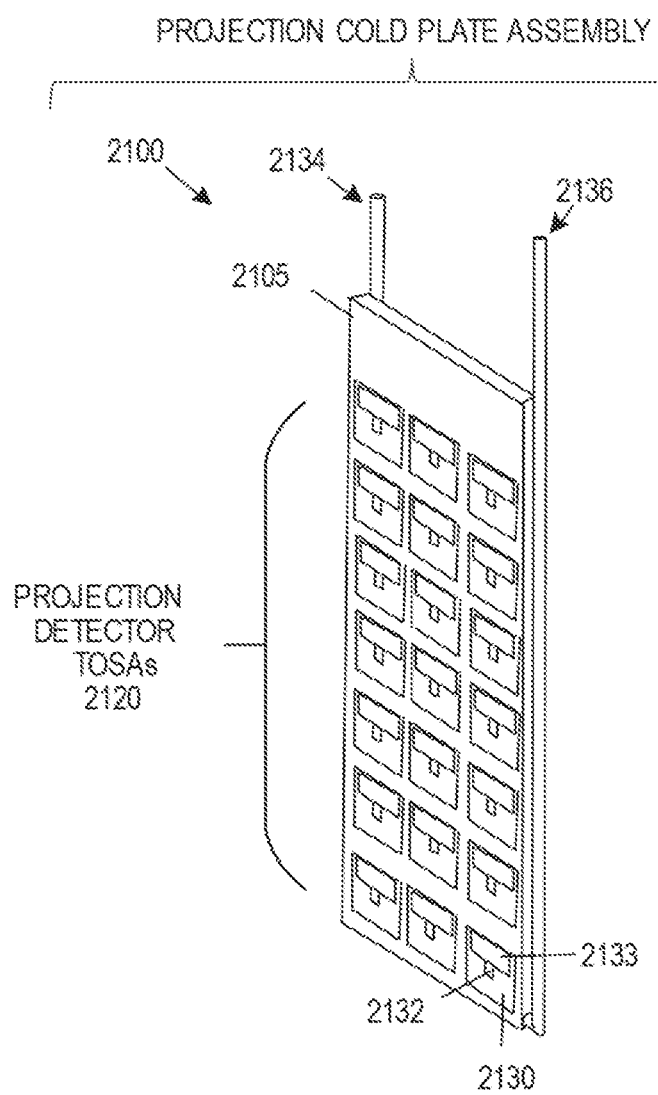
FIG. 21 shows an cryogenic plate system, in accordance with some example embodiments.

With reference to FIG. 21, in some example embodiments, liquid helium is input into the inlet 2134 for circulation through channels thermally connected to cold plate 2105. After cooling, the liquid helium is output through the outlet 2136 (e.g., in evaporated or partially evaporated form). Further, the cold plate 2105 can support a plurality of projection detection TOSAs 2120, such as as detector TOSA 2130 having a detector PIC 2132 and an electrical control ASIC 2133.

Figure 22:
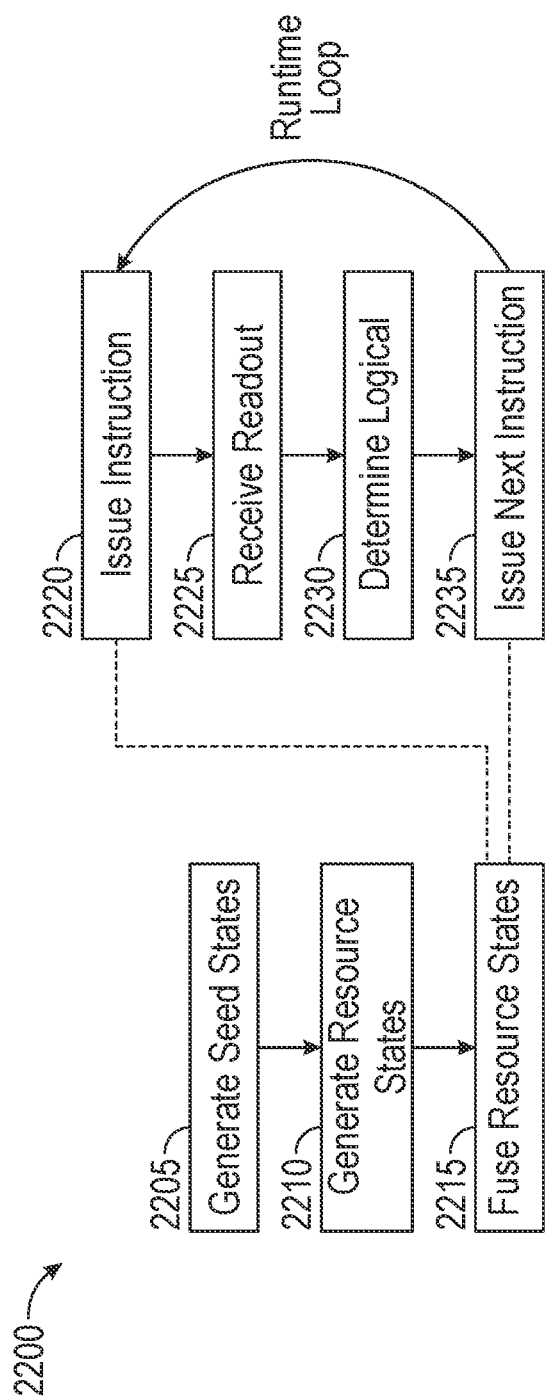
FIG. 22 shows a flow diagram of a method for implementing a modular array system, in accordance with some example embodiments.

FIG. 22 shows a flow diagram of a method 2200 for implementing fusion base quantum information processing of entangled states using a modular system, in accordance with some example embodiments.

At operation 2205, seed states are generated by one or more seed state systems (e.g., SSG set 104, SSGs in FIG. 8A-8D, seed state generator system 1300). For example, at operation 2205 a collection of seed state systems, such as seed state generator system 1300, generate a plurality of seed entangled state (e.g., Bell pairs, n-GHZs, or other types of entanglements). In some example embodiments, qubits from the seed states are directed to resource state systems, such as the resource state projection system 1400, and fusion network projection systems, such as the fusion network projection system 1500, in accordance with some example embodiments.

At operation 2210, resource states are generated by a plurality of resource state systems (e.g., RSP set 106; RSPs units in FIGS. 8A-8D; resource state projection system 1400 in FIG. 14). For example, at operation 2210, a plurality of resource state systems can receive qubits from different seed states and perform a fusion measurement to generate a resource state (e.g., resource state 820). At operation 2215, a plurality of resource state pairs are fused together using fusion network projection systems (e.g., FNP set 108; FNTP units in 8A-8D; the fusion network projection system 1500 in FIG. 15). For example, qubits from different resource states can be fused according to a fusion network, such as fusion network 940 in FIG. 9C or fusion network 1050 in FIG. 10B. As discussed above, the fusion network graph data can map to collections of fusion sites (e.g., implemented by FMCs) in which resource entangled states are fused to each other using qubits from the different resource states. As discussed above with reference to FIG. 12A-12D, the fusion network graph data can implement tasks for a quantum application. In some example embodiments, one or more of the operations of 2205, 2010, 2215 are performed in a looped manner to generate resource states that can under go XX and ZZ schemes to implement tasks for a runtime loop.

For example, FIG. 22 shows an expanded runtime loop having operations 2220 to 2235 for implementing tasks according to the fusion network graph. As an example, at operation 2220, a plurality of fusion layer instructions are issued to F NPs which perform fusion operations that fuse resource states via XX or ZZ schemes. Further, at operation 2225, a plurality of FNPs generate readout data using detectors coupled to the FNPs (e.g., detectors 107). In some example embodiments, different fusion layers can be adjacent to one another and resource states can be sent to other fusion layers as discussed above (e.g., FIG. 3A, 3B, FIGS. 15 and 16, FIGS. 17B and 17C). At operation 2230, the readout data is collected by a control console 210 to determine logical outcomes (e.g., via decoding the readout data using MWPM, Union Find, or other decoding schemes). At operation 2235, a plurality of next fusion layer instructions are issued to the FNPs that fuse together resource states generated in the newest completion of operation 2210 in the resource loop.

FIGS. 23A and 23B show photonic based dual-rail encoded qubits, in accordance with some example embodiments. In the illustrated example, a qubit can be implemented using a pair of waveguides. FIG. 23A shows two representations (2300, 2300') of a portion of a pair of waveguides 2302, 2304 that can be used to provide a dual-rail-encoded photonic qubit. At 2300, a photon 2306 is in waveguide 2302 and no photon is in waveguide 2304 (also referred to as a vacuum mode): in some embodiments, this corresponds to the $|0\rangle$ state of a photonic qubit. At 2300', a photon 2308 is in waveguide 2304, and no photon is in waveguide 2302; in some embodiments this corresponds to the $|1\rangle$ state of the photonic qubit. To prepare a photonic qubit in a known state, a photon source (not shown) can be coupled to one end of one of the waveguides. The photon source can be operated to emit a single photon into the waveguide to which it is coupled, thereby preparing a photonic qubit in a known state. Photons travel through the waveguides, and by periodically (e.g., probabilistically) operating the photon source, a quantum system having qubits whose logical states map to different temporal modes of the photonic system can be created in the same pair of waveguides. In addition, by providing multiple pairs of waveguides, a quantum system having qubits whose logical states correspond to different spatiotemporal modes can be created. It should be understood that the waveguides in such a system need not have any particular spatial relationship to each other. For instance, they can be but need not be arranged in parallel.

Occupied modes can be created by using a photon source to generate a photon that then propagates in the desired waveguide. A photon source can be, for instance, a resonator-based source that emits photon pairs, also referred to as a heralded single photon source (e.g., a HSPS photonic circuit). In one example of such a source, the source is driven by a pump, e.g., a light pulse, which is coupled into a system of optical resonators that, through a photon pair scheme (e.g., nonlinear optical processes, such as spontaneous four wave mixing (SFWM), spontaneous parametric down-conversion (SPDC), second harmonic generation, or the like), can generate a pair of photons. Many different types of photon sources can be employed. Examples of photon pair sources can include a micro-ring based spontaneous four wave mixing (SPFW) heralded photon source (HPS). It is appreciated that the precise type of photon source used is not critical and any type of source employing any process, such as SPFW, SPDC, or any other process can be used. Other classes of sources that do not necessarily require a nonlinear material can also be employed, such as those that employ atomic and/or artificial atomic systems, e.g., quantum dot sources, color centers in crystals, and the like. In some cases, sources may or may not be coupled to photonic cavities, e.g., as can be the case for artificial atomic systems such as quantum dots coupled to cavities. Other types of photon sources also exist for SPWM and SPDC, such as optomechanical systems and the like.

In such cases, operation of the photon source may be deterministic or non-deterministic (also sometimes referred to as "stochastic") such that a given pump pulse may or may not produce a photon pair. In some embodiments, coherent spatial and/or temporal multiplexing of several non-deterministic sources (referred to herein as "active" multiplexing) can be used to allow the probability of having one mode become occupied during a given cycle to approach 1. One of ordinary skill will appreciate that many different active multiplexing architectures that incorporate spatial and/or temporal multiplexing are possible. For instance, active multiplexing schemes that employ log-tree, generalized Mach-Zehnder interferometers, multimode interferometers, chained sources, chained sources with dump-the-pump schemes, asymmetric multi-crystal single photon sources, or any other type of active multiplexing architecture can be used. In some embodiments, the photon source can employ an active multiplexing scheme with quantum feedback control and the like.

Measurement operations can be implemented by coupling a waveguide to a single-photon detector that generates a classical signal (e.g., a digital logic signal, ISPS readout data) indicating that a photon has been detected by the detector. Any type of photodetector that has sensitivity to single photons can be used. In some embodiments, detection of a photon (e.g., at the output end of a waveguide) indicates an occupied mode while absence of a detected photon can indicate an unoccupied mode. In some embodiments, a measurement operation is performed in a particular basis (e.g., a basis defined by one of the Pauli matrices and referred to as X, Y, or Z), and mode coupling as described below can be applied to transform a qubit to a particular basis.

Some embodiments described below relate to physical implementations of unitary transform operations that couple modes of a quantum system, which can be understood as transforming the quantum state of the system. For instance, if the initial state of the quantum system (prior to mode coupling) is one in which one mode is occupied with probability 1 and another mode is unoccupied with probability 1 (e.g., a state |10⟩ in a Fock notation in which the numbers indicate occupancy of each state), mode coupling can result in a state in which both modes have a nonzero probability of being occupied, e.g., a state $a_1|10\rangle + a_2|01\rangle$, where $|a_1|^2 + |a_2|^2 = 1$. In some embodiments, operations of this kind can be implemented by using beam splitters to couple modes together and variable phase shifters to apply phase shifts to one or more modes. The amplitudes $a_1$ and $a_2$ depend on the reflectivity (or transmissivity) of the beam splitters and on any phase shifts that are introduced.

FIG. 23B shows a schematic diagram 2310 (also referred to as a circuit diagram or circuit notation) for coupling of two modes. The modes are drawn as horizontal lines 2312, 2314, and the mode coupler 2316 is indicated by a vertical line that is terminated with nodes (e.g., solid dots or circles, solid boxes) to identify the modes being coupled. In the more specific language of linear quantum optics, the mode coupler 2316 shown in FIG. 23B represents a 50/50 beam splitter that implements a transfer matrix:

$$T = \frac{1}{\sqrt{2}} \begin{pmatrix} 1 & i \\ i & 1 \end{pmatrix}, \quad (1)$$

where T defines the linear map for the photon creation operators on two modes. (In certain contexts, transfer matrix T can be understood as implementing a first-order imaginary Hadamnard transform.) By convention the first column of the transfer matrix corresponds to creation operators on the top mode (referred to herein as mode 1, labeled as horizontal line 2312), and the second column corresponds to creation operators on the second mode (referred to herein as mode 2, labeled as horizontal line 2314), and so on if the system includes more than two modes. More explicitly, the mapping can be written as:

$$\begin{pmatrix} \alpha_1^\dagger \\ \alpha_2^\dagger \end{pmatrix}_{input} \mapsto \frac{1}{\sqrt{2}} \begin{pmatrix} 1 & -i \\ -i & 1 \end{pmatrix} \begin{pmatrix} \alpha_1^\dagger \\ \alpha_2^\dagger \end{pmatrix}_{output}, \quad (2)$$

where subscripts on the creation operators indicate the mode that is operated on, the subscripts input and output identify the form of the creation operators before and after the beam splitter, respectively and where:

$a_i|n_i,n_j\rangle = \sqrt{n_i}|n_i-1,n_j\rangle$ $a_j|n_i,n_j\rangle = \sqrt{n_j}|n_i,n_j-1\rangle$ $a_j^\dagger|n_i,n_j\rangle = \sqrt{n_j+1}|n_i,n_j+1\rangle \quad (3)$ For example, the application of the mode coupler shown in FIG. 23B leads to the following mappings:

$$\alpha_{1\,input}^\dagger \mapsto \frac{1}{\sqrt{2}}(\alpha_{1\,output}^\dagger - i\alpha_{2\,output}^\dagger) \quad (4)$$

$$a^\dagger_{2_{input}} \mapsto \frac{1}{\sqrt{2}}(-i\alpha^\dagger_{1_{output}} + \alpha^\dagger_{2_{output}})$$

Thus, the action of the mode coupler described by Eq. (1) is to take the input states $|10\rangle$, $|01\rangle$, and $|11\rangle$ to $$\frac{|10\rangle \mapsto (|10\rangle - i|01\rangle)}{\sqrt{2}} \quad (5)$$

$$|01\rangle \mapsto \frac{(-i|10\rangle + |01\rangle)}{\sqrt{2}}$$

$$|11\rangle \mapsto (-i)/2(|20\rangle + |02\rangle)$$

FIG. 23C shows a physical implementation of a mode coupling that implements the transfer matrix T of Eq. (1) for two photonic modes in accordance with some embodiments. In this example, the mode coupling is implemented using a waveguide beam splitter 2320, also sometimes referred to as a directional coupler or mode coupler. Waveguide beam splitter 2320 can be realized by bringing two waveguides 2322, 2324 into close enough proximity that the evanescent field of one waveguide can couple into the other. By adjusting the separation d between waveguides 2322, 2324 and/or the length l of the coupling region, different couplings between modes can be obtained. In this manner, a waveguide beam splitter 2320 can be configured to have a desired transmissivity. For example, the beam splitter can be engineered to have a transmissivity equal to 0.5 (e.g., a 50/50 beam splitter implementing the transfer matrix T above). In some example embodiments, the transfer matrix can be modified per photonic design by varying the reflectivity (or the transmissivity); e.g., to be greater than 0.6, greater than 0.7, greater than 0.8, or greater than 0.9, and so on. In some example embodiments, phase shifters are implemented with beam splitters with variable transmissivity and arbitrary phase relationships between output modes. For example, a variable phase shifter can be added to a beam splitter to implement Mach-Zehnder Interferometer (e.g., MZI having two modes; a GMZI having greater than two modes, etc.), as is appreciated by those of ordinary skill in linear optics. Further, control over the relative phase and amplitude of modes in the MZI can be achieved by varying the phases imparted by the phase shifters (e.g., and/or by varying the length of coupling region in a directional coupler).

In some example embodiments, phase shifts can be applied to one or more modes to implement unitary transforms. In some photonic implementations, variable phase-shifters can be implemented in photonic integrated circuits, thereby providing control over the relative phases of the state of a photon spread over the multiple modes.

In some example embodiments, variable phase shifters apply a fixed phase shift (e.g., fixed swing, 90 degrees, 180 degrees) according to the transformation being applied (e.g., based on beam splitter configuration, such as symmetric beam splitter, an asymmetric beam splitter). In some example embodiments, transfer matrices for such phase shifts include (e.g., for applying a +i and −i phase shift to the second mode, respectively):

$$s = \begin{pmatrix} 1 & 0 \\ 0 & i \end{pmatrix} \quad (6)$$

$$s^\dagger = \begin{pmatrix} 1 & 0 \\ 0 & -i \end{pmatrix}$$

For silica-on-silicon materials some embodiments implement variable phase-shifters using thermo-optical switches. The thermo-optical switches use resistive elements fabricated on the surface of the chip, that via the thermo-optical effect can provide a change of the refractive index n by raising the temperature of the waveguide (e.g., by an amount of the order of 10^−5 K). One of skill in the art with access to the present disclosure will understand that any effect that changes the refractive index of a portion of the waveguide can be used to generate a variable, electrically tunable, phase shift. For example, some embodiments use beam splitters based on any material that supports an electro-optic effect, so-called $\chi 2$ and $\chi 3$ materials such as lithium niobite, BBO, KTP, BTO, PZT, and the like and even doped semiconductors such as silicon, germanium, and the like.

FIG. 24 shows a table with the effects of a few rotated variations of the Type II fusion gate used to fuse two small entangled states. For drawing compactness, the examples of FIG. 24 are shown in the polarization encoding context (e.g., a qubit in a dual rail polarization encoding on single path or waveguide), though it is appreciated that other encodings, such as path based encodings discussed in FIGS. 23A, 23B, 25A and 25B, can be similarly implemented to correspond to the table of FIG. 24. In the illustrated table, the effective projections are shown and the respective final effects on a given cluster state are shown, with success and failure data (e.g., detector readout data).

FIGS. 25A and 25B show an XX scheme 2500, a ZZ scheme 2525, an XZ scheme 2550, and a ZX scheme 2575 for two particle (e.g., two qubit) measurements, in accordance with some example embodiments. The two particle joint measurements can be implemented as a probabilistic measurement on two input qubits in a Bell basis. For example, in FIG. 25A a given basis can include $X_1X_2$, $Z_1Z_2$. Further, in FIG. 25B, a basis can include $X_1Z_2$, $Z_1X_2$.

The example schemes of FIGS. 25A and 25B can be implemented as dual-rail photonic circuits, where each pair of waveguides can comprise a qubit, as is appreciated by one of ordinary skill in the art. For example, the top two modes (e.g., waveguides, fibers) in XX scheme 2500 can implement (e.g., propagate) a dual-rail qubit 2505 that is spread across the two top modes. Further, in the notation of FIGS. 25A and 25B, a single circle by itself on a line corresponds to a phase shifter, such as phase shifter 2510; whereas two circles connected by a vertical line corresponds to a beamsplitter, such as beamsplitter 2515 (e.g., mode coupler, a half-silvered mirror, a 50:50 directional coupler); and detectors are illustrated as rounded semi-circles, such as detector 2520.

In some example embodiments, the schemes of FIGS. 25A and 25B perform probabilistic projective measurements (e.g., fusion measurements). For example, with reference to XX scheme 2500, when the circuit succeeds it measures $X_1X_2$ and $Z_1Z_2$, and when fails it measures single qubits: $X_1$ and $X_2$. Similarly, the ZZ scheme 2525 in FIG. 25A also measures the XX and ZZ basis when it succeeds (e.g., the measurement comprises $X_1X_2$ and $Z_1Z_2$ when successful), and when the scheme fails it measures single qubits: $Z_1$ and $Z_2$. Thus, when either of the approaches in FIG. 25A succeed, they have the same results; however, when they fail, they fail in different ways (with different single qubit measurements). In some example embodiments, per any of the schemes in FIGS. 25A and 25B, success can be indicated by 1 click per pair of detectors (e.g., [1,0], [0,1]), and failure scenarios can be other click patterns (e.g., [2,0], [0,2]). In this way, for a given failure pattern detected, for a given scheme, the resulting state can be determined (e.g., heralded failure). For example, in XX scheme 2500, the readout data can be the failure pattern [0,2] and thus the resulting state is $X_1$ and $X_2$; whereas in ZZ scheme 2525, the same failure pattern [0,2] indicates the resulting state is $Z_1$ and $Z_2$. In some example embodiments, the readouts (e.g., detections) implement measurements of the observables, and correspond to eigenvalues of parity data (e.g., parity values that commute or anti-commute; such as +1 and −1, or alternatively 1 and 0 depending upon convention used). The parity data can be implemented to determine what the resulting entangled states are (e.g., states left over from success, states left over from failure), and indicate (along with the algorithmic instructions (e.g., fusion graph instructions)) what next actions should be implemented (e.g., based on what states succeed or failed; based upon a given algorithm being run).

In a similar manner, the schemes in FIG. 25B perform probabilistic two particle measurements in another basis: $X_1Z_2$ and $Z_1X_2$. In some example embodiments, upon XZ scheme 2550 or ZX scheme 2575 being successful: $Z_1X_2$ and $X_1Z_2$ is measured. Whereas, upon XZ scheme 2550 failing, the single qubit measurements are $X_1$ and $Z_2$. Likewise, upon ZX scheme 2575 failing, the single qubit measurements include $Z_1$ and $X_2$.

It is appreciated by those of ordinary skill in the art that the embodiments described herein are illustrative and not limiting and that different modifications and variations are possible. The measurements performed and the states on which they act can be chosen such that the measurement outcomes have redundancies that give rise to error tolerance (e.g., fault tolerance). For instance, a code can be directly entered with the measurements, or correlations can be generated in the measurements that directly deal with both the destructiveness of the measurement and the entanglement breaking nature of the measurement in an error tolerant manner. This can be handled as part of the classical decoding (e.g., using a CPU, GPU). For instance, failed fusion operations can be dealt with as erasures by the code.

Figure 26A:
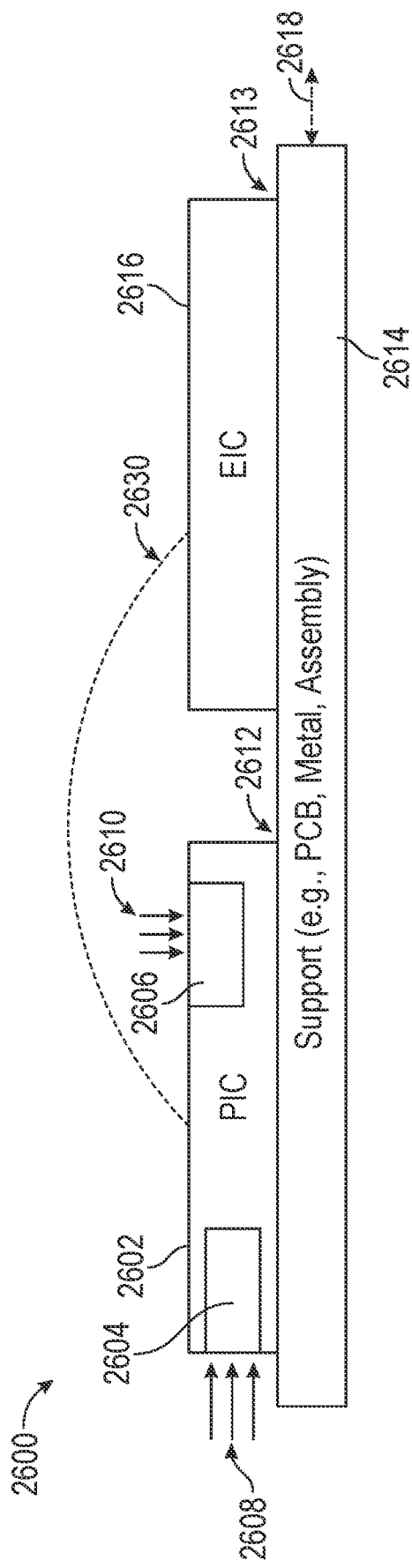
FIGS. 26A and 26B show example photonic and electronic chips and packaging structures, in accordance with some example embodiments.
Figure 26B:
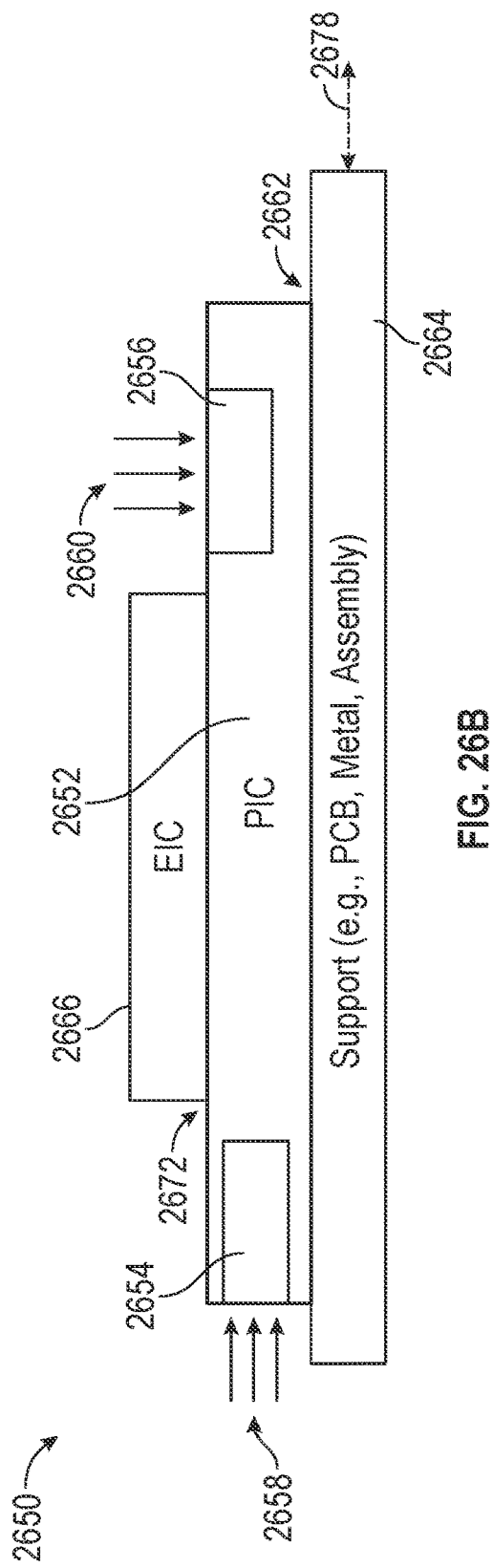

FIGS. 26A and 26B illustrate photonic integrated circuit and electronic integrated circuit interfaces and packaging, in accordance with some example embodiments. In the co-planar arrangement 2600 of FIG. 26A, a PIC 2602 (e.g., PIC chip) and an electronic integrated circuit (EIC) 2616 (e.g., ASIC, microcontroller, central processing unit, control circuitry, FPGA, GPU) are mounted on a common surface, such as support 2614. In some example embodiments, the support 2614 comprises a printed circuit board (PCB) that as electrical traces (not depicted) that are formed in the PCB to interconnect various components to the PCB. For example, the PIC 2602 can have an electrical interface 2612 (e.g., ball grid array, socket, electrical contacts) that connects to the traces of the PCB. Further, the EIC 2616 can include an electrical interface 2613 that connects to the traces of the PCB, such that the PIC 2602 can send and receive data to the EIC 2616, which may further be transmitted to other devices using a data connector 2618 (e.g., electrical ribbon cable). In some example embodiments, the support 2614 comprises a metal surface, such as a heat sink to which the PIC 2602 and the EIC 2616 are mounted. In some embodiments, the support 2614 comprises a PCB card having a metal region to function as a heatsink for the PIC 2602 or the EIC 2616, where the metal region is surrounded by a PCB portion have interconnections.

In some example embodiments, the metal region or surface of the support 2614 can be cooled (e.g., cryogenically cooled) thereby providing cryogenic temperatures to the PIC 2602 and/or the EIC 2616, which may include superconducting components (e.g., detectors) that operate at cryogenic temperatures. In some example embodiments, the PIC 2602 can have one or more wired connections to other devices, such as the EIC 2616 using wire bonding 2630, which bonds electrical leads from the respective chips to one another to transfer signaling and data. Optionally, either of the EIC 2616 or the PIC 2602 can include electrical wire bonding to external devices for electrical interfaces (e.g., power supply, readout wires, and the like).

In some example embodiments, the PIC 2602 comprises a plurality of material layers (e.g., substrate, silicon oxide layers, silicon layers, silicon nitride layers that can form waveguides to guide light. In some example embodiments, the PIC 2602 comprises electro-optically active components (e.g., III-V materials, barium titanate) or passive components (e.g., directional couplers) that can be coupled to the integrated waveguides to forum a photonic integrated circuit to process light (e.g., bright light, single photons). For example, the components can include phase shifters and beam splitters which can be interconnected by various waveguides that are integrated into the PIC 2602. In some example embodiments, light can be coupled into the PIC 2602 in different approaches, such as an coupling in light 2608 into an edge coupler 2604 (e.g., waveguide, spot size converter, and so on). Alternatively, and in accordance with some example embodiments, light can be coupled into a planar non-edge side of the PIC 2602. For example, the PIC 2602 can include one or more gratings 2606 to couple in and out light 2610 from an external source, such as a fiber optic channel, a lensing system (e.g., microlens socket), or free space optics.

FIG. 26B shows a flipchip arrangement 2650, in accordance with some example embodiments. In the illustrated example, a PIC 2652 is mounted on a support 2664 (e.g., PCB, metal support, or combination thereof, such as a PCB card having a heatsink region for PIC mounting), where optionally, there may be an electrical interface 2662 between the support 2664 for interconnectivity to external devices using a data connector 2678 (e.g., electrical ribbon cable). Further, as discussed above, the PIC 2652 can include light 2658 that is coupled into to an edge coupling device 2654; alternatively, light 2660 can be coupled into grating 2656 that is a planar side of the PIC 2652. In some example embodiments, the side of the PIC 2652 that is mounted to the support 2664 is referred to as a "frontside" and the "backside" faces away. In some example embodiments, an EIC 2666 can be mounted on the backside of the PIC 2652 in a flipchip configuration, where there is an electrical interface 2672 between the backside of the PIC 2652 and the EIC 2666. Further, in some example embodiments, the PIC 2652 and/or the BIC 2666 can include one or more terminals for wire bonding to other devices, such as external power supplies and readout devices.

FIG. 27 illustrates a diagrammatic representation of a machine 2700 in the form of a computer system within which a set of instructions may be executed for causing the machine 2700 to perform any one or more of the methodologies discussed herein, according to an example embodiment. Specifically, FIG. 27 shows a diagrammatic representation of the machine 2700 in the example form of a computer system, within which instructions 2716 (e.g. software, a program, an application, an applet, an app, or other executable code) for causing the machine 2700 to perform any one or more of the methodologies discussed herein may be executed. For example, the instructions 2716 may cause the machine 2700 to execute any one or more operations of method 2200 of FIG. 22. In this way, the instructions 2716 transform a general, non-programmed machine into a particular machine 2700 that is specially configured to carry out any one of the described and illustrated functions in the manner described herein.

In alternative embodiments, the machine 2700 operates as a standalone device or may be coupled (e.g., networked) to other machines. In a networked deployment, the machine 2700 may operate in the capacity of a server machine or a client machine in a server-client network environment, or as a peer machine in a peer-to-peer (or distributed) network environment. The machine 2700 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 2716, sequentially or otherwise, that specify actions to be taken by the machine 2700. Further, while only a single machine 2700 is illustrated, the term "machine" shall also be taken to include a collection of machines 2700 that individually or jointly execute the instructions 2716 to perform any one or more of the methodologies discussed herein.

The machine 2700 includes processors 2710, memory 2730, and input/output (I/O) components 2750 configured to communicate with each other such as via a bus 2702. In an example embodiment, the processors 2710 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 2712 and a processor 2714 that may execute the instructions 2716. The term "processor" is intended to include multi-core processors 2710 that may comprise two or more independent processors (sometimes referred to as "cores") that may execute instructions 2716 contemporaneously. Although FIG. 27 shows multiple processors 2710, the machine 2700 may include a single processor with a single core, a single processor with multiple cores (e.g., a multi-core processor), multiple processors with a single core, multiple processors with multiple cores, or any combination thereof.

The memory 2730 may include a main memory 2732, a static memory 2734, and a storage unit 2736, all accessible to the processors 2710 such as via the bus 2702. The main memory 2732, the static memory 2734, and the storage unit 2736 store the instructions 2716 embodying any one or more of the methodologies or functions described herein. The instructions 2716 may also reside, completely or partially, within the main memory 2732, within the static memory 2734, within machine storage medium 2738 of the storage unit 2736, within at least one of the processors 2710 (e.g., within the processor's cache memory), or any suitable combination thereof, during execution thereof by the machine 2700.

The I/O components 2750 include components to receive input, provide output, produce output, transmit information, exchange information, capture measurements, and so on. The specific I/O components 2750 that are included in a particular machine 2700 will depend on the type of machine. For example, portable machines such as mobile phones will likely include a touch input device or other such input mechanisms, while a headless server machine will likely not include such a touch input device. It will be appreciated that the I/O components 2750 may include many other components that are not shown in FIG. 27. The I/O components 2750 are grouped according to functionality merely for simplifying the following discussion and the grouping is in no way limiting. In various example embodiments, the I/O components 2750 may include output components 2752 and input components 2754. The output components 2752 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 2754 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 2750 may include communication components 2764 operable to couple the machine 2700 to a network 2780 or devices 2770 via a coupling 2782 and a coupling 2772, respectively. For example, the communication components 2764 may include a network interface component or another suitable device to interface with the network 2780. In further examples, the communication components 2764 may include wired communication components, wireless communication components, cellular communication components, and other communication components to provide communication via other modalities. The devices 2770 may be another machine or any of a wide variety of peripheral devices (e.g., a peripheral device coupled via a universal serial bus (USB)). The various memories (e.g., 2730, 2732, 2734, and/or memory of the processor(s) 2710 and/or the storage unit 2736) may store one or more sets of instructions 2716 and data structures (e.g., software) embodying or utilized by any one or more of the methodologies or functions described herein. These instructions 2716, when executed by the processor(s) 2710, cause various operations to implement the disclosed embodiments.

Described implementations of the subject matter can include one or more features, alone or in combination as illustrated below by way of example.

Example 1 is a system comprising: a first plurality of optical interconnects that receive an entangled state; a second plurality of optical interconnects that receive an additional entangled state, the entangled state and the additional entangled state being a same type of entangled state; a non-cryogenic structure comprising a plurality of interference circuits to interfere qubits from the entangled state and the additional entangled state; a cryogenic structure comprising a plurality of detectors; a third plurality of optical interconnects to couple interfered qubits from the plurality of interference circuits in the non-cryogenic structure to the plurality of detectors in the cryogenic structure; and control circuitry configured to: transmit instructions to the plurality of interference circuits that cause the plurality of interference circuits to interfere the qubits according to a measurement scheme, the measurement scheme comprising a joint measurement on a first qubit from the entangled state and a second qubit from the additional entangled state, the plurality of detectors forming readout data from the joint measurement of the first qubit and the second qubit; and store the readout data in memory.

In Example 2, the subject matter of Example 1 includes, wherein the first plurality of optical interconnects comprises a plurality of fibers that propagate photonic qubits of the entangled state.

In Example 3, the subject matter of Example 2 includes, wherein the second plurality of optical interconnects comprises an additional plurality of fibers that propagate additional photonic qubits of the additional entangled state.

In Example 4, the subject matter of Example 3 includes, wherein the first qubit corresponds to one of the photonic qubits and the second qubit corresponds to one of the additional photonic qubits.

In Example 5, the subject matter of Examples 1-4 includes, wherein the third plurality of optical interconnects comprises a further plurality of fibers.

In Example 6, the subject matter of Example 5 includes, wherein the plurality of interference circuits comprises output ports coupled to the further plurality of fibers.

In Example 7, the subject matter of Example 6 includes, wherein the cryogenic structure comprises a cryogenic chamber under vacuum.

In Example 8, the subject matter of Example 7 includes, wherein the further plurality of fibers couple the interfered qubits through cryogenic chamber ports to the plurality of detectors.

In Example 9, the subject matter of Examples 6-8 includes, wherein the plurality of detectors comprises photonic integrated circuits comprising photon detectors.

In Example 10, the subject matter of Example 9 includes, wherein the photon detectors comprise superconducting nanowires.

In Example 11, the subject matter of Examples 8-10 includes, wherein the plurality of detectors is connected to data cables through the cryogenic chamber ports.

In Example 12, the subject matter of Examples 1-11 includes, wherein the plurality of interference circuits comprises a plurality of input ports that are coupled to a crossing coupler network, the crossing coupler network comprising optical couplers in a networked arrangement to interfere light coupled to the plurality of input ports.

In Example 13, the subject matter of Example 12 includes, wherein the crossing coupler network is coupled to a plurality of output ports.

In Example 14, the subject matter of Example 13 includes, wherein the plurality of output ports is connected to the third plurality of optical interconnects.

In Example 15, the subject matter of Examples 1-14 includes, wherein the joint measurement comprises a fusion measurement.

In Example 16, the subject matter of Example 15 includes, wherein the fusion measurement comprises a measurement in a basis comprising XX and ZZ.

In Example 17, the subject matter of Examples 1-16 includes, wherein the control circuitry is further configured to: transmit additional instructions to the plurality of interference circuits to cause the plurality of interference circuits to interfere additional qubits according to an additional measurement scheme, the additional measurement scheme comprising a single qubit measurement.

In Example 18, the subject matter of Examples 1-17 includes, wherein the first plurality of optical interconnects is coupled to a plurality of additional devices, the entangled state being coupled from one or more of the plurality of additional devices to the system using the first plurality of optical interconnects.

In Example 19, the subject matter of Example 18 includes, wherein an initial entanglement is output by the one or more of the plurality of additional devices, a portion of the initial entanglement comprising the entangled state that is received on the first plurality of optical interconnects.

In Example 20, the subject matter of Example 19 includes, wherein another portion of the initial entanglement is coupled to a plurality of further devices.

In Example 21, the subject matter of Example 20 includes, wherein the plurality of further devices performs joint measurements on the another entangled portion and wherein further readout data is generated by the joint measurements of the plurality of further devices.

In Example 22, the subject matter of Examples 20-21 includes, a plurality of optical switches coupled between the plurality of first optical interconnects and the plurality of interference circuits, the plurality of optical switches being configurable to couple different sets of additional devices from the plurality of additional devices to different interference circuits from the plurality of interference circuits.

In Example 23, the subject matter of Examples 1-22 includes, wherein the non-cryogenic structure further comprises one or more encoding conversion circuits, the one or more encoding conversion circuits comprising one or more optical delays and one or more phase shifters to convert between a spatial encoding format and a time bin encoding format.

In Example 24, the subject matter of Example 23 includes, wherein the entangled state received on the first plurality of optical interconnects and the additional entangled state received on the second plurality of optical interconnects is in the time bin encoding format.

In Example 25, the subject matter of Example 24 includes, wherein the control circuitry is further configured to: convert the entangled state from the time bin encoding format to the spatial encoding format.

In Example 26, the subject matter of Examples 23-25 includes, wherein the first plurality of optical interconnects and the second plurality optical interconnects couple a plurality of entangled states in the time bin encoding format.

Example 27 is a method comprising: receiving an entangled state from a first plurality of optical interconnects, the entangled state being received by a plurality of interference circuits in a non-cryogenic structure; receiving, by the plurality of interference circuits, an additional entangled state from a second plurality of optical interconnects; interfering, by the plurality of interference circuits, qubits from the entangled state and the additional entangled state according to a measurement scheme, the measurement scheme comprising a joint measurement on a first qubit from the entangled state and a second qubit from the additional entangled state; coupling interfered qubits to a plurality of detectors in a cryogenic structure, the interfered qubits being coupled to the plurality of detectors on a third plurality of optical interconnects; generating, by the plurality of detectors, readout data from detections of the interfered qubits; and storing the readout data in memory.

Example 28 is an system comprising: a first plurality of optical interconnects to receive qubits of a plurality of seed entangled states, the plurality of seed entangled states further comprising other qubits on other optical interconnects that are coupled to one or more external devices; a non-cryogenic structure comprising a plurality of interference circuits to interfere the qubits of the plurality of seed entangled states; a cryogenic structure comprising a plurality of detectors; a second plurality of optical interconnects to couple interfered qubits from the plurality of interference circuits that are in the non-cryogenic structure to the plurality of detectors that are in the cryogenic structure, the plurality of detectors generating resource state readout data from the plurality of detectors; and control circuitry configured to: determine, from the resource state readout data, a plurality of resource entangled states comprises the other qubits that are on the other optical interconnects, the plurality of seed entangled states and the plurality of resource entangled states being different types of entangled states.

In Example 29, the subject matter of Example 28 includes, wherein the plurality of seed entangled states is generated by a plurality of additional devices that output the plurality of seed entangled states to the first plurality of optical Interconnects.

In Example 30, the subject matter of Example 29 includes, a plurality of optical switches coupled between the plurality of interference circuits and the first plurality of optical interconnects.

In Example 31, the subject matter of Example 30 includes, wherein the plurality of optical switches is configurable to couple different sets of additional devices from the plurality of additional devices to different interference circuits from the plurality of interference circuits.

In Example 32, the subject matter of Examples 28-31 includes, wherein a seed entangled state comprises a first quantity of entangled qubits and wherein a resource entangled state comprises a second quantity of qubits that is different than the first quantity of qubits.

In Example 33, the subject matter of Example 32 includes, wherein the second quantity of qubits of the resource entangled state is larger than the first quantity of qubits of the seed entangled state.

In Example 34, the subject matter of Examples 28-33 includes, wherein the cryogenic structure comprises a cryogenic chamber under vacuum.

In Example 35, the subject matter of Example 34 includes, wherein the cryogenic chamber comprises a plurality of cryogenic chamber ports, wherein the first plurality of optical interconnects extends through the cryogenic chamber ports to couple the plurality of interference circuits in the non-cryogenic structure to the plurality of detectors in the cryogenic chamber.

In Example 36, the subject matter of Examples 28-35 includes, wherein interfering the qubits comprises performing a joint measurement on two different qubits from different seed entangled states.

Example 37 is a system comprising: a cryogenic structure comprising a plurality of detectors: a non-cryogenic structure having a plurality of interference circuits to interfere a plurality of photons and output interfered light, the plurality of interference circuits comprising input ports to receive the plurality of photons and output ports to output the interfered light; a first plurality of optical interconnects to couple the interfered light from the plurality of interference circuits in the non-cryogenic structure to the plurality of detectors in the cryogenic structure, the first plurality of optical interconnects connected to a first set of the output ports of the plurality of interference circuits, the plurality of detectors generating readout data from detections of the interfered light; a second plurality of optical interconnects to couple the interfered light from the plurality of interference circuits to a first device, the second plurality of optical interconnects being connected to a second set of the output ports of the plurality of photonic interference circuits; a third plurality of optical interconnects to couple the interfered light from the plurality of photonic interference circuits to a second device, the second plurality of optical interconnects being connected to a second set of the output ports of the plurality of photonic interference circuits; and control circuitry configured to generate state data that indicates that one or more of the plurality of interference circuits generated a target entangled state, the control circuitry further configured to store the state data in memory.

In Example 38, the subject matter of Example 37 includes, wherein the cryogenic structure further comprises a plurality of photonic source circuits that generate the plurality of photons.

In Example 39, the subject matter of Example 38 includes, a fourth plurality of optical interconnects to couple the plurality of photons from the plurality of photonic source circuits in the cryogenic structure to the plurality of interference circuits in the non-cryogenic structure.

In Example 40, the subject matter of Examples 38-39 includes, wherein a photonic source circuit generates the plurality of photons using a photon pair scheme to generate photon pairs and detect one photon in each photon pair.

In Example 41, the subject matter of Example 40 includes, wherein the photon pair scheme comprises spontaneous parametric down conversion.

In Example 42, the subject matter of Examples 40-41 includes, wherein the photon pair scheme comprises four wave mixing.

In Example 43, the subject matter of Examples 40-42 includes, wherein the photonic source circuit comprises a photon detector to detect the one photon in the photon pair.

In Example 44, the subject matter of Examples 37-43 includes, wherein the cryogenic structure comprises a cryogenic chamber under vacuum.

In Example 45, the subject matter of Example 44 includes, wherein the cryogenic chamber comprises a plurality of cryogenic chamber ports, wherein the first plurality of optical interconnects extends through the cryogenic chamber ports to couple the plurality of interference circuits in the non-cryogenic structure to the plurality of detectors in the cryogenic chamber.

Example 46 is a method comprising: generating, by a first plurality of networked entanglement devices, a plurality of seed entangled states using a first plurality of photonic interference circuits in a non-cryogenic structure and a first plurality of photonic detector circuits in a cryogenic structure, the first plurality of networked entanglement devices comprising the first plurality of photonic interference circuits, the first plurality of photonic interference circuits being networked to the first plurality of photonic detector circuits using a first plurality of connector optical interconnects; coupling, by a plurality of entanglement device optical interconnects, the plurality of seed entangled states to a second plurality of networked entanglement devices, the second plurality of networked entanglement devices comprising a second plurality of photonic interference circuits in the non-cryogenic structure and a second plurality of photonic detector circuits in the cryogenic structure, the second plurality of photonic interference circuits being networked to the second plurality of photonic detector circuits using a second plurality of connector optical interconnects; coupling, by an additional plurality of entanglement device optical interconnects, the plurality of seed entangled states to a third plurality of networked entanglement devices, the third plurality of networked entanglement devices comprising a third plurality of photonic interference circuits in the non-cryogenic structure and a third plurality of photonic detector circuits in the cryogenic structure, the third plurality of photonic interference circuits being networked to the third plurality of photonic detector circuits using a third plurality of connector optical interconnects; generating, by the second plurality of networked entanglement devices, a plurality of resource entangled states, the plurality of resource entangled states being generated by: interfering portions of the plurality of seed entangled states using the second plurality of interference circuits; and detecting outputs from the second plurality of interference circuits using the second plurality of detectors; and generating, by the third plurality of networked entanglement devices, a plurality of remaining entangled states from portions of different resource states of the plurality of resource entangled states, the plurality of remaining entangled states being generated by: interfering portions of the different resource states using the third plurality of interference circuits; and detecting outputs from the third plurality of interference circuits using the third plurality of detectors, the plurality of remaining entangled states propagating on a plurality of output optical interconnects after the detections are performed by the third plurality of detectors.

In Example 47, the subject matter of Example 46 includes, wherein a cell entanglement system comprises the first plurality of networked entanglement devices, the second plurality of networked entanglement devices the third plurality of networked entanglement devices, and wherein the cell entanglement system is connected to a plurality of other cell entanglement systems by a plurality of cell optical interconnects.

In Example 48, the subject matter of Example 47 includes, wherein each other cell of the plurality of other cell entanglement systems comprises another first plurality of networked entanglement devices, another second plurality of networked entanglement devices and another third plurality of networked entanglement devices.

In Example 49, the subject matter of Examples 46-48 includes, wherein the plurality of seed entangled states and the plurality of resource entangled states are different types of entangled states.

In Example 50, the subject matter of Example 49 includes, wherein a seed entangled state comprises a first quantity of entangled qubits and wherein a resource entangled state comprises a second quantity of qubits that is different than the first quantity of qubits.

In Example 51, the subject matter of Examples 49-50 includes, –GHZ state.

In Example 52, the subject matter of Examples 46-51 includes, wherein generating the plurality of seed entangled states comprises: interfering a plurality of single photons using the first plurality of photonic interference circuits; and generating readout data using the first plurality of detectors.

Example 53 is a system comprising: a first plurality of networked entanglement devices to generate a plurality of seed entangled states using a first plurality of photonic interference circuits in a non-cryogenic structure and using a first plurality of photonic detector circuits in a cryogenic structure, the first plurality of networked entanglement devices comprising the first plurality of photonic interference circuits that are networked to the first plurality of photonic detector circuits using a first plurality of connector optical interconnects; a second plurality of networked entanglement devices to generate a plurality of resource entangled states, the plurality of resource entangled states being generated by: interfering portions of the plurality of seed entangled states using a second plurality of interference circuits; and detecting outputs from the second plurality of interference circuits using a second plurality of detectors; and a third plurality of networked entanglement devices to generate a plurality of remaining entangled states from portions of different resource states of the plurality of resource entangled states, the plurality of remaining entangled states being generated by: interfering portions of the different resource states using a third plurality of interference circuits; and detecting outputs from the third plurality of interference circuits using a third plurality of detectors, the plurality of remaining entangled states propagating on a plurality of output optical interconnects after the detections are performed by the third plurality of detectors.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of the method 2200 may be performed by one or more processors. The performance of certain of the operations may be distributed among the one or more processors, not only residing within a single machine, but also deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

The invention claimed is:

1. A system comprising:
   a first plurality of optical interconnects that receive an entangled state;
   a second plurality of optical interconnects that receive an additional entangled state;
   a non-cryogenic structure comprising a plurality of interference circuits to interfere qubits from the entangled state and the additional entangled state;
   a cryogenic structure comprising a plurality of detectors;
   a third plurality of optical interconnects to couple interfered qubits from the plurality of interference circuits in the non-cryogenic structure to the plurality of detectors in the cryogenic structure;
   control circuitry configured to transmit instructions to the plurality of interference circuits that cause the plurality of interference circuits to interfere the qubits according to a measurement scheme, the measurement scheme comprising a joint measurement on a first qubit from the entangled state and a second qubit from the additional entangled state, the plurality of detectors forming readout data from the joint measurement of the first qubit and the second qubit; and
   store the readout data in memory.

2. The system of claim 1, wherein the first plurality of optical interconnects comprises a plurality of fibers that propagate photonic qubits of the entangled state.

3. The system of claim 2, wherein the second plurality of optical interconnects comprises an additional plurality of fibers that propagate additional photonic qubits of the additional entangled state.

4. The system of claim 3, wherein the first qubit corresponds to one of the photonic qubits and the second qubit corresponds to one of the additional photonic qubits.

5. The system of claim 1, wherein the third plurality of optical interconnects comprises a further plurality of fibers.

6. The system of claim 5, wherein the plurality of interference circuits comprises output ports coupled to the further plurality of fibers.

7. The system of claim 6, wherein the cryogenic structure comprises a cryogenic chamber under vacuum.

8. The system of claim 7, wherein the further plurality of fibers couple the interfered qubits through cryogenic chamber ports to the plurality of detectors.

9. The system of claim 6, wherein the plurality of detectors comprises photonic integrated circuits comprising photon detectors.

10. The system of claim 9, wherein the photon detectors comprise superconducting nanowires.

11. The system of claim 8, wherein the plurality of detectors is connected to data cables through the cryogenic chamber ports.

12. The system of claim 1, wherein the plurality of interference circuits comprises a plurality of input ports that are coupled to a crossing coupler network, the crossing coupler network comprising optical couplers in a networked arrangement to interfere light coupled to the plurality of input ports.

13. The system of claim 12, wherein the crossing coupler network is coupled to a plurality of output ports.

14. The system of claim 13, wherein the plurality of output ports is connected to the third plurality of optical interconnects.

15. The system of claim 1, wherein the joint measurement comprises a fusion measurement.

16. The system of claim 15, wherein the fusion measurement comprises a measurement in a basis comprising XX and ZZ.

17. The system of claim 1, wherein the control circuitry is further configured to: transmit additional instructions to the plurality of interference circuits to cause the plurality of interference circuits to interfere additional qubits according to an additional measurement scheme, the additional measurement scheme comprising a single qubit measurement.

18. The system of claim 1, wherein the first plurality of optical interconnects is coupled to a plurality of additional devices, the entangled state being coupled from one or more of the plurality of additional devices to the system using the first plurality of optical interconnects.

19. The system of claim 18, wherein an initial entanglement is output by the one or more of the plurality of additional devices, a portion of the initial entanglement comprising the entangled state that is received on the first plurality of optical interconnects.

20. The system of claim 19, wherein another portion of the initial entanglement is coupled to a plurality of further devices.

21. The system of claim 20, wherein the plurality of further devices performs joint measurements on the another entangled portion and wherein further readout data is generated by the joint measurements of the plurality of further devices.

22. The system of claim 20, further comprising a plurality of optical switches coupled between the plurality of first optical interconnects and the plurality of interference circuits, the plurality of optical switches being configurable to couple different sets of additional devices from the plurality of additional devices to different interference circuits from the plurality of interference circuits.

23. The system of claim 1, wherein the non-cryogenic structure further comprises one or more encoding conversion circuits, the one or more encoding conversion circuits comprising one or more optical delays and one or more phase shifters to convert between a spatial encoding format and a time bin encoding format.

24. The system of claim 23, wherein the entangled state received on the first plurality of optical interconnects and the additional entangled state received on the second plurality of optical interconnects is in the time bin encoding format.

25. The system of claim 24, wherein the control circuitry is further configured to: convert the entangled state from the time bin encoding format to the spatial encoding format.

26. The system of claim 23, wherein the first plurality of optical interconnects and the second plurality optical interconnects couple a plurality of entangled states in the time bin encoding format.

* * * * *